(12) United States Patent  
Ashtekar et al.

(10) Patent No.: US 9,378,901 B2
(45) Date of Patent: Jun. 28, 2016

(54) MECHANICAL WEAR, WIPE AND STROKE MEASUREMENT SYSTEM FOR CIRCUIT BREAKERS

(71) Applicant: Eaton Corporation, Cleveland, OH (US)

(72) Inventors: Koustubh Dnyandeo Ashtekar, Moon Township, PA (US); James Jeffery Benke, Pittsburgh, PA (US); Zachary R. Jenkins, Pittsburgh, PA (US)

(73) Assignee: EATON CORPORATION, Cleveland, OH (US)

(*) Notice: Subject to any disclaimer, the term of this patent is extended or adjusted under 35 U.S.C. 154(b) by 0 days.

(21) Appl. No.: 14/540,113

(22) Filed: Nov. 13, 2014

(65) Prior Publication Data

US 2016/0141117 A1    May 19, 2016

(51) Int. Cl.

| | | |
|---|---|---|
| *G01R 31/02* | (2006.01) | |
| *H01H 33/66* | (2006.01) | |
| *H01H 1/00* | (2006.01) | |
| *G01R 31/333* | (2006.01) | |
| *H03K 17/18* | (2006.01) | |
| *H02H 3/04* | (2006.01) | |
| *G01R 31/327* | (2006.01) | |

(52) U.S. Cl.
CPC ........... *H01H 1/0015* (2013.01); *G01R 31/333* (2013.01); *H01H 33/66* (2013.01); *H02H 3/04* (2013.01); *H03K 17/18* (2013.01); *G01R 31/327* (2013.01); *G01R 31/3272* (2013.01); *G01R 31/3274* (2013.01); *G01R 31/3333* (2013.01); *H01H 2001/0026* (2013.01)

(58) Field of Classification Search
CPC ................ H01H 1/0015; H01H 33/66; H01H 2001/0026; H03K 17/18; H02H 3/04; G01R 31/327; G01R 31/3272; G01R 31/3274; G01R 31/333; G01R 31/3333
USPC .............. 324/424, 415; 361/14, 42, 102, 114, 361/115, 634, 656, 663, 23, 78; 218/118, 218/119, 120, 121, 140; 335/6, 7, 8, 17, 20
See application file for complete search history.

(56) References Cited

U.S. PATENT DOCUMENTS

| | | | |
|---|---|---|---|
| 5,095,293 A | | 3/1992 | Patel et al. |
| 6,002,560 A | * | 12/1999 | Nguyen ............... H01H 1/0015 361/115 |
| 6,150,625 A | | 11/2000 | Marchand et al. |
| 7,417,554 B2 | * | 8/2008 | Benke .................... G01D 21/00 340/638 |

* cited by examiner

*Primary Examiner* — Hoai-An D Nguyen
(74) *Attorney, Agent, or Firm* — Eckert Seamans Cherin & Mellott, LLC; David C. Jenkins; Grant E. Coffield

(57) ABSTRACT

A contact wear indicator assembly for a circuit breaker assembly is provided. The contact wear indicator assembly includes an interface assembly, an indicator drive assembly, and a user display assembly. The user display assembly includes an output device. The output device is structured to produce a visual indication representative of a measurable contact characteristic. The indicator drive assembly is operatively coupled to the interface assembly, whereby the indicator drive assembly moves between a first position and a second position corresponding to an interface assembly first and second position. The indicator drive assembly is measurably coupled to the user display assembly. The user display assembly is structured to convert the position data of the indicator drive assembly into a quantified output such as, but not limited to, contact characteristics. The user display assembly is further structured to display the indicator drive assembly position data on the output device.

20 Claims, 24 Drawing Sheets

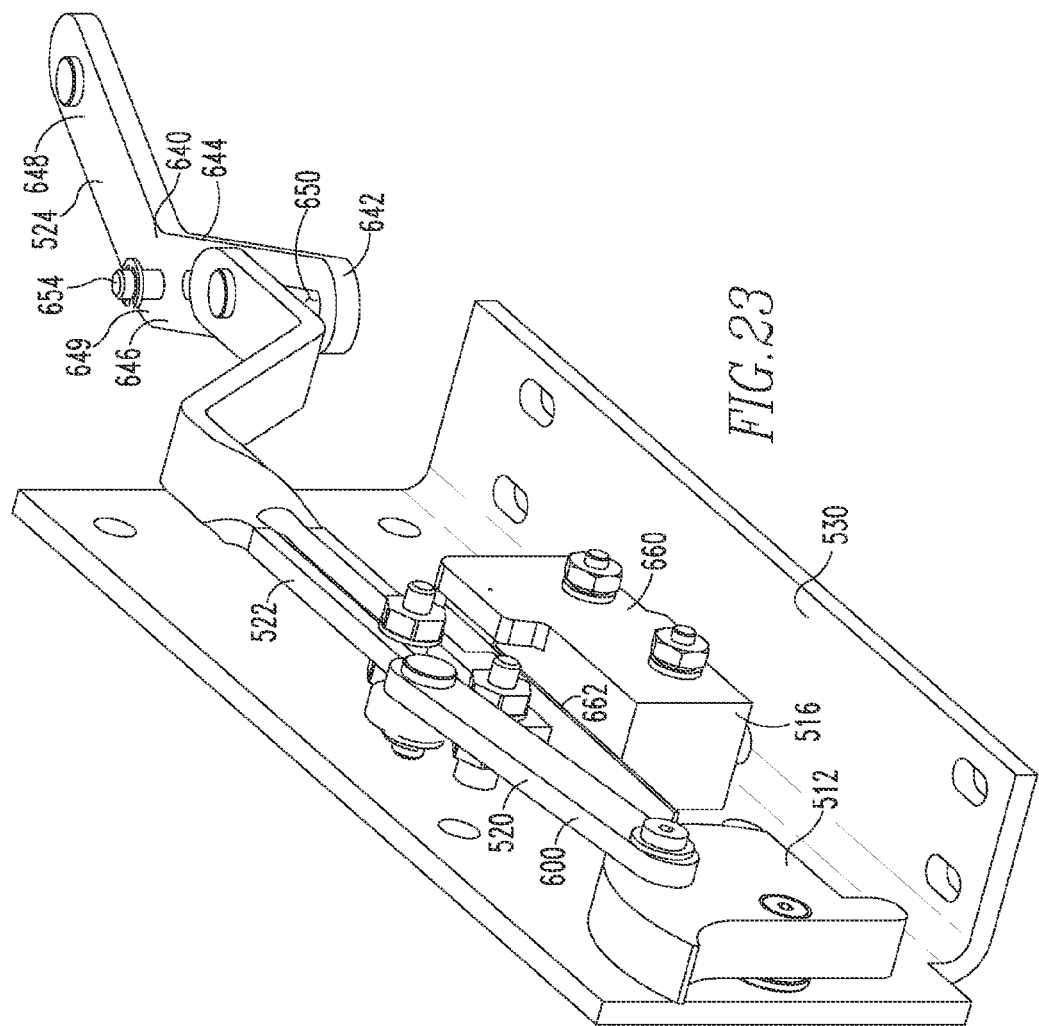

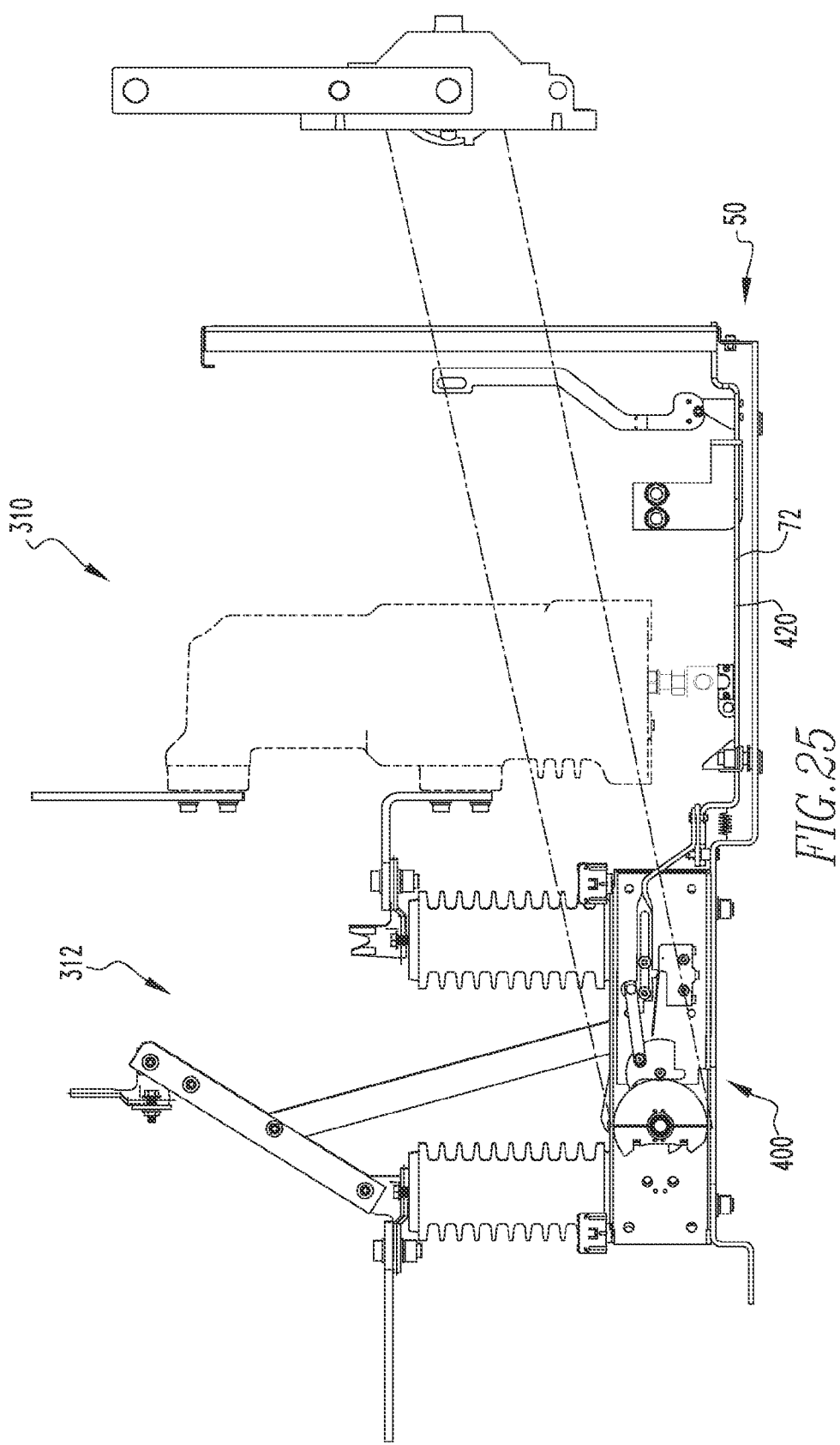

MECHANICAL WEAR, WIPE AND STROKE MEASUREMENT SYSTEM FOR CIRCUIT BREAKERS

BACKGROUND OF THE INVENTION

1. Field of the Invention

The disclosed and claimed concept relates to a circuit breaker and, more specifically, to a contact wear indicator assembly that is structured to provide an indication of contact characteristics and contact wear for enclosed contacts such as, but not limited to, contacts in a vacuum circuit interrupter.

2. Background Information

Circuit breaker assemblies (CBA) provide protection for electrical systems from electrical fault conditions such as current overloads, short circuits, and low level voltage conditions. Typically, circuit breakers include a spring-powered operating mechanism which opens electrical contacts to interrupt the current through the conductors in an electrical system in response to abnormal conditions. In particular, vacuum circuit interrupters include separable main contacts disposed within an insulated and hermetically sealed housing. Generally, one of the contacts is fixed relative to both the housing and to an external electrical conductor. The other contact is moveable. In the case of a vacuum circuit interrupter, the moveable contact assembly usually comprises a stem of circular cross-section having the contact at one end enclosed within the vacuum chamber, and an operating mechanism at the other end which is external to the vacuum chamber. The operating mechanism includes compression springs operatively coupled to a pole shaft which is, in turn, operatively coupled to the movable contact. When the operating mechanism is actuated, either manually or in response to an over-current condition, the moveable contacts are separated from the fixed contacts.

Over time the contacts are subject to wear and tear which diminishes the thickness of the contact assembly contact plates. These plates are disposed in the vacuum chamber and cannot be seen. While there are tools and methods to determine contact wear, see, e.g. U.S. Pat. No. 6,150,625, issued Nov. 21, 2000, such constructs are not incorporated into the circuit breaker and cannot interact therewith. Further, such constructs provide for a determination of contact wear only when used and do not provide continuous check on the contact characteristics. The contacts may wear between checks performed during the scheduled maintenance or downtime.

Further, the wear affects the contact wipe. That is, the contact "wipe" is the force holding the vacuum interrupter contacts closed and the energy available to hammer the contacts open with sufficient speed for reliable interruption. A related measurement is the contact "stroke." Stroke is the gap between fixed and moving contacts of a vacuum interrupter when the circuit breaker contacts are in the open, first position. The circuit breaker operating mechanism provides a fixed amount of motion to the second contact assembly. The first portion of the motion is used to close the contacts (i.e., stroke) and the remainder is used to further compress a pre-loaded wipe spring. This additional compression is called wipe. Wipe and stroke are thus generally related to each other by relation: total displacement=stroke+wipe. Thus, as the stroke increases due to the erosion of contacts, the wipe decreases.

Accordingly, there is a need for a contact wear indicator assembly to measure contact wear that is incorporated into the circuit breaker and can interact therewith.

There is a further need for a contact wear indicator assembly that constantly measures contact wear, stroke and wipe; and communicates to the switchgear or control room during each circuit breaker operation for continuous monitoring of the contact health.

There is a further need for a contact wear indicator assembly to be compatible with existing circuit breakers.

SUMMARY OF THE INVENTION

These needs, and others, are met by at least one embodiment of this invention which provides a contact wear indicator assembly for a circuit breaker. The circuit breaker includes a fixed, first contact assembly, a movable, second contact assembly, and an operating mechanism. The operating mechanism is operatively coupled to the second contact assembly. The second contact assembly includes an elongated stem and a contact member. The second contact assembly is moveable between a first position, wherein the second contact assembly contact member is spaced from, and not in electrical communication with, the first contact assembly, and a second position, wherein the second contact assembly contact member is coupled to, and in electrical communication with, the first contact assembly. The second contact assembly pole stem moves generally linearly between a first and second position corresponding to the second contact assembly contact member first and second positions. The interface assembly may be fixed to the second contact assembly pole stem, or, in an alternate embodiment, coupled by a biasing device. The operating mechanism includes a number of movable elements, a portion of the movable elements are coupled to the second contact assembly. The portion of the operating mechanism elements coupled to the second contact assembly move between a first position and a second position corresponding to the second contact assembly first and second positions. The contact wear indicator assembly includes an interface assembly, an indicator drive assembly, and a user display assembly. The interface assembly is coupled to the second contact assembly stem, whereby the interface assembly moves with the second contact assembly stem between a first position and a second position. The indicator drive assembly includes an elongated, first drive member. The user display assembly includes an output device. The output device is structured to produce a visual indication representative of a measurable contact characteristic. The indicator drive assembly first drive member is operatively coupled to the interface assembly, whereby the indicator drive assembly first drive member moves between a first position and a second position corresponding to the interface assembly first and second positions. The indicator drive assembly first drive member is measurably coupled to the user display assembly. The user display assembly is structured to convert the position data of the indicator drive assembly first drive member into a quantified output. The user display assembly is further structured to display the indicator drive assembly first drive member position data on the output device.

BRIEF DESCRIPTION OF THE DRAWINGS

A full understanding of the invention can be gained from the following description of the preferred embodiments when read in conjunction with the accompanying drawings in which:

FIG. 23 is a detail isometric view of a portion of an interlock assembly cam assembly.

FIG. 25 is a side view of a VDS circuit breaker assembly including both a contact wear indicator assembly and a VDS interlock assembly.

DESCRIPTION OF THE PREFERRED EMBODIMENTS

Figure 1:
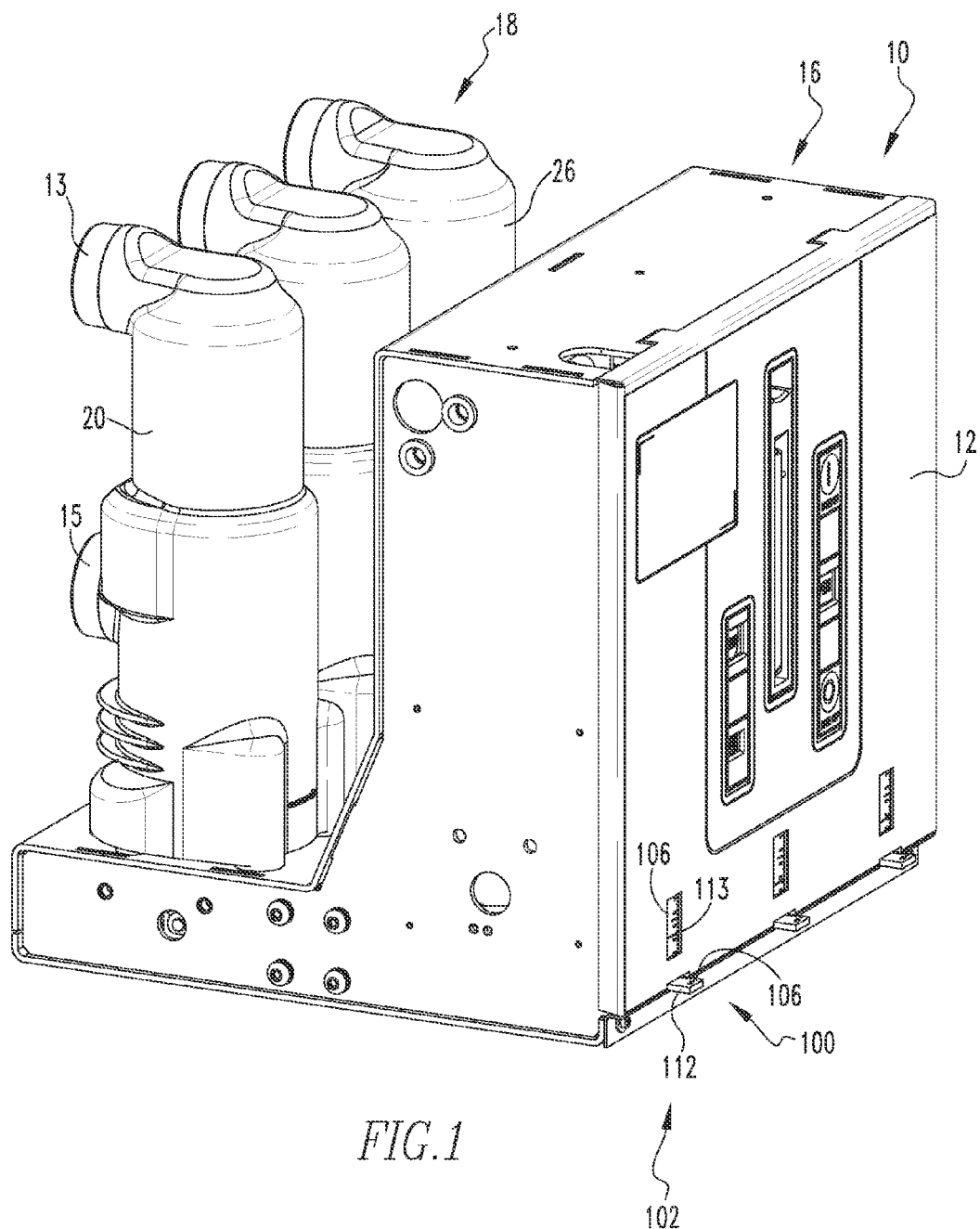
FIG. 1 is a front isometric partial view of a circuit breaker.

It will be appreciated that the specific elements illustrated in the figures herein and described in the following specification are simply exemplary embodiments of the disclosed concept, which are provided as non-limiting examples solely for the purpose of illustration. Therefore, specific dimensions, orientations, assembly, number of components used, embodiment configurations and other physical characteristics related to the embodiments disclosed herein are not to be considered limiting on the scope of the disclosed concept.

Directional phrases used herein, such as, for example, clockwise, counterclockwise, left, right, top, bottom, upwards, downwards and derivatives thereof, relate to the orientation of the elements shown in the drawings and are not limiting upon the claims unless expressly recited therein.

As used herein, the singular form of "a," "an," and "the" include plural references unless the context clearly dictates otherwise.

As used herein, the statement that two or more parts or components are "coupled" shall mean that the parts are joined or operate together either directly or indirectly, i.e., through one or more intermediate parts or components, so long as a link occurs. As used herein, "directly coupled" means that two elements are directly in contact with each other. It is noted that moving parts, such as but not limited to circuit breaker contacts, are "directly coupled" when in one position, e.g., the closed, second position, but are not "directly coupled" when in the open, first position. As used herein, "fixedly coupled" or "fixed" means that two components are coupled so as to move as one while maintaining a constant orientation relative to each other. Accordingly, when two elements are coupled, all portions of those elements are coupled. A description, however, of a specific portion of a first element being coupled to a second element, e.g., an axle first end being coupled to a first wheel, means that the specific portion of the first element is disposed closer to the second element than the other portions thereof.

As used herein, the phrase "removably coupled" means that one component is coupled with another component in an essentially temporary manner. That is, the two components are coupled in such a way that the joining or separation of the components is easy and would not damage the components. For example, two components secured to each other with a limited number of readily accessible fasteners are "removably coupled" whereas two components that are welded together or joined by difficult to access fasteners are not "removably coupled." A "difficult to access fastener" is one that requires the removal of one or more other components prior to accessing the fastener wherein the "other component" is not an access device such as, but not limited to, a door.

As used herein, "operatively coupled" means that a number of elements or assemblies, each of which is movable between a first position and a second position, or a first configuration and a second configuration, are coupled so that as the first element moves from one position/configuration to the other, the second element moves between positions/configurations as well. It is noted that a first element may be "operatively coupled" to another without the opposite being true.

As used herein, "measurably coupled" means two or more elements or assemblies are "operatively coupled" in a manner whereby the movement between first and second positions of any of the elements/assemblies generates a number of measurable characteristics.

As used herein, "measurable characteristics" of elements or assemblies include, but are not limited to, the position of the elements or assemblies, distance moved by one or more of the elements or assemblies, the force generated within or between one or more of the elements or assemblies, or stress within one or more of the elements or assemblies. The measurable characteristic motion may be linear, angular (in 2D or 3D references) and may be convertible to another type of motion with appropriate calibration (factory or field set). The measurable characteristic may can be converted into another form (such as, but not limited to, electrical energy, electromechanical energy/force, magnetic, thermal, etc.) and used to display the stroke and/or wipe and/or total mechanism displacement.

As used herein, a "coupling assembly" includes two or more couplings or coupling components. The components of a coupling or coupling assembly are generally not part of the same element or other component. As such, the components of a "coupling assembly" may not be described at the same time in the following description.

As used herein, a "coupling" or "coupling component(s)" is one or more component(s) of a coupling assembly. That is, a coupling assembly includes at least two components that are structured to be coupled together. It is understood that the components of a coupling assembly are compatible with each other. For example, in a coupling assembly, if one coupling component is a snap socket, the other coupling component is a snap plug, or, if one coupling component is a bolt, then the other coupling component is a nut.

As used herein, a "fastener" is a separate component structured to couple two or more elements. Thus, for example, a bolt is a "fastener" but a tongue-and-groove coupling is not a "fastener." That is, the tongue-and-groove elements are part of the elements being coupled and are not a separate component.

As used herein, "correspond" indicates that two structural components are sized and shaped to be similar to each other and may be coupled with a minimum amount of friction. Thus, an opening which "corresponds" to a member is sized slightly larger than the member so that the member may pass through the opening with a minimum amount of friction. This definition is modified if the two components are said to fit "snugly" together or "snuggly correspond." In that situation, the difference between the size of the components is even smaller whereby the amount of friction increases. If the element defining the opening and/or the component inserted into the opening is made from a deformable or compressible material, the opening may even be slightly smaller than the component being inserted into the opening. This definition is further modified if the two components are said to "substantially correspond." "Substantially correspond" means that the size of the opening is very close to the size of the element inserted therein; that is, not so close as to cause substantial friction, as with a snug fit, but with more contact and friction than a "corresponding fit," i.e., a "slightly larger" fit.

As used herein, and in the phrase "[x] moves between a first position and a second position corresponding to [y] first and second positions," wherein "[x]" and "[y]" are elements or assemblies, the word "correspond" means that when element [x] is in the first position, element [y] is in the first position, and, when element [x] is in the second position, element [y] is in the second position. It is noted that "correspond" relates to the final positions and does not mean the elements must move at the same rate or simultaneously. That is, for example, a hubcap and the wheel to which it is attached rotate in a corresponding manner. Conversely, a spring biased latched member and a latch release move at different rates. That is, as an example, a latch release moves between a first position, wherein the latched member is not released, and a second position, wherein the latched member is released. The spring-biased latched member moves between a first latched position and a second released position. The latch release may move slowly between positions and, until the release is in the second position, the latched member remains in the first position. But, as soon as the latch release reaches the second position, the latched member is released and quickly moves to the second position. Thus, as stated above, "corresponding" positions mean that the elements are in the identified first positions at the same time, and, in the identified second positions at the same time.

As used herein, the statement that two or more parts or components "engage" one another shall mean that the elements exert a force or bias against one another either directly or through one or more intermediate elements or components. Further, as used herein with regard to moving parts, a moving part may "engage" another element during the motion from one position to another and/or may "engage" another element once in the described position. Thus, it is understood that the statements, "when element A moves to element A first position, element A engages element B," and "when element A is in element A first position, element A engages element B" are equivalent statements and mean that element A either engages element B while moving to element A first position and/or element A either engages element B while in element A first position.

As used herein, "operatively engage" means "engage and move." That is, "operatively engage" when used in relation to a first component that is structured to move a movable or rotatable second component means that the first component applies a force sufficient to cause the second component to move. For example, a screwdriver may be placed into contact with a screw. When no force is applied to the screwdriver, the screwdriver is merely "coupled" to the screw. If an axial force is applied to the screwdriver, the screwdriver is pressed against the screw and "engages" the screw. However, when a rotational force is applied to the screwdriver, the screwdriver "operatively engages" the screw and causes the screw to rotate.

As used herein, the word "unitary" means a component that is created as a single piece or unit. That is, a component that includes pieces that are created separately and then coupled together as a unit is not a "unitary" component or body.

As used herein, the term "number" shall mean one or an integer greater than one (i.e., a plurality).

As used herein, "associated" means that the elements are part of the same assembly and/or operate together, or, act upon/with each other in some manner. For example, an automobile has four tires and four hub caps. While all the elements are coupled as part of the automobile, it is understood that each hubcap is "associated" with a specific tire.

As used herein, "position data" is data that represents the position of any element or assembly relative to another point such as, but not limited to, a different position for that element. In an exemplary embodiment, "position data" represents the position of any element that moves between a first position and a second position as well as any positions therebetween. As used herein, "position data" is an inherent characteristic of a movable element.

As used herein, in the phrase "[x] moves between its first position and second position," or, "[y] is structured to move [x] between its first position and second position," "[x]" is the name of an element or assembly. Further, when [x] is an element or assembly that moves between a number of positions, the pronoun "its" means "[x]," i.e., the named element or assembly that precedes the pronoun "its."

As used herein, "in electronic communication" is used in reference to communicating a signal via an electromagnetic wave or signal. "In electronic communication" includes both hardline and wireless forms of communication.

As used herein, "in electric communication" means that a current passes, or can pass, between the identified elements.

Being "in electric communication" is further dependent upon an element's position or configuration. For example, in a circuit breaker, a movable contact is "in electric communication" with the fixed contact when the contacts are in a closed position. The same movable contact is not "in electric communication" with the fixed contact when the contacts are in the open position.

Figure 2:
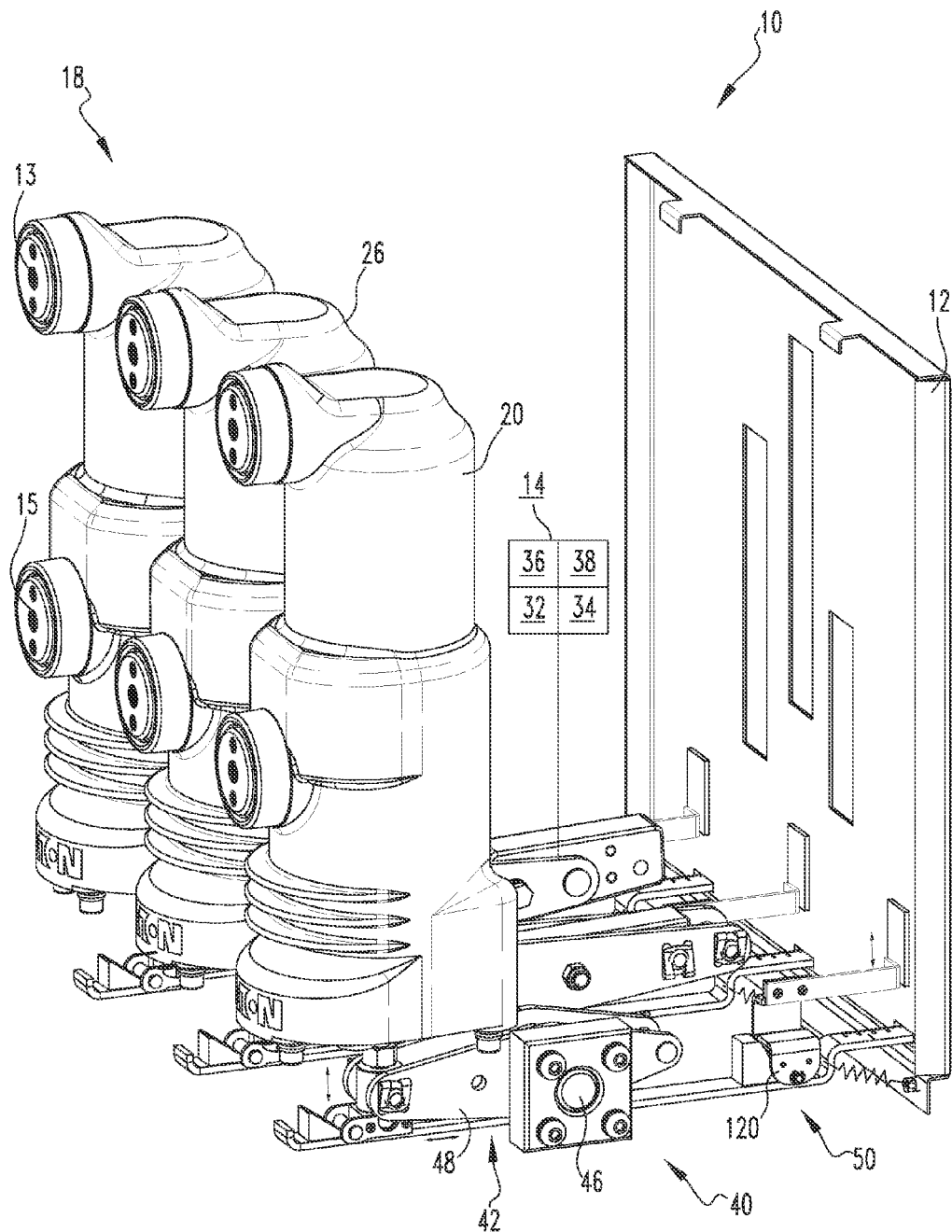
FIG. 2 is a rear isometric partial view of a circuit breaker.

As shown in FIGS. 1 and 2, a circuit breaker assembly 10 (also hereinafter "CBA, further any element associated with the CBA may be preceded by the term CBA) includes a front panel 12, an operating mechanism 14 (shown schematically), an upper terminal 13 and a lower terminal 15. These elements are generally disposed in a low control voltage portion compartment 16 adjacent to the front panel 12. A high voltage compartment 18 includes the vacuum interrupt apparatus 20. The front panel 12 includes controls for manually operating the circuit breaker assembly 10 and changing the state of the CBA contact assemblies 22, 24 (shown schematically, FIG. 4), discussed below, to either an open or closed position. The circuit breaker upper and lower terminals 13, 15 are structured to be connected to a line-in (not shown) and a load (not shown).

An operating mechanism 14 may be either a "fixed travel" operating mechanism 14 or a "variable travel" operating mechanism 14. In a "fixed travel" operating mechanism 14 the motion of the operating mechanism 14, i.e., the distance various elements move, is independent of the CBA contact assemblies 22, 24. That is, regardless of the wear on the CBA contact assemblies 22, 24, the elements of the operating mechanism 14 move substantially the same distance when moving between the first and second positions, described below. Alternately, the elements of a "variable travel" operating mechanism 14 move different distances depending upon the amount wear of the CBA contact assemblies 22, 24. In an exemplary embodiment, the elements of a "variable travel" operating mechanism 14 move a minimal distance when moving between first and second positions when the CBA contact assemblies 22, 24 are new. As the CBA contact assemblies 22, 24 wear, the elements of a "variable travel" operating mechanism 14 move an increased distance.

The vacuum interrupt apparatus 20 includes a pair of separable contacts including a stationary, first contact assembly 22 and a moveable, second contact assembly 24 within a vacuum housing 26. The vacuum housing 26 is, in an exemplary embodiment, generally ceramic, and may be open in the air or may be placed in the special insulating epoxy encapsulation. In either case, the circuit breaker assembly first contact assembly 22 and circuit breaker assembly second contact assembly 24 (hereinafter "CBA first contact assembly" 22 and "CBA second contact assembly" 24) are substantially within the vacuum housing 26 and are not visible. Generally, the stationary CBA first contact assembly 22 is coupled to, and in electrical communication with, the upper terminal 13. The moveable CBA second contact assembly 24 is coupled to, and in electrical communication with, the lower terminal 15. The moveable CBA second contact assembly 24 is structured to move between a first position, wherein the second contact assembly contact body 30 (discussed below) is spaced from, and not in electrical communication with, the CBA first contact assembly 22, and a second position, wherein the second contact assembly contact body 30 is coupled to, and in electrical communication with, the CBA first contact assembly 22. It is understood that, as used herein, when moving "between" a "first" and "second" position, the "first" and "second" positions are resting positions; that is, if an element is moving it is not in, for example, the second position. Also, the path over which a moving element travels has, as used herein, an "axis of motion" which is a line that may be curved or straight. For an elongated pole stem 28, described below, that moves over a generally straight path, the axis of motion is substantially along the longitudinal axis of the pole stem 28.

Further, as is known, a circuit breaker assembly 10 may include more than one pole and, if so, there is a pair of contact assemblies 22, 24 associated with each pole. As shown in FIG. 2, in an exemplary embodiment, the circuit breaker assembly 10 is a three-pole circuit breaker assembly 10. Unless otherwise noted below, the following discussion shall address a single pair of contact assemblies 22, 24; it is understood that there may be a contact wear indicator assembly 50, discussed below, for each pair of contact assemblies 22, 24.

Figure 4:
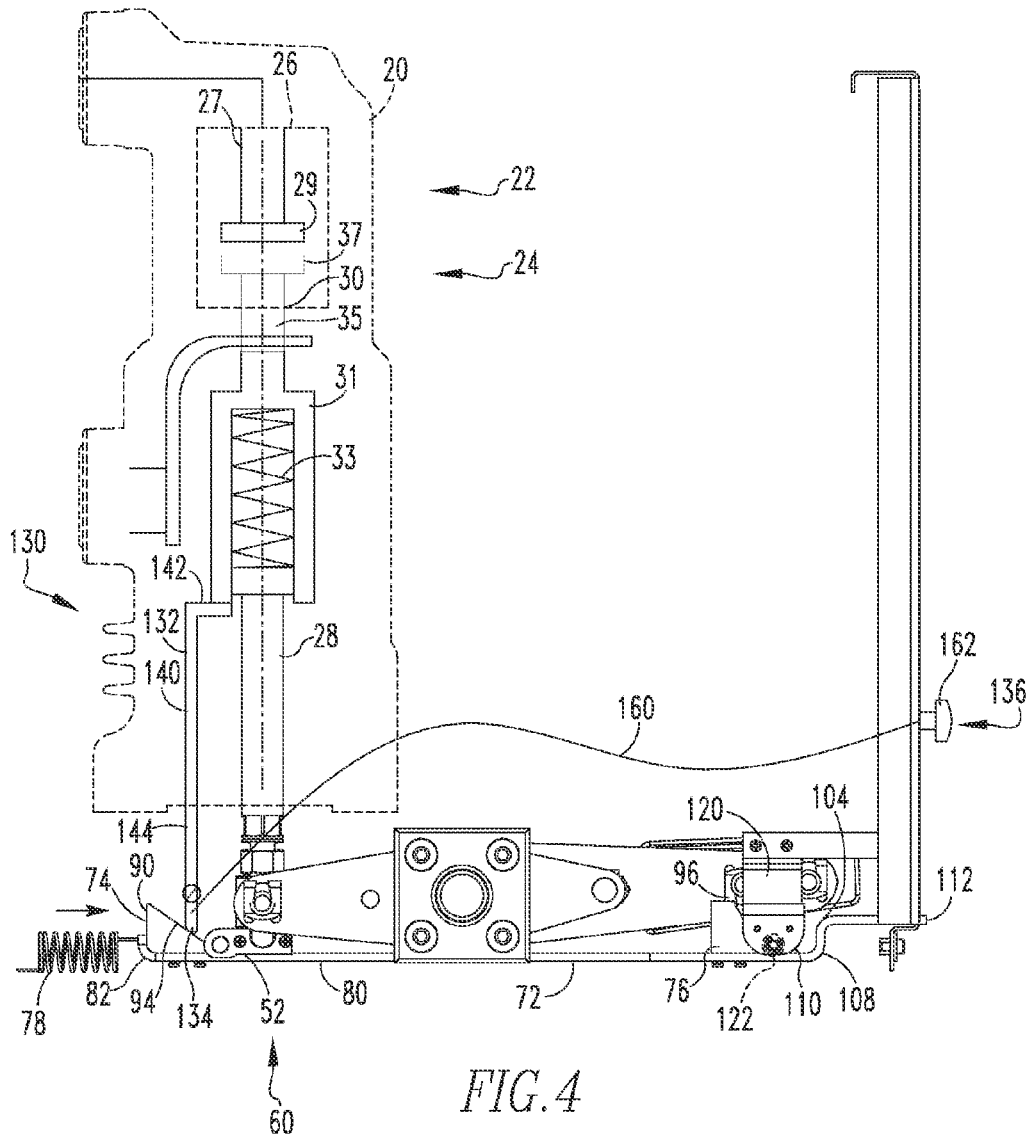
FIG. 4 is a side partial cross-sectional view of a circuit breaker with the contact assemblies, and other assemblies, in a first position.

The CBA first contact assembly 22 includes an elongated contact stem 27 and a contact member 29 (shown schematically in FIG. 4). The first contact assembly 22 contact stem 27 and a contact member 29 are, in an exemplary embodiment, a unitary conductive body. In an exemplary embodiment, the CBA second contact assembly 24 includes an elongated pole stem 28, an insulator 31, a biasing device 33, and a contact body 30 (all shown schematically). The CBA second contact assembly contact body 30 includes a contact stem 35 and a contact member 37 (hereinafter "second contact assembly contact member" 37). In an exemplary embodiment, the CBA second contact assembly insulator 31 is generally cup-shaped. That is, the CBA second contact assembly insulator 31 includes a sidewall and a generally perpendicular base defining an enclosed space. The CBA second contact assembly biasing device 33, shown as a spring, is disposed within the CBA second contact assembly insulator 31 enclosed space. The CBA second contact assembly contact body 30 is coupled, directly coupled, or fixed to the CBA second contact assembly insulator 31 outside of the enclosed space. The CBA second contact assembly pole stem 28 is partially disposed within the CBA second contact assembly insulator 31 enclosed space. The CBA second contact assembly pole stem 28 engages the CBA second contact assembly biasing device 33. The CBA second contact assembly pole stem 28 protrudes from the vacuum housing 26. The CBA second contact assembly pole stem 28 is also operatively coupled to the operating mechanism 14.

The operating mechanism 14 is operatively coupled to the CBA second contact assembly 24 and is structured to move the CBA second contact assembly 24 between its first position and second position. In an exemplary embodiment, the operating mechanism 14 includes a number of movable elements 40. Of the operating mechanism movable elements 40 in a variable travel operating mechanism 14, a portion 42 of the movable elements are coupled to the CBA second contact assembly 24 and move therewith. That is, reference number "42" identifies the portion of operating mechanism elements coupled to the CBA second contact assembly 24 and which move between a first position and a second position corresponding to the CBA second contact assembly 24 first and second positions.

In an exemplary embodiment, the portion 42 of the movable elements are coupled to the CBA second contact assembly 24 includes a pole shaft 46. The pole shaft 46 includes a number of crank members 48. The crank members 48 extend generally radially from the pole shaft 46. The pole shaft 46 and the crank members 48 rotate about the longitudinal axis of the pole shaft 46 between a number of positions including a first position and a second position corresponding to the CBA second contact assembly 24 first and second positions.

As noted above, in a fixed travel operating mechanism 14 the motion of the portion 42 of the movable elements coupled to the CBA second contact assembly 24, i.e., the distance these various elements move, is independent of the CBA contact assemblies 22, 24. That is, the motion of the elements of a fixed travel operating mechanism 14 are controlled and limited by the operating mechanism 14. Thus, as the CBA contact assemblies 22, 24 wear down, the CBA contact assemblies 22, 24 are moved into, and maintained in, contact by the CBA second contact assembly biasing device 33. That is, the fixed travel operating mechanism 14 moves a predetermined distance. If the CBA contact assemblies 22, 24 are worn, that predetermined distance may not be sufficient to move the CBA second contact assembly contact body 30 fully into contact with the CBA first contact assembly 22. This deficiency in the amount of travel provided by the fixed travel operating mechanism 14 is made up for by the CBA second contact assembly biasing device 33. That is, in addition to movement by the operating mechanism 14, the location of the CBA second contact assembly insulator 31 and the CBA second contact assembly contact body 30 is also determined by the CBA second contact assembly biasing device 33. That is, the CBA second contact assembly biasing device 33 moves the CBA second contact assembly contact body 30 fully into contact with the CBA first contact assembly 22. In this configuration, i.e., with a fixed travel operating mechanism 14, as the CBA contact assemblies 22, 24 wear, the CBA second contact assembly biasing device 33 must move the CBA second contact assembly insulator 31 and the CBA second contact assembly contact body 30 a greater distance. Accordingly, as the CBA contact assemblies 22, 24 wear, the wipe becomes smaller and the wipe force is reduced.

Conversely, in a variable travel operating mechanism 14, the motion of the portion 42 of the movable elements coupled to the CBA second contact assembly 24, i.e., distance traveled when moving between first and second positions, increases with more wear on the CBA contact assemblies 22, 24. Moreover, the forces associated with the elements of the variable travel operating mechanism 14 are much stronger than the biasing force of the CBA second contact assembly biasing device 33. It is noted, however, that regardless of whether the operating mechanism is fixed or variable, the positions of the elements thereof change in a manner corresponding to the positions of the CBA second contact assembly 24. That is, when the operating mechanism 14 is in its first position, the CBA second contact assembly 24 is in its first position, and, when the operating mechanism 14 is in its second position, the CBA second contact assembly 24 is in its second position.

In an exemplary embodiment, the circuit breaker assembly 10 also includes an electric control system 32 and a mechanical control system 34 (both shown schematically). Each of the electric control system 32 and mechanical control system 34 are structured to actuate the operating mechanism 14. The CBA electric control system 32 is structured to receive a number of signals from other control devices (none shown). The CBA electric control system 32 signals include, but are not limited to, an open signal, a close signal, an interlock signal, and a release signal. Alternatively, the lack of an interlock signal acts as a "release signal." Upon receiving an open signal, the CBA electric control system 32 causes the CBA second contact assemblies 24 to move from the second position to the first position. Upon receiving a close signal, the CBA electric control system 32 causes the CBA second contact assemblies 24 to move from the first position to the second position. Upon receiving an interlock signal, the CBA electric control system 32 is prevented from responding to either an open signal or a close signal. Upon receiving a release signal, the CBA electric control system 32 is allowed to respond to either an open signal or a close signal.

The CBA mechanical control system 34 including an actuating assembly 36 and an interlock assembly 38 (shown schematically). The CBA mechanical control system actuating assembly 36, shown schematically, is structured to actuate the operating mechanism 14. The CBA mechanical control system interlock assembly 38 is structured to selectively prevent operation of the CBA mechanical control system actuating assembly 36. That is, the CBA mechanical control system interlock assembly 38 moves between an open, first configuration, wherein the mechanical control system actuating assembly 36 is free to actuate operating mechanism 14, and a locked, second configuration, wherein the mechanical control system actuating assembly 36 is not free to actuate the operating mechanism 14. For example, the mechanical control system actuating assembly 36 may include a number of buttons (not shown) that initiate the operating mechanism 14. In an exemplary embodiment, the CBA mechanical control system interlock assembly 38 decouples the mechanical control system actuating assembly 36 buttons from other elements of the CBA mechanical control system interlock assembly 38. Thus, actuating the CBA mechanical control system interlock assembly buttons has no effect on the operating mechanism 14.

Further, it is noted that when the CBA mechanical control system interlock assembly 38 is in the second position, the CBA second contact assembly 24 is in the first position. That is, when the CBA mechanical control system interlock assembly 38 is in the "locked" position, the CBA second contact assembly 24 is in the "open" position. This can be accomplished by various methods. For example, the CBA mechanical control system interlock assembly 38 can actuate the circuit breaker assembly trip bar (not shown) when the CBA mechanical control system interlock assembly 38 is moved into the second configuration.

As shown in FIGS. 3-8, the circuit breaker assembly 10 also includes a contact wear indicator assembly 50. More specifically, as discussed below, the various assemblies of the contact wear indicator assembly 50 move between a first position, FIGS. 3 and 4, and a second position, FIGS. 4-8. Further, the location of the contact wear indicator assembly 50 second position changes between the time the CBA contact assemblies 22, 24 are new, FIGS. 5 and 6, and when the CBA contact assemblies 22, 24 are worn, FIGS. 7 and 8. The contact wear indicator assembly 50 is structured to provide a visual indication representative of contact wear. Further, the contact wear indicator assembly 50 is structured to provide a continuous visual indication representative of contact wear. In an exemplary embodiment, the contact wear indicator assembly 50 is a mechanical contact wear indicator assembly 50A. That is, a mechanical contact wear indicator assembly 50A includes only mechanical elements and does not include electrical elements. In another embodiment, discussed below, the contact wear indicator assembly 50 includes both mechanical elements and electrical elements. The contact wear indicator assembly 50 includes a contact interface assembly 60, an indicator drive assembly 70, a user display assembly 100, and, in an exemplary embodiment, a wipe measurement assembly 130 (hereinafter "wipe assembly" 130).

Figure 3:
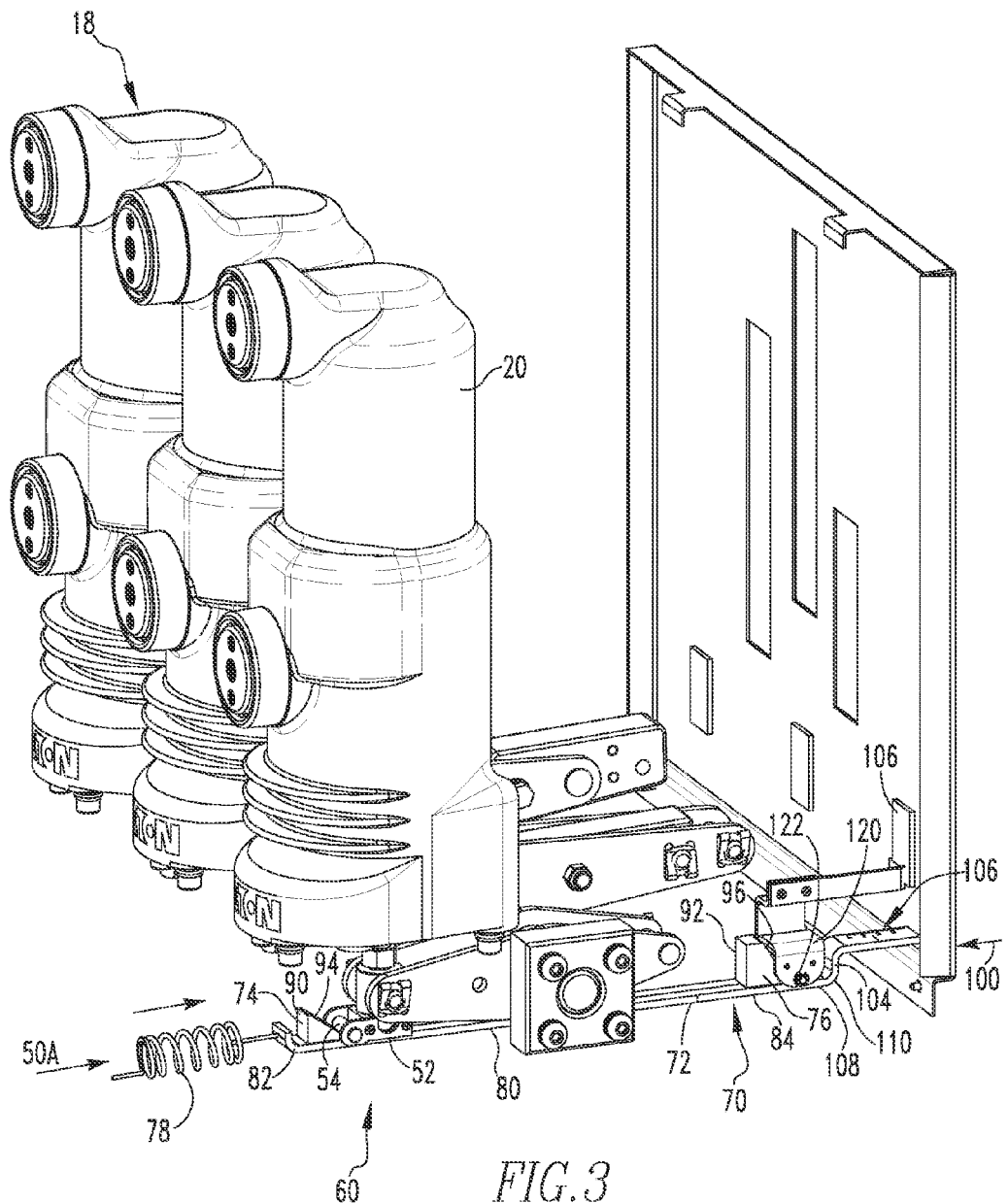
FIG. 3 is another rear isometric partial view of a circuit breaker with the contact assemblies, and other assemblies, in a first position.
Figure 10:
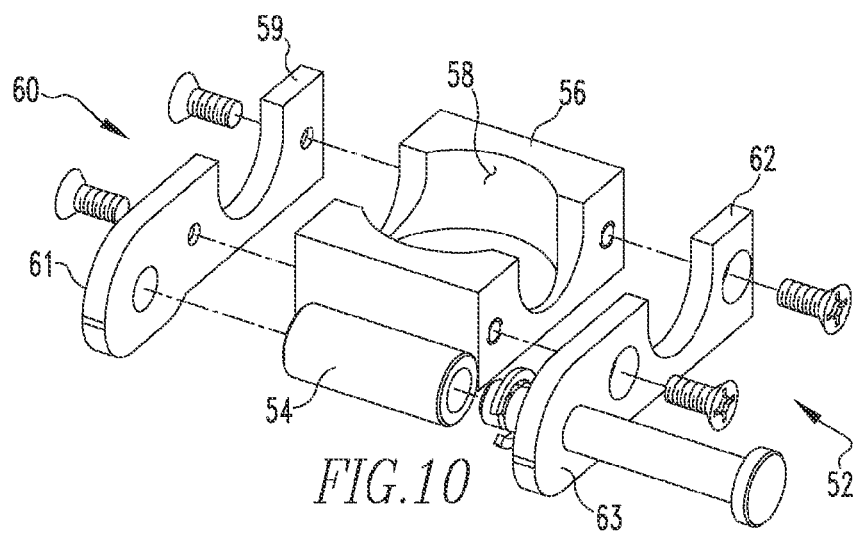
FIG. 10 is an exploded isometric view of an interface assembly.

The contact interface assembly 60 is structured to provide a coupling to the operating mechanism 14 and/or the vacuum interrupt apparatus 20. In an exemplary contact wear indicator assembly 50, the contact interface assembly 60 includes a mounting assembly 52 and a roller 54, as shown in FIG. 3. The contact interface assembly mounting assembly 52 is structured to rotatably support the contact interface assembly roller 54. The contact interface assembly mounting assembly 52 is further structured to be coupled, directly coupled, or fixed to the CBA second contact assembly pole stem 28. In an exemplary embodiment, the contact interface assembly mounting assembly 52 includes a generally parallelepiped body 56 defining a bore 58 sized to correspond to the CBA second contact assembly pole stem 28. In this embodiment, the contact interface assembly roller 54 is rotatably coupled to the contact interface assembly mounting assembly body 56 as shown in FIG. 10. That is, as shown, the contact interface assembly mounting assembly 52 includes two elongated rails 59, 62 that have a greater length than the contact interface assembly mounting assembly body 56. The contact interface assembly mounting assembly rails 59, 62 are coupled, directly coupled, or fixed to the contact interface assembly mounting assembly body 56 each with an interface assembly rails first end 61, 63 extending beyond the perimeter of the contact interface assembly mounting assembly body 56. The contact interface assembly roller 54 is disposed between, and rotatably coupled to, the interface assembly rail first ends 61, 63.

The indicator drive assembly 70 is structured to generate position data representative of a contact assembly 22, 24 characteristic. As used herein, "contact characteristic(s)" are any measurable characteristics of either or both contact(s) 22, 24. In an exemplary embodiment, the position data is representative of CBA contact assembly 22, 24 wear. In an exemplary embodiment as shown in FIG. 3, the indicator drive assembly 70 includes a first drive member 72, a first displacement device 74, a second displacement device 76, and a biasing device 78 (shown schematically in FIGS. 3 and 4). In an exemplary mechanical contact wear indicator assembly 50A, the indicator drive assembly first drive member 72 includes an elongated body 80 with a first end 82 and a second end 84. In an exemplary embodiment, both the first displacement device 74 and second displacement device 76 include wedge-shaped bodies 90, 92. The first displacement device wedge-shaped body 90 (hereinafter "indicator drive assembly first wedge" 90) includes an engagement surface 94. Similarly, the second displacement device wedge-shaped body 92 (hereinafter "indicator drive assembly second wedge" 92) includes an engagement surface 96.

The user display assembly 100 is structured to communicate information to a user related to a contact characteristic. In an exemplary embodiment, the user display assembly 100 includes an output device 102, as shown in FIG. 1. The user display assembly output device 102 is structured to produce a visual indication representative of a contact characteristic. In an exemplary mechanical contact wear indicator assembly 50A (FIG. 3), the user display assembly 100 includes a first link member assembly 104 and a gauge indicia 106 with markings structured to measure or indicate a quantity. As shown in FIGS. 3 and 4, the user display assembly first link member assembly 104 includes a body 108 with a first end 110 and a second end 112 (FIGS. 1 and 4). The user display assembly 100, in an exemplary embodiment, includes a guide assembly (not shown) for the user display assembly first link member assembly body 108 that controls the path of travel thereof. That is, for example, the user display assembly guide assembly limits the user display assembly first link member assembly body 108 to a substantially vertical path of travel.

In one embodiment, the user display assembly first link member assembly body 108 is unitary with, or coupled to, the indicator drive assembly first drive member body 80; that is, the indicator drive assembly first drive member body second end 84 is unitary with, or coupled to, the user display assembly first link member assembly body first end 110. In this embodiment, the user display assembly gauge indicia 106 is coupled to, directly coupled to, fixed to, or unitary with the user display assembly first link member assembly body second end 112, as discussed below.

In another embodiment, the user display assembly first link member assembly 104 includes a U-shaped bracket 120 and a roller 122. In this embodiment, the user display assembly first link member assembly body 108 is elongated and the user display assembly first link member assembly body first end 110 is coupled to the user display assembly first link member assembly U-shaped bracket 120. Further, the user display assembly first link member assembly body second end 112 is formed into a pointer 113 that extends generally perpendicularly to the other portions of the user display assembly first link member assembly body 108. In this embodiment, the user display assembly first link member assembly roller 122 (hereinafter "user display assembly roller" 122) is rotatably coupled to the user display assembly first link member assembly U-shaped bracket 120.

The wipe assembly 130 includes a support member 132, a movable member 134 and a release assembly 136, as shown in FIG. 4. In an exemplary embodiment, the wipe assembly support member 132 is an elongated body 140 with a first end 142 and a second end 144. The wipe assembly movable member 134 also includes an elongated body 150 with a first end 152 and a second end 154. The wipe assembly movable member body first end 152 is movably coupled to the wipe assembly support member body second end 144. In an exemplary embodiment, the wipe assembly movable member body first end 152 is rotatably coupled to the wipe assembly support member body second end 144. The wipe assembly movable member 134 is structured to move between an extended, first position, wherein the longitudinal axes of the wipe assembly support member body 140 and the wipe assembly movable member body 150 are generally aligned, and a retracted, second position, wherein the longitudinal axes of the wipe assembly support member body 140 and the wipe assembly movable member body 150 are generally offset.

The wipe assembly release assembly 136 is structured to move the wipe assembly movable member 134 from the first position to the second position. In an exemplary embodiment, as shown, the wipe assembly release assembly 136 includes a tension member 160 and a handle 162. The wipe assembly release assembly handle 162 is disposed on the front panel 12 and is structured to be pulled. The wipe assembly release assembly tension member 160 extends between the wipe assembly release assembly handle 162 and the wipe assembly movable member 134. Accordingly, when the wipe assembly release assembly handle 162 is pulled the wipe assembly movable member 134 moves from the first position to the second position. In the orientation shown, gravity moves the wipe assembly movable member 134 from the second position to the first position. It is understood that the wipe assembly 130 may include a reset device, such as, but not limited to, a spring (not shown) structured to move the wipe assembly movable member 134 from the second position to the first position.

Figure 8:
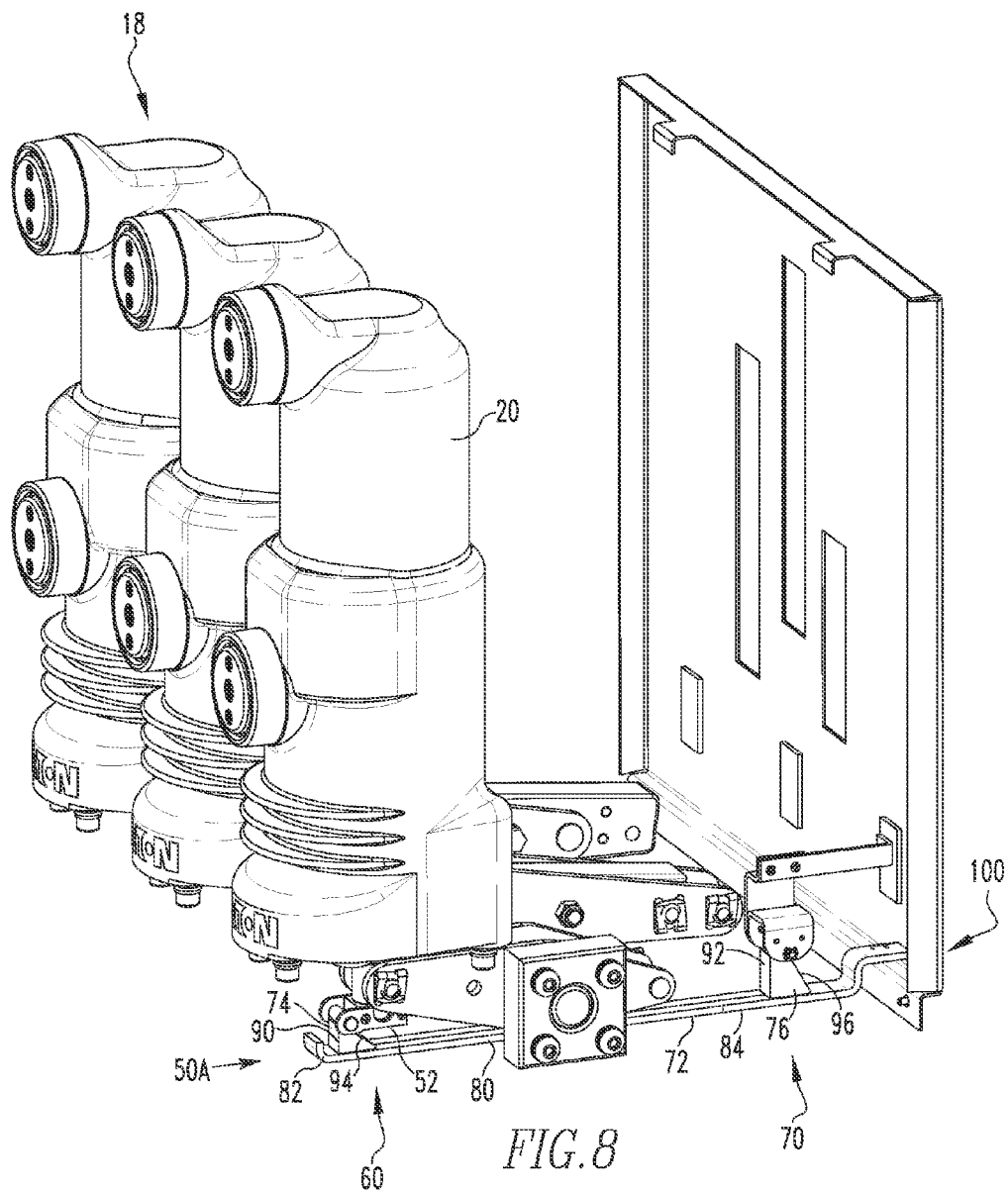
FIG. 8 is another rear isometric partial view of a circuit breaker with worn contact assemblies, and other assemblies, in a second position.
Figure 9:
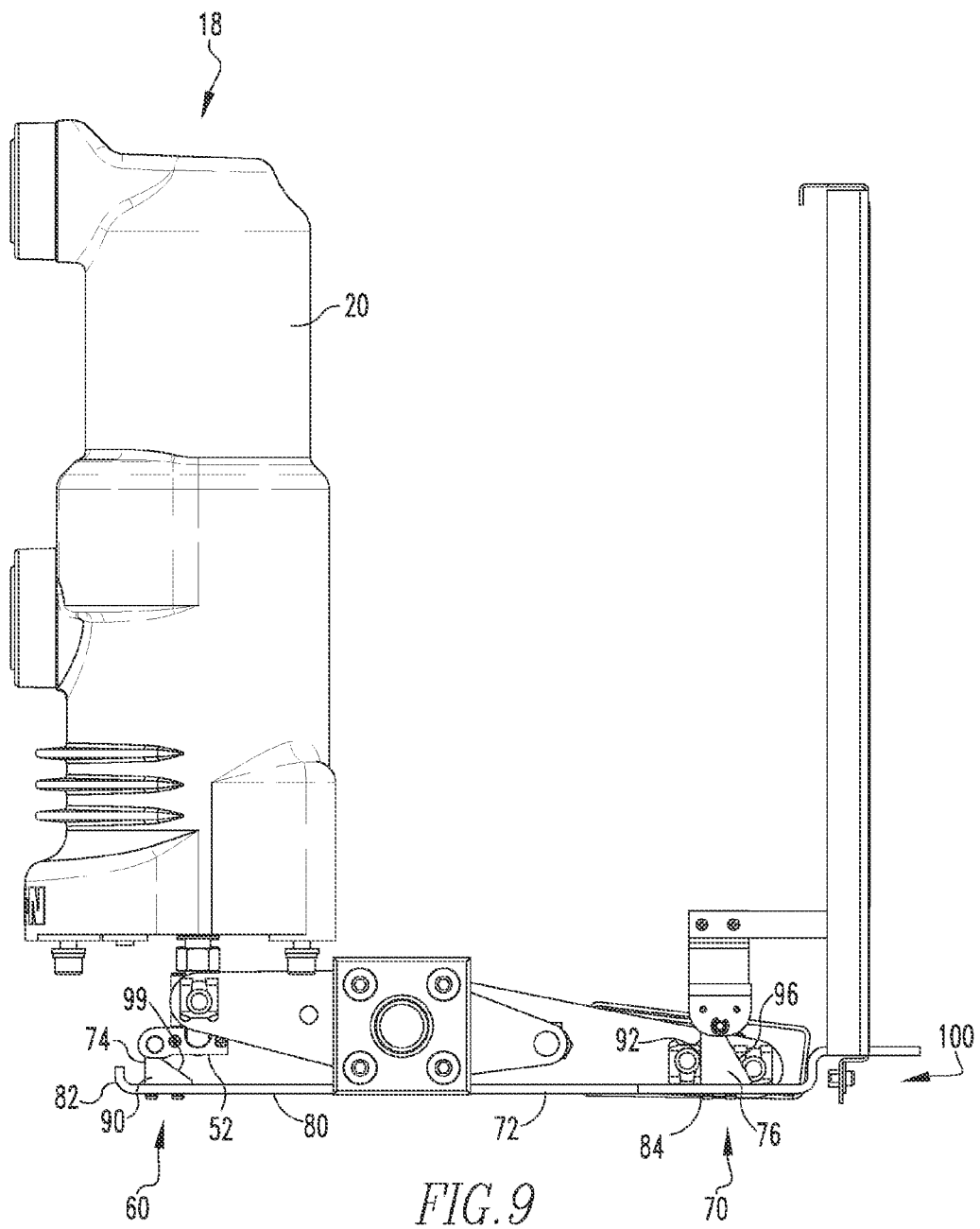
FIG. 9 is a side partial view of a circuit breaker with worn contact assemblies, and other assemblies, in a second position.

One exemplary embodiment of a mechanical contact wear indicator assembly 50A is assembled as follows. The contact interface assembly 60 is coupled, directly coupled, or fixed to the CBA second contact assembly pole stem 28. In an exemplary embodiment, the contact interface assembly 60 is coupled, directly coupled, or fixed to the lower end of the CBA second contact assembly pole stem 28. That is, the lower end of the CBA second contact assembly pole stem 28 is disposed in the interface assembly mounting assembly body bore 58. In this configuration, the contact interface assembly 60 moves with the CBA second contact assembly pole stem 28. Thus, when the second contact assembly contact body 30 is new, the CBA second contact assembly 24 and the contact interface assembly 60 move a first distance, i.e., the displacement, as discussed above. When the second contact assembly contact body 30 is worn, the CBA second contact assembly 24 and the contact interface assembly 60 move a second distance which is greater than the first distance. Thus, the contact interface assembly 60 moves between a first position and a second position corresponding to the CBA second contact assembly 24 first and second positions. Further, as can be seen comparing FIGS. 6 and 9, i.e., the location of the contact interface assembly 60 on indicator drive assembly first wedge engagement surface 94 is lower (FIG. 6) when the CBA contact assemblies 22, 24 are new, relative to the location of the contact interface assembly 60 on indicator drive assembly first wedge engagement surface 94 when the CBA contact assemblies 22, 24 are worn (FIG. 8). Stated alternately, when the CBA contact assemblies 22, 24 are worn, and the displacement length is greater, the indicator drive assembly biasing device 78 biases the indicator drive assembly 70 further toward the front panel 12 compared to when the CBA contact assemblies 22, 24 are new.

Figure 6:
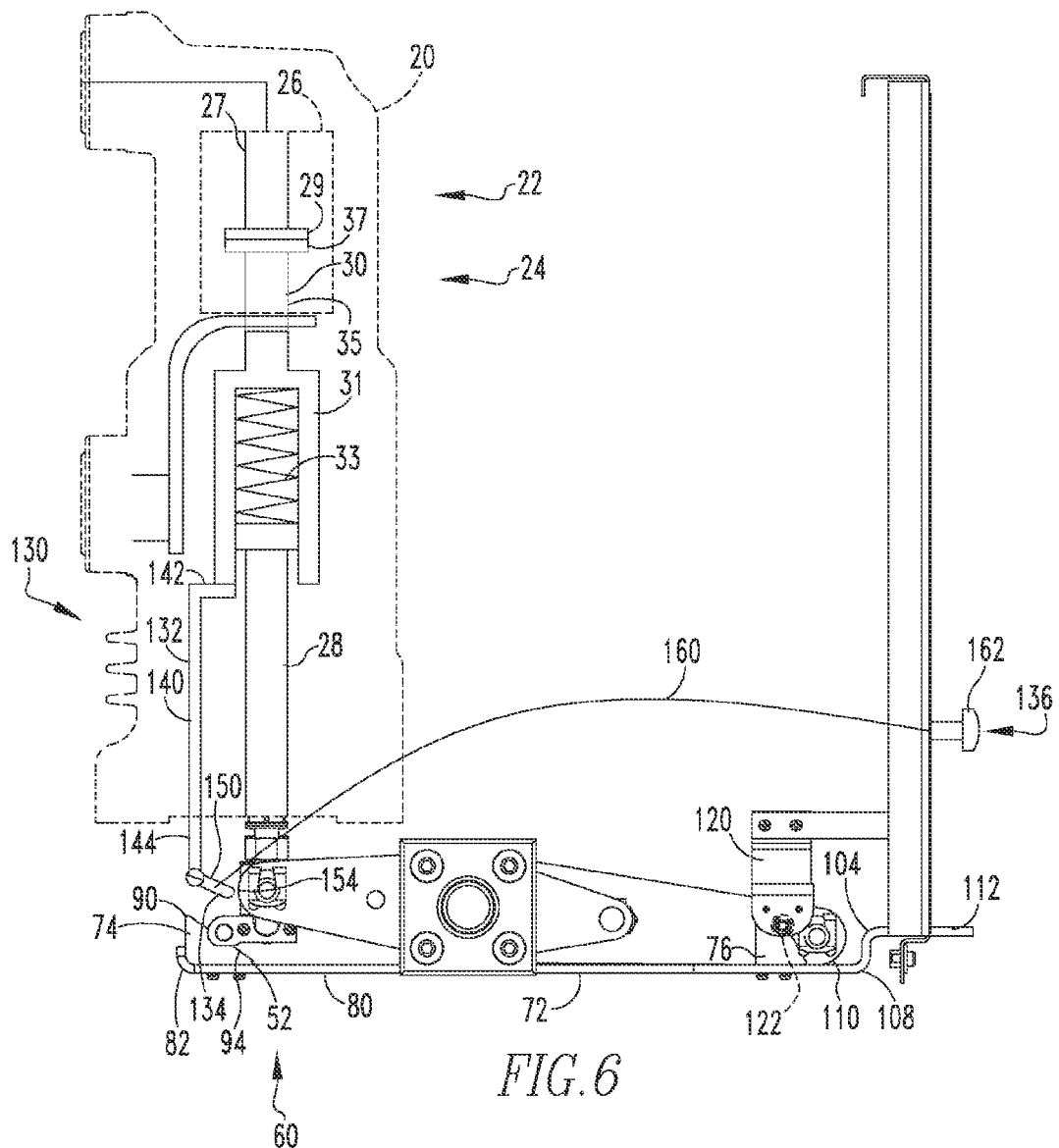
FIG. 6 is a side partial cross-sectional view of a circuit breaker with the contact assemblies, and other assemblies, in a second position.
Figure 7:
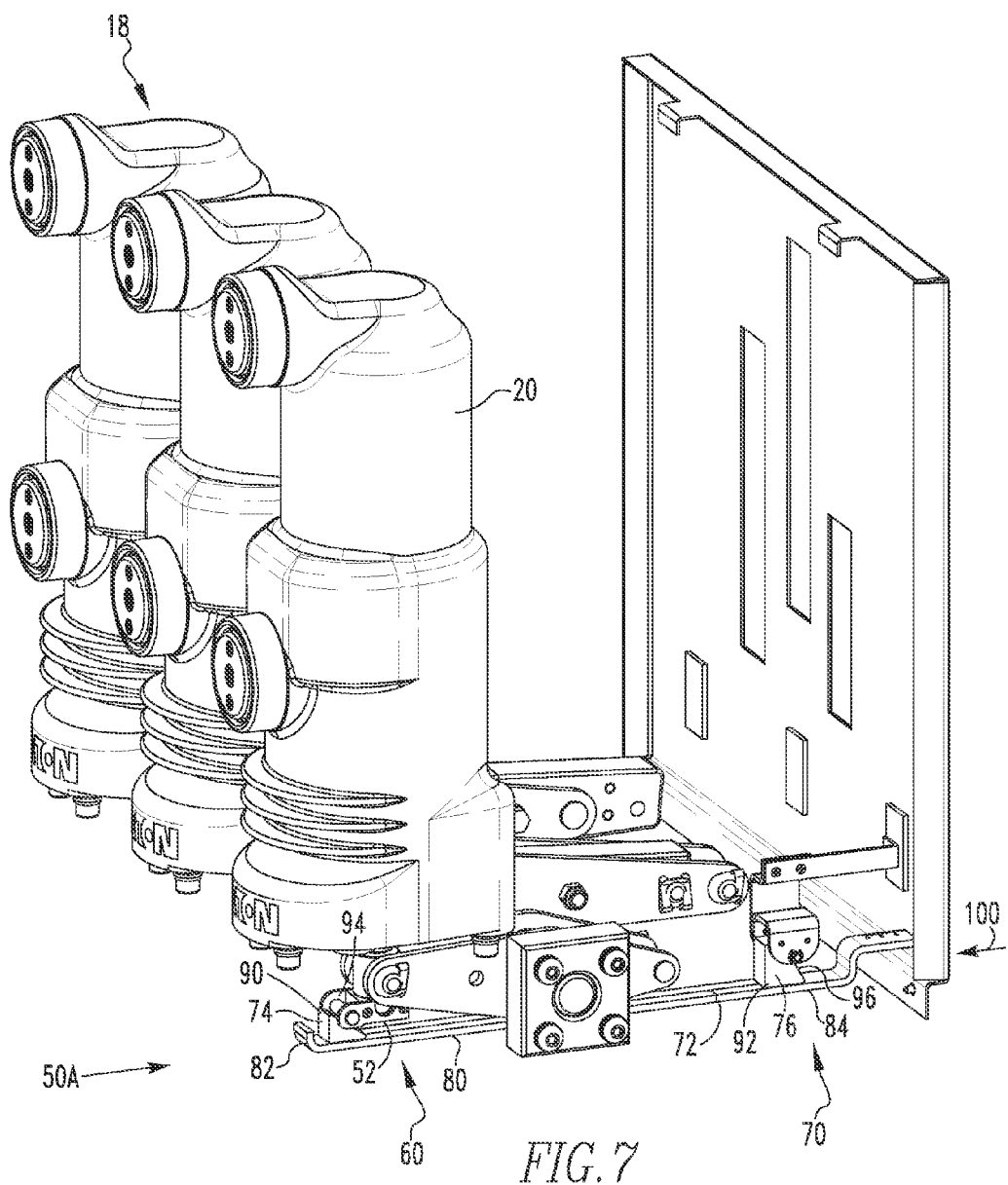
FIG. 7 is another rear isometric partial view of a circuit breaker with new contact assemblies, and other assemblies, in a second position.

The indicator drive assembly first displacement device 74, i.e., indicator drive assembly first wedge 90, is coupled, directly coupled, or fixed to the indicator drive assembly first drive member body first end 82. As shown in FIGS. 4, 6, and 8, the indicator drive assembly first wedge engagement surface 94 is oriented so as to be the upper surface of the indicator drive assembly first wedge 90. Further, the indicator drive assembly first wedge engagement surface 94 is oriented so as to face the front panel 12. That is, the indicator drive assembly first wedge engagement surface 94 faces upwardly and forwardly. The indicator drive assembly second displacement device 76, i.e., indicator drive assembly second wedge 92, is coupled, directly coupled, or fixed to the indicator drive assembly first drive member body second end 84. As shown in FIGS. 4, 6, and 8, the indicator drive assembly second wedge engagement surface 96 is oriented so as to be the upper surface of the indicator drive assembly second wedge 92. Further, the indicator drive assembly second wedge engagement surface 96 is oriented so as to face the front panel 12. That is, the indicator drive assembly second wedge engagement surface 96 faces upwardly and forwardly. Stated alternately, the indicator drive assembly first wedge engagement surface 94 and the indicator drive assembly second wedge engagement surface 96 are positioned to have the same orientation. The orientation of the wedges 90, 92 may be reversed, however, so that the user display assembly first link member assembly 104 or U-shaped bracket 120 would move in opposite directions for indicating the wear, stroke and wipe.

The indicator drive assembly first drive member body first end 82 is disposed adjacent the contact interface assembly 60. Further, the indicator drive assembly biasing device 78 is coupled, directly coupled, or fixed to the indicator drive assembly first drive member body 80 and structured to bias the indicator drive assembly first drive member body 80 toward the front panel 12, as shown schematically in FIGS. 3 and 4. The indicator drive assembly first displacement device 74 is disposed generally below the vacuum housing 26 with the contact interface assembly roller 54 engaging the indicator drive assembly first wedge engagement surface 94. That is, the bias of the indicator drive assembly biasing device 78 pushes the indicator drive assembly first displacement device 74, and more specifically the angled indicator drive assembly first wedge engagement surface 94, against the contact interface assembly roller 54.

In this configuration, the indicator drive assembly first drive member 72 is operatively coupled to the contact interface assembly 60 or, stated alternately, the contact interface assembly 60 is operatively coupled to the indicator drive assembly first displacement device 74. Further, the indicator drive assembly first drive member 72 moves between a first position and a second position corresponding to the contact interface assembly 60 first and second positions. In this configuration, the indicator drive assembly first drive member 72 translates between its first and second positions.

That is, when the CBA second contact assembly 24 moves from the second position to the first position, the CBA second contact assembly pole stem 28 moves generally linearly toward the indicator drive assembly first drive member 72. This motion causes the contact interface assembly roller 54 to operatively engage the indicator drive assembly first wedge engagement surface 94. Due to the angle of the indicator drive assembly first wedge engagement surface 94, this engagement biases the indicator drive assembly first wedge 90. As shown, the indicator drive assembly first wedge 90, along with the indicator drive assembly first drive member 72, is biased away from the front panel 12. This bias moves the indicator drive assembly first drive member 72 to its first position.

Conversely, when the CBA second contact assembly 24 moves from the first position to the second position, the CBA second contact assembly pole stem 28 moves generally linearly away from the indicator drive assembly first drive member 72. As the contact interface assembly 60 moves with the CBA second contact assembly pole stem 28 away from the indicator drive assembly first drive member 72, the indicator drive assembly biasing device 78 biases the indicator drive assembly first drive member 72 toward the front panel 12. The motion of the indicator drive assembly first drive member 72 is arrested by the engagement between the contact interface assembly roller 54 with the indicator drive assembly first wedge 90. Thus, when the CBA second contact assembly 24 is in its second position, the indicator drive assembly first drive member 72 is in its second position.

The indicator drive assembly first drive member body second end 84 is disposed adjacent the user display assembly 100. In one embodiment, the user display assembly 100, and, as shown, the user display assembly first link member assembly 104 and a gauge indicia 106, are unitary with the indicator drive assembly first drive member body second end 84. Thus, the user display assembly 100, and more specifically the user display assembly gauge indicia 106, moves between a first position and a second position corresponding to the indicator drive assembly first drive member 72 first and second positions which, in turn, correspond to the CBA second contact assembly 24 first and second positions. In this configuration, the user display assembly 100 is structured to display the indicator drive assembly first drive member 72 position data on the output device 102 which, in this exemplary embodiment, is the user display assembly gauge indicia 106.

In this embodiment, the user display assembly first link member assembly body second end 112 extends beyond the surface of the front panel 12, as shown in FIGS. 1, 4, 6, and 8. Thus, the user display assembly gauge indicia 106 is disposed adjacent to the front panel 12. Moreover, the user display assembly gauge indicia 106 moves between a first position and a second position corresponding to the indicator drive assembly first drive member 72 first and second positions. That is, generally, the user display assembly gauge indicia 106 slides in and out of the front panel 12 as the indicator drive assembly first drive member 72 moves between its first and second positions. Thus, in view of the bias of the indicator drive assembly biasing device 78 and the orientation of the indicator drive assembly first wedge engagement surface 94, as described above, the user display assembly gauge indicia 106 is disposed at a specific location when the second contact assembly contact body 30 is new and in its second position.

As either, or both, of the first and second contact assembly contact members 29, 37 wear, the CBA second contact assembly contact body 30 in the second position shifts upwardly. That is, the overall height of the first and second contact assembly contact members 29, 37 diminish with wear, thus the position of the CBA second contact assembly 24 relative to a fixed point, e.g., the bottom of the vacuum housing 26, when the CBA second contact assembly contact body 30 is in the second position becomes higher.

Accordingly, in a variable travel operating mechanism 14, the elements that move into a position corresponding to the CBA second contact assembly 24 second position, also shift. This includes the user display assembly gauge indicia 106. Generally, as either, or both, of the first and second contact assembly contact members 29, 37 wear, the user display assembly first link member assembly body second end 112, and therefore the user display assembly gauge indicia 106, extends further than when the first and second contact assembly contact members 29, 37 are new.

In an exemplary embodiment, the user display assembly gauge indicia 106 can be "zeroed" when the CBA first and second contact assembly contact members 29, 37 are new and in the second position. In one embodiment, wherein the dimensions of the relevant circuit breaker assembly 10 elements are known, the user display assembly gauge indicia 106 includes a mark, e.g., a green line (not shown), extending laterally across the user display assembly first link member assembly body second end 112. Such a mark is positioned to be aligned with the surface of the front panel 12. As the first and second contact assembly contact members 29, 37 wear, and the user display assembly gauge indicia 106 extends further as described above, the mark moves out of alignment with the surface of the front panel 12. In an exemplary embodiment, the user display assembly gauge indicia 106 further includes another mark, e.g., a red line (not shown), extending laterally across the user display assembly first link member assembly body second end 112. When the first and second contact assembly contact members 29, 37 wear to a point that replacement is needed, the red line is aligned with the surface of the front panel 12 when the second contact assembly contact body 30 is in the second position.

Further, the displacement can be measured on the user display assembly gauge indicia 106. For example, the user display assembly first link member assembly body second end 112, and the user display assembly gauge indicia 106, in an exemplary embodiment, are structured to extend a sufficient distance beyond the front panel 12 when the second contact assembly is in the first position. That is, in the configuration described above, the indicator drive assembly first drive member 72 and the user display assembly first link member assembly 104 are moved away from the front panel 12 when the CBA second contact assembly 24 is in the first position. In an exemplary embodiment, the user display assembly first link member assembly body second end 112, and the user display assembly gauge indicia 106, have a sufficient length so that these elements still extend beyond the front panel 12 when the CBA second contact assembly 24 is in the first position. In this configuration, a user may make a mark on the user display assembly gauge indicia 106 when the second contact assembly contact body 30 is in the first position and again when the second contact assembly contact body 30 is in the second position. The difference between the marks is an indication of the length of the displacement.

It is noted that the distance that the indicator drive assembly first drive member 72 and the user display assembly first link member assembly 104 are moved is controlled by the angle of the indicator drive assembly first wedge engagement surface 94. For example, if the angle of the indicator drive assembly first wedge engagement surface 94 relative to the axis of motion of the second contact assembly pole stem 28 is substantially forty-five degrees, then the ratio of contact assembly pole stem 28 travel and indicator drive assembly first drive member 72 travel is substantially 1:1, i.e., substantially the same. Conversely, if the angle of the indicator drive assembly first wedge engagement surface 94 relative to the axis of motion of the second contact assembly pole stem 28 is greater than forty-five degrees, then the ratio of contact assembly pole stem 28 travel and indicator drive assembly first drive member 72 travel is greater than 1:1. That is, the second contact assembly pole stem 28 travels a first distance and the indicator drive assembly first drive member 72 travels a distance greater than the first distance. In this configuration, the markings on the user display assembly gauge indicia 106 are adjusted to accurately represent the distance traveled by the CBA second contact assembly 24. Further, if the angle of the indicator drive assembly first wedge engagement surface 94 relative to the axis of motion of the second contact assembly pole stem 28 is less than forty-five degrees, then the ratio of contact assembly stem 28 travel and indicator drive assembly first drive member 72 travel is less than 1:1.

In an exemplary embodiment, the indicator drive assembly first wedge engagement surface 94 is angled between about 5 and 85 degrees, or between about 30 and 60 degrees, or about 45 degrees relative to the motion of the second contact assembly pole stem 28. When the second contact assembly pole stem 28 is generally straight, the angles noted above are measured relative to the longitudinal axis of the second contact assembly pole stem 28. Further, as used herein, a "corresponding angle," when used to describe the angle of said indicator drive assembly first wedge engagement surface 94 relative to said second contact assembly pole stem 28 axis of motion means that ratio of travel is about 1:1. Further, as used herein, a "magnification angle," when used to describe the angle of said indicator drive assembly first wedge engagement surface 94 relative to said second contact assembly pole stem 28 axis of motion means that ratio of travel is greater than 1:1. Further, as used herein, a "reduction angle," when used to describe the angle of said indicator drive assembly first wedge engagement surface 94 relative to said second contact assembly pole stem 28 axis of motion means that ratio of travel is less than 1:1.

In another embodiment, also shown in FIGS. 1-9, the user display assembly gauge indicia 106 is coupled, directly coupled, fixed or unitary with the front panel. In this embodiment, the indicator drive assembly 70 includes the second displacement device 76, i.e., indicator drive assembly second wedge 92, and the user display assembly 100 includes the user display assembly first link member assembly 104 with a user display assembly first link member assembly body second end 112 formed into a pointer, as described above. In this embodiment, the indicator drive assembly second displacement device 76. i.e., indicator drive assembly second wedge 92, is disposed at, (i.e., coupled to, directly coupled to, fixed to, or unitary with) the indicator drive assembly first drive member body second end 84. Further, the indicator drive assembly first drive member body second end 84 is disposed adjacent the user display assembly gauge indicia 106, i.e., adjacent the front panel 12. The user display assembly first link member assembly body 108, and in an exemplary embodiment, the user display assembly roller 122, is positioned to be operatively engaged by the indicator drive assembly second displacement device 76, i.e., indicator drive assembly second wedge 92, and more specifically the indicator drive assembly second wedge engagement surface 96. The user display assembly first link member assembly body second end 112 is disposed over, or adjacent, the user display assembly gauge indicia 106. That is, the user display assembly first link member assembly body second end pointer 113 is disposed over, or adjacent, the user display assembly gauge indicia 106.

In this configuration, movement of the CBA second contact assembly 24 causes the indicator drive assembly first drive member 72 to move as described above. In this embodiment, movement of the indicator drive assembly first drive member 72 causes the indicator drive assembly second displacement device 76, i.e., indicator drive assembly second wedge 92, to engage the user display assembly first link member assembly body 108. That is, the user display assembly roller 122 moves over the indicator drive assembly second wedge engagement surface 96. Thus, the user display assembly first link member assembly body 108 moves between a first position and a second position corresponding to the indicator drive assembly first drive member 72 first and second positions which, in turn, correspond to the CBA second contact assembly 24 first and second positions. Generally, the user display assembly first link member assembly body second end pointer 113 moves up and down relative to the user display assembly gauge indicia 106.

That is, in the configuration described above, when the CBA second contact assembly 24 is in the second position, the bias of the indicator drive assembly biasing device 78 and the orientation of the indicator drive assembly first wedge engagement surface 94 bias the indicator drive assembly first drive member 72 toward the front panel 12. The indicator drive assembly second wedge engagement surface 96 is, in turn, biased against the user display assembly roller 122. As the user display assembly roller 122 moves over the indicator drive assembly second wedge engagement surface 96, the user display assembly first link member assembly 104 (which, in an exemplary embodiment, is limited to generally vertical motion by a guide assembly, not shown) is biased to an upper position. Thus, user display assembly first link member assembly body second end pointer 113 is disposed over, or adjacent, a specific location on the user display assembly gauge indicia 106.

The user display assembly gauge indicia 106 can include a marking corresponding to the location of the user display assembly first link member assembly body second end pointer 113 when the first and second CBA contact assemblies 22, 24 are new. As before, when the first and second CBA contact assemblies 22, 24 wear, the indicator drive assembly first drive member 72 moves further toward the front panel 12. Thus, in this configuration, when the first and second CBA contact assemblies 22, 24 wear, the second displacement device 76 also moves closer to the front panel 12. The closer the second displacement device 76 is to front panel 12, the more the user display assembly first link member assembly 104 is lifted as the user display assembly roller 122 moves over the indicator drive assembly second wedge engagement surface 96. Accordingly, when the first and second CBA contact assemblies 22, 24 wear, the user display assembly first link member assembly body second end pointer 113 is disposed at different, and in this configuration, a higher elevation, relative to user display assembly gauge indicia 106. As before, the user display assembly gauge indicia 106, in an exemplary embodiment, includes a mark indication when the first and second CBA contact assemblies 22, 24 need replaced.

As before, the angle of the indicator drive assembly first wedge engagement surface 94 relative to the second contact assembly pole stem 28 axis of motion controls the distance traveled by various elements as described above. In this configuration, the angle of the indicator drive assembly second wedge engagement surface 96 relative to the user display assembly first link member assembly 104 axis of motion (which, in an exemplary embodiment, is limited to generally vertical motion by a guide assembly, not shown) also affects the amount of movement of the user display assembly first link member assembly 104. That is, if the angle of the indicator drive assembly second wedge engagement surface 96 relative to the user display assembly first link member assembly 104 axis of motion is about forty-five degrees, then the distance moved by user display assembly first link member assembly 104 generally corresponds to the distance traveled by the indicator drive assembly first drive member 72, i.e., a 1:1 ratio. If the angle of the indicator drive assembly second wedge engagement surface 96 relative to the user display assembly first link member assembly 104 axis of motion is greater than forty-five degrees, then the ratio of travel between the indicator drive assembly first drive member 72 travel and the user display assembly first link member assembly 104 is greater than 1:1. That is, the angle of the indicator drive assembly second wedge engagement surface 96 relative to the user display assembly first link member assembly 104 axis of motion can be a "corresponding angle," a "magnification angle," or a "reduction angle" as those terms are defined above but based upon the user display assembly first link member assembly 104 axis of motion and the indicator drive assembly second wedge engagement surface 96.

Further, the angle of the indicator drive assembly first wedge engagement surface 94 relative to the axis of motion of the second contact assembly pole stem 28 and the angle of the indicator drive assembly second wedge engagement surface 96 relative to the user display assembly first link member assembly 104 axis of motion compared to each other affects the amount of travel of the user display assembly first link member assembly 104. That is, for example, if both first and second wedge engagement surfaces 94, 96 are angled so as to be magnification angles, the effect of the increased motion of the indicator drive assembly first drive member 72 and the user display assembly first link member assembly 104 is stacked.

In a circuit breaker assembly 10 with a fixed travel operating mechanism 14, the portion 42 of the movable elements coupled to the CBA second contact assembly 24 move substantially the same distance regardless of the wear and tear on the CBA contact assemblies 22, 24. Accordingly, in a fixed travel operating mechanism 14, the second contact assembly pole stem 28 and the contact interface assembly 60 move substantially the same distance when moving between the first and second positions, regardless of the wear on the CBA contact assemblies 22, 24. In the configuration described above, the motion of the indicator drive assembly 70 corresponds to the position of the contact interface assembly 60. Thus, with a fixed travel operating mechanism 14, the configuration of the contact wear indicator assembly 50 would be ineffective when measuring wear of the CBA contact assemblies 22, 24. Accordingly, when a fixed travel operating mechanism 14 is used, the contact wear indicator assembly 50 requires a wipe assembly 130. That is, with a fixed travel operating mechanism 14, the erosion of the CBA contact assemblies 22, 24 is evidenced by the change in the wipe distance; thus, the wipe distance must be determined.

The wipe assembly 130 is structured to determine the wipe distance. The wipe assembly 130 is assembled as follows. The wipe assembly support member 132 is coupled, directly coupled, or fixed to the CBA second contact assembly insulator 31. Usually, the insulator assembly, or a similar construct, is structured to move positively with moving contact body 30 without any relative motion between them. The insulator assembly also electrically separates the moving contact body 30 from the pole stem 28 and operating mechanism 14 thereafter. As noted above, the CBA second contact assembly insulator 31 is positioned by the CBA second contact assembly biasing device 33 and this position changes as the CBA contact assemblies 22, 24 wear. Pole stem 28, on the other hand, has the relative motion between moving contact body 30 after the contacts are moved to the second position, and this relative motion is compensated by the biasing device 33. This compensation distance is called as the wipe that provides the wipe contact force on the contact assemblies 22, 24. As shown, the wipe assembly support member body first end 142 is coupled, directly coupled, or fixed to the CBA second contact assembly insulator 31. The wipe assembly support member body 140 extends generally downwardly from the CBA second contact assembly insulator 31. The wipe assembly support member body 140 is generally disposed above the indicator drive assembly first wedge engagement surface 94. As noted above, the wipe assembly movable member body first end 152 is rotatably coupled to the wipe assembly support member second end 144. The wipe assembly movable member body 150 is disposed in the path of travel of the indicator drive assembly first wedge 90.

Figure 5:
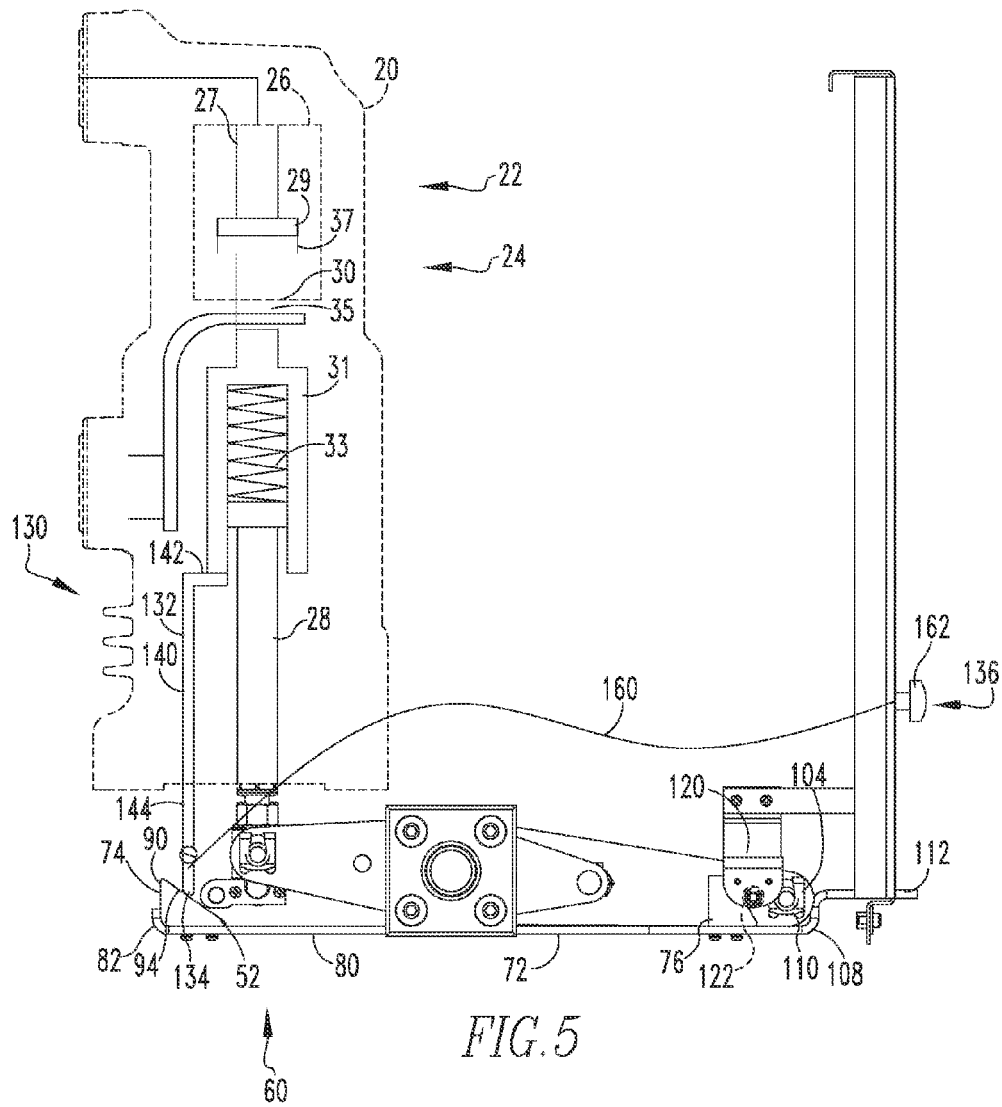
FIG. 5 is a side partial cross-sectional view of a circuit breaker with the contact assemblies, and other assemblies, in a wipe position.

When the contact assemblies 22, 24 are in the first position, the wipe assembly movable member body second end 154 holds the indicator drive assembly first displacement device 74 against the bias of biasing device 78. The first wedge engagement surface 94 rests on the wipe assembly movable member body second end 154 and may also rest simultaneously on the contact interface assembly roller 54. When contact assembly 24 moves from first position to second position, the indicator drive assembly first displacement device 74 slides along the wedge engagement surface 94 on the wipe assembly movable member body second end 154 and may also slide on the contact interface assembly roller 54. Once the moving contact body 30 makes contact with fixed contact 22, the insulator assembly 31 and wipe assembly support member 132 stop moving further, however, the pole stem 28 (along with interface assembly mounting assembly 52 and contact interface assembly roller 54) move further by compressing biasing device 33. Thus, in a second position (close position) the first wedge engagement surface 94 is resting only on the second end 154 and not on the contact interface assembly roller 54 (or contact interface assembly 60). This is an intermediate "Wipe position" as shown in FIG. 5. Thus, the displacement of indicator drive assembly first drive member 72 from the "first position" to "wipe position" is the stroke of the second contact assembly 24. Further, the indicator drive assembly first drive member 72 can be released from "wipe position" such that the first wedge engagement surface 94 loses the contact with wipe assembly movable member body second end 154 and establishes new contact with contact interface assembly roller 54 and attains its "second position," as shown in FIG. 6. The positional difference of first drive member 72 between "wipe position" and "second position" can be translated as the "wipe" of the second contact assembly 24. All these positions can be indicated and measured by contact wear indicator assembly 50, and displayed on user display assembly 100, as discussed before for the variable displacement operating mechanism breakers.

In this embodiment, the motion of the indicator drive assembly first drive member 72 between the first and second positions includes an intermediate, wipe position (hereinafter "wipe position"). That is, in this exemplary embodiment, when the CBA second contact assembly 24 moves from the first position to the second position, the CBA second contact assembly pole stem 28 moves generally linearly away from the indicator drive assembly first drive member 72. As the contact interface assembly 60 moves with the CBA second contact assembly pole stem 28 away from the indicator drive assembly first drive member 72, the indicator drive assembly biasing device 78 biases the indicator drive assembly first drive member 72 toward the front panel 12. Unlike the embodiment previously discussed above for variable displacement operating mechanism, however, in this embodiment the motion of the indicator drive assembly first drive member 72 is arrested by the wipe assembly 130.

That is, when the CBA second contact assembly 24 moves from the first position to the second position, the CBA second contact assembly insulator 31 moves from its first position to its second position, i.e., generally upwardly as shown in the figures. Further, as the indicator drive assembly first drive member 72 moves toward the front panel 12, the wipe assembly movable member body second end 154 engages the indicator drive assembly first wedge engagement surface 94. The engagement between the wipe assembly movable member body second end 154 and the indicator drive assembly first wedge engagement surface 94 arrests the motion of the indicator drive assembly first drive member 72. This is the "wipe position."

As detailed above, the user display assembly 100 moves between a first position and a second position corresponding to the indicator drive assembly first drive member 72 first and second positions which, in turn, correspond to the CBA second contact assembly 24 first and second positions. In this embodiment, the user display assembly 100 also stops at a wipe position corresponding to the wipe position of the CBA second contact assembly 24 and associated elements. Accordingly, and similar to the use of the user display assembly 100 described above, the user may mark the user display assembly gauge indicia 106, e.g., a green line (not shown), extending laterally across the user display assembly first link member assembly body second end 112, when the user display assembly 100 is in the wipe position and when the CBA first and second contact assembly contact members 29, 37 are new.

The user then actuates the wipe assembly release assembly 136. This causes the wipe assembly movable member 134 to move from its first position to its second position which, in turn, causes the wipe assembly movable member body second end 154 to disengage from the indicator drive assembly first wedge engagement surface 94. Once the wipe assembly 130 disengages from the indicator drive assembly first wedge 90, the indicator drive assembly biasing device 78 biases the indicator drive assembly first drive member 72 toward the front panel 12. The motion of the indicator drive assembly first drive member 72 is arrested by the engagement between the contact interface assembly roller 54 with the indicator drive assembly first wedge 90. Accordingly, now the CBA second contact assembly 24 is in its second position and the indicator drive assembly first drive member 72 is in its second position. At this point the user makes another mark on the user display assembly gauge indicia 106, e.g., a red line (not shown), extending laterally across the user display assembly first link member assembly body second end 112. The difference between the green line and the red line corresponds to the wipe distance.

Figure 11:
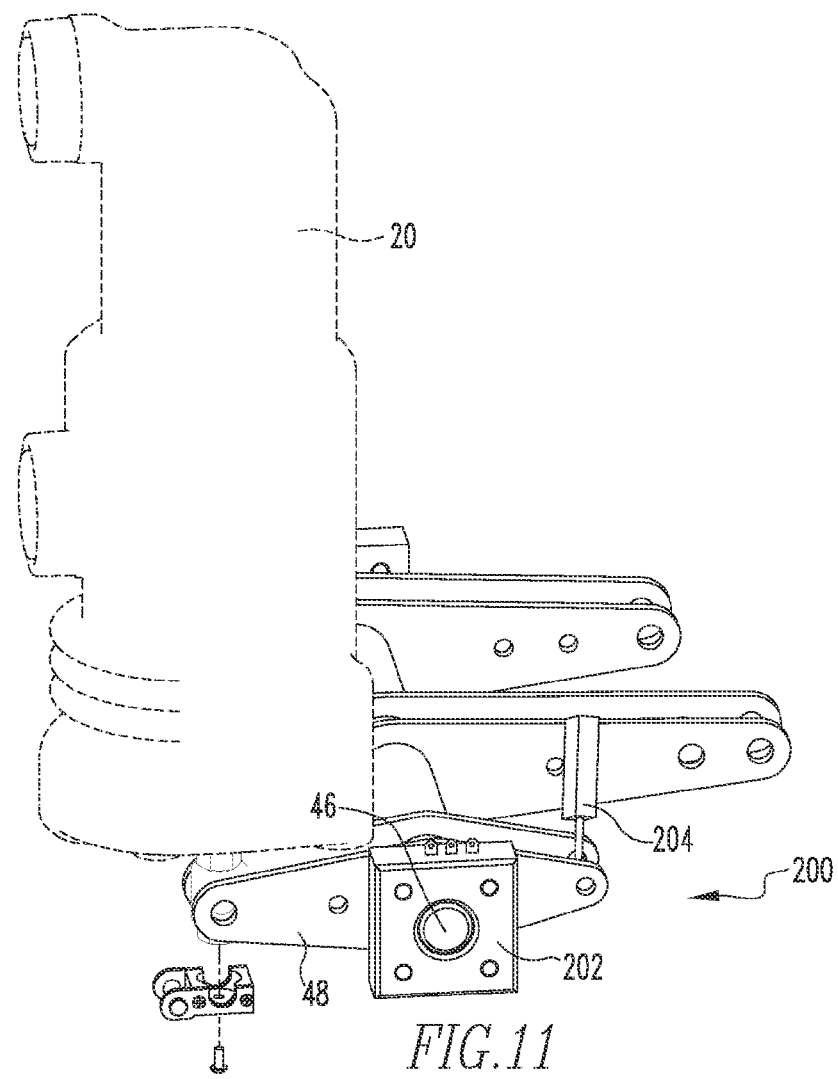
FIG. 11 is a detail isometric view of another embodiment.

As the CBA contact assemblies 22, 24 wear, the position of the user display assembly 100 in the wipe position moves closer to the position of the user display assembly 100 in the second position. That is, as the CBA contact assemblies 22, 24 wear, the position of the CBA second contact assembly insulator 31 in the second position moves up (as shown in the Figures), thus the wipe assembly movable member body second end 154 does not engage the indicator drive assembly first wedge engagement surface 94 until the indicator drive assembly first drive member 72 is closer to the front panel 12. When the location of the user display assembly 100 in the wipe position is a selected, predetermined distance from the location of the user display assembly 100 in the second position, the CBA contact assemblies 22, 24 are replaced. In another exemplary embodiment, shown in FIG. 11, the contact wear indicator assembly 50, i.e., one of the contact interface assembly 60 or the indicator drive assembly 70, or wipe assembly 130, includes an electromechanical sensor assembly or electrical sensor assembly, hereinafter collectively "sensor assembly 200," structured to detect, measure, and produce a signal representative of, a measurable characteristic along with the auxiliary or secondary contacts of the circuit breaker 10. In this embodiment, the user display assembly output device 102 includes, but is not limited to, a digital output device, a monitor, or an LCD screen (none shown). The user display assembly output device 102 further includes a controller device (not shown) such as, but not limited to, a programmable logic circuit structured to receive the sensor assembly 200 signal and to produce a visual output, i.e., display data, representative of the sensor assembly 200 signal. That is, the user display assembly 100 is structured to receive the sensor assembly 200 signal and to display data representative of the sensor assembly 200 signal.

In an exemplary embodiment, the sensor assembly 200 is coupled, operatively coupled, directly coupled, or fixed to one of the contact interface assembly 60 or the indicator drive assembly 70. In one embodiment, the sensor assembly 200 is coupled, operatively coupled, directly coupled, or fixed to interface assembly mounting assembly 52. For example, the sensor assembly 200 is, in one embodiment, a number of strain gauges (not shown) structured to measure the force, or displacement, applied to the CBA second contact assembly 24 in the second position.

In another exemplary embodiment, the sensor assembly 200 is coupled, operatively coupled, directly coupled, or fixed to the pole shaft 46 (in this embodiment, the pole shaft 46 is considered part of the indicator drive assembly 70). For example, the sensor assembly 200 is one of an angular measurement sensor assembly 202 coupled to the pole shaft 46, or, a linear transducer 204 coupled to at least one pole shaft crank member 48. In either of these configurations, the sensor assembly 200 is structured to measure the change in the orientation of the pole shaft 46. This measurement is used to calculate the CBA second contact assembly 24 stroke. Further, as noted above, the CBA second contact assembly 24 stroke for a new second contact assembly contact body 30 can be calculated based upon known dimensions. The user display assembly output device controller device (not shown) can be programmed with data indicating when the first and second CBA contact assemblies 22, 24 are worn to the point of needing to be replaced. That is, the display assembly output device controller device can identify when a stroke length is too long and indicates that one or both first and second CBA contact assemblies 22, 24 are worn to the point of needing to be replaced. When the angular measurement sensor assembly 202 provides a signal indication that the stroke length has reached such a point, the user display assembly output device 102 is structured to provide a warning such as, but not limited to, a warning light.

Figure 12:
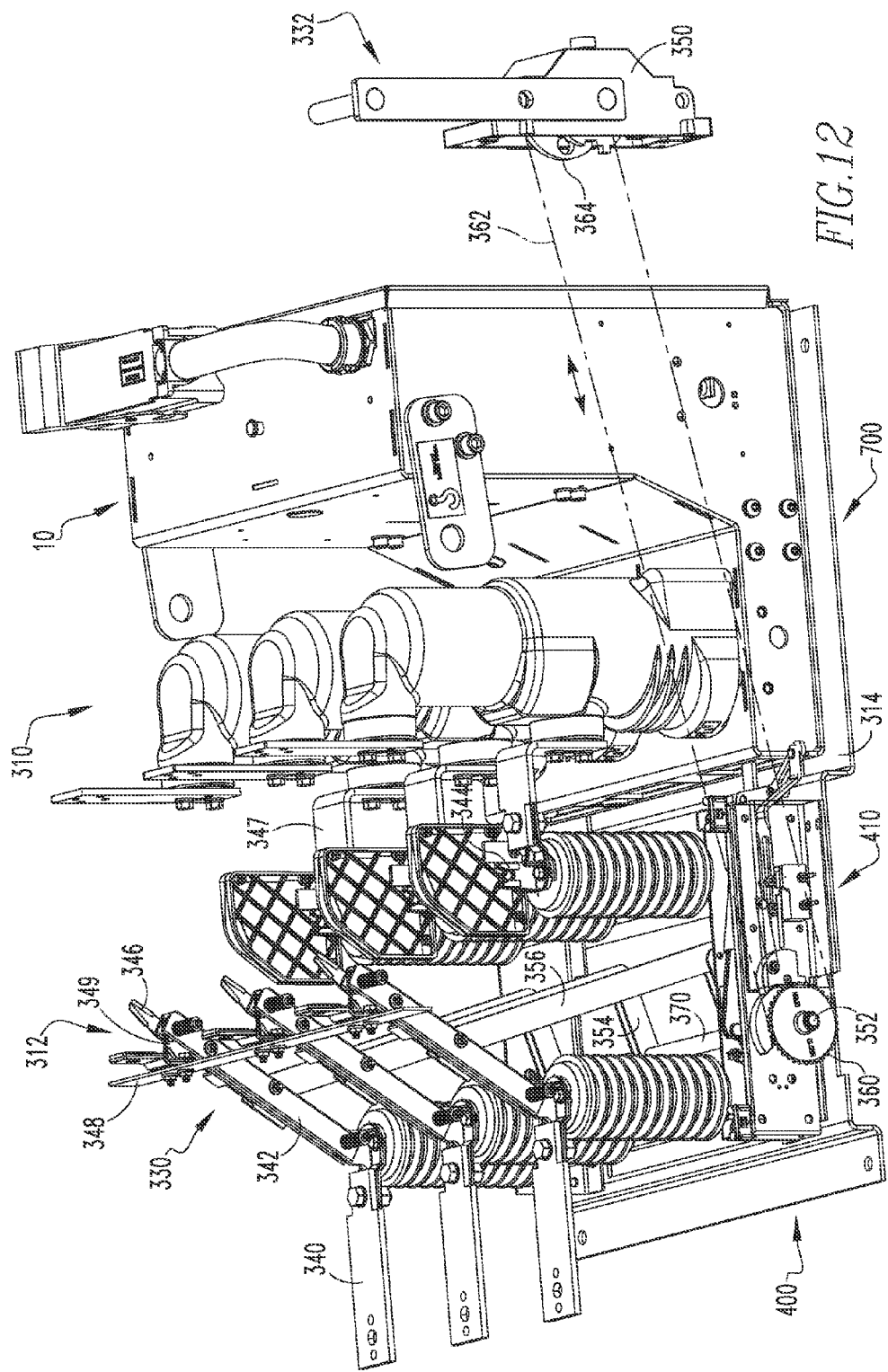
FIG. 12 is a rear isometric partial view of a VDS circuit breaker.

In another exemplary embodiment, shown in FIG. 12, the circuit breaker assembly 10 includes a visible disconnect switch 312 (also hereinafter "VDS," further any element associated with the VDS may be preceded by the term VDS). A CBA 10 with a VDS 312 is identified as a VDS circuit breaker assembly 310. A visible disconnect switch 312 is structured to electrically couple/decouple the circuit breaker assembly 10 to/from the line or load (neither shown). The visible disconnect switch 312 is an assembly. In an exemplary embodiment, the visible disconnect switch 312 includes a frame assembly 314, a number of contact assemblies 330 and an activating assembly 332. As is known, there is a VDS contact assembly 330 for each pole of the circuit breaker assembly 10 (three as shown). The following description describes a single VDS contact assembly 330, but it is understood that the visible disconnect switch 312 may include more than a single VDS contact assembly 330.

In an exemplary embodiment, the VDS contact assembly 330 includes a conductor member 340, a movable contact arm 342, a fixed, first contact assembly 344, a movable, second contact assembly 346 and a CBA conductor 347. The VDS conductor member 340 is coupled to, directly coupled to, or fixed to, and in electrical communication with, either the line or load (neither shown). The VDS contact assembly first contact assembly 344 is coupled to, directly coupled to, or fixed to, and in electrical communication with, the CBA upper terminal 13 or CBA lower terminal 15. The VDS contact assembly second contact assembly 346 is coupled to, directly coupled to, or fixed to, and in electrical communication with, the VDS contact assembly movable contact arm 342. The VDS contact assembly movable contact arm 342 is movable or rotatably coupled to, and in electrical communication with, the VDS contact assembly conductor member 340. In this configuration, the VDS contact assembly second contact assembly 346 is structured to move, and is movable, between a first position, wherein the VDS contact assembly second contact assembly 346 is spaced from, and not in electrical communication with, the VDS contact assembly first contact assembly 344, and a second position, wherein the VDS contact assembly second contact assembly 346 is coupled to, and in electrical communication with, the VDS contact assembly first contact assembly 344. Each CBA conductor 347 is coupled, directly coupled, or fixed to, and is in electrical communication with, either an upper terminal 13 or a lower terminal 15. Each CBA conductor 347 is further coupled, directly coupled, or fixed to, a contact assembly first contact assembly 344.

The VDS activating assembly 332 is an operating mechanism structured to move the VDS contact assembly movable contact arm(s) 342, and therefore the VDS contact assembly second contact assemblies 346, between the first and second positions. In an exemplary embodiment, the VDS activating assembly 332 includes a drive assembly 350, a drive shaft 352, a number of crank members 354, and a number of lift members 356. The VDS activating assembly drive assembly 350 is structured to rotate the VDS activating assembly drive shaft 352. As shown, and in an exemplary embodiment, the VDS activating assembly drive assembly 350 includes a sprocket 360, a drive chain 362, and a winding assembly 364. The VDS activating assembly drive assembly sprocket 360 is fixed to the VDS activating assembly drive shaft 352. The VDS activating assembly drive shaft 352 includes an elongated body 370 structured to rotate about the longitudinal axis. The VDS activating assembly drive shaft 352 is rotatably coupled to the VDS frame assembly 314. The VDS activating assembly winding assembly 364 is structured to provide motion to the VDS activating assembly drive chain 362. In an exemplary embodiment, the VDS activating assembly winding assembly 364 is disposed adjacent to the CBA front panel 12. It is noted that the VDS activating assembly winding assembly 364 may be disposed at other locations as needed by the user. The VDS activating assembly drive chain 362 operatively engages the VDS activating assembly drive assembly sprocket 360. Thus, motion from the VDS activating assembly drive chain 362 causes the VDS activating assembly drive assembly sprocket 360, and the VDS activating assembly drive shaft 352 to which the VDS activating assembly drive assembly sprocket 360 is fixed, to rotate. That is, the VDS activating assembly drive assembly winding assembly 364 is operatively coupled to said VDS activating assembly drive shaft 352.

The VDS activating assembly crank members 354 are fixed to the VDS activating assembly drive shaft 352 and extend generally radially therefrom. As shown, and in an exemplary embodiment, there is one VDS activating assembly crank member 354 associated with each pole of the circuit breaker assembly 10 (three as shown). Similarly, there is one VDS activating assembly lift member 356 associated with each pole of the circuit breaker assembly 10 (three as shown). Each VDS activating assembly lift member 356 is rotatably coupled to both a VDS activating assembly crank member 354 and a VDS contact assembly movable contact arm 342. In this configuration, rotation of the VDS activating assembly drive shaft 352 causes the VDS activating assembly crank members 354 to rotate. Motion of the VDS activating assembly crank members 354 cause the VDS activating assembly lift members 356 to move. This motion, in turn, causes the VDS contact assembly movable contact arms 342 to move. Thus, the VDS activating assembly 332 is structured to, and does, move between a first position (or orientation or configuration) corresponding to the VDS contact assembly movable contact arm 342 first position, and, a second position (or orientation or configuration) corresponding to the VDS contact assembly movable contact arm 342 second position.

In an exemplary embodiment, the VDS contact assembly 330 also includes a ground assembly 348. The VDS contact assembly ground assembly 348 is a conductive body structure to be, and which is, coupled to a ground (not shown). The VDS contact assembly ground assembly 348 includes a number of landing pads 349. Each VDS contact assembly ground member landing pad 349 is structured to be selectively coupled to, and in electrical communication with, a VDS contact assembly movable contact arm 342. The VDS contact assembly ground assembly 348, and the VDS contact assembly ground member landing pads 349, are coupled to the VDS frame assembly 314 (or external grounding subassembly (not shown)) and positioned so that when the VDS contact assembly second contact assemblies 346, and movable contact arms 342, are in the first position, each VDS contact assembly movable contact arm 342 is coupled to, and in electrical communication with, the VDS contact assembly ground assembly 348, and an associated VDS contact assembly ground member landing pad 349. That is, when the VDS contact assembly second contact assemblies 346, and movable contact arms 342, are in the first position, the VDS contact assembly second contact assemblies 346, and all elements in electrical communication therewith, are grounded.

Further, in this exemplary embodiment, the path of travel of the VDS contact assembly second contact assemblies 346 is limited by the VDS contact assembly first contact assembly 344 and the VDS contact assembly ground assembly 348. That is, as shown, the VDS contact assembly second contact assemblies 346 travel over an arc of between about 0 and 45 degrees, or about 30 degrees. Further, in this configuration, the rotation of the VDS activating assembly drive shaft 352 is limited. That is, VDS activating assembly drive shaft 352 has a first orientation, associated with the VDS contact assembly second contact assemblies 346 first position, and, a second orientation, associated with the VDS contact assembly second contact assemblies 346 second position. The VDS activating assembly drive shaft 352 rotates in a first direction, clockwise as shown in FIG. 12, when moving from the first orientation to the second orientation, and, a second direction, counterclockwise as shown in FIG. 12, when moving from the second orientation to the first orientation, In an exemplary embodiment, the visible disconnect switch 312 further includes a VDS interlock assembly 400. As shown in FIGS. 13-25, the VDS interlock assembly 400 may, in an exemplary embodiment, share components of the contact wear indicator assembly 50. As such, selected elements, such as, but not limited to, the contact interface assembly 60, discussed above, may also be described as part of the VDS interlock assembly 400. Alternatively, an element of the contact wear indicator assembly 50, such as but not limited to the indicator drive assembly first drive member 72, may be renamed, e.g., the interlock drive assembly first drive member 420, as discussed below. That is, as used herein, and as would be understood by those of skill in the art, the indicator drive assembly first drive member 72 and the interlock drive assembly first drive member 420 are the same element and that element may be identified by either name.

In an exemplary embodiment, the VDS interlock assembly 400 is structured to ensure that the CBA second contact assemblies 24, as well as the elements that move therewith, are not moved when the VDS contact assembly second contact assemblies 346 are in the first position. Further, the VDS interlock assembly 400 is structured to ensure that the VDS contact assembly second contact assemblies 346 are not moved when the CBA second contact assemblies 24 are in the second position, Stated alternately, the VDS interlock assembly 400 is structured to ensure that the CBA second contact assemblies 24 can only move when the VDS contact assembly second contact assemblies 346 are in the second position, and, the VDS contact assembly second contact assemblies 346 can only move when the CBA second contact assemblies 24 are in the first position.

In an exemplary embodiment, the contact interface assembly 60 is substantially as described above. That is, the contact interface assembly 60 is coupled, directly coupled, or fixed to the CBA second contact assembly 24 whereby the contact interface assembly 60 moves with the CBA second contact assembly 24 between a first position and a second position. Further, the contact interface assembly 60 includes a roller 54 as described above.

The VDS interlock assembly 400 also includes an cam assembly 409, a mechanical control system interlock assembly interface assembly 412 (hereinafter "mechanical control system interlock interface assembly" 412), and an interlock drive assembly 414. In an exemplary embodiment, the cam assembly 409 is an interlock cam assembly 410. The interlock cam assembly 410 is operatively coupled to the VDS activating assembly 332. That is, the interlock cam assembly 410 is structured to move between a first configuration, wherein the VDS activating assembly 332 is free to move between its first and second positions, and a second configuration, wherein the VDS activating assembly 332 is not free to move between its first and second positions. The mechanical control system interlock interface assembly 412 is operatively coupled to said CBA mechanical control system interlock assembly 38. That is, the mechanical control system interlock interface assembly 412 is structured to move between a first position, wherein the CBA mechanical control system interlock assembly 38 is in its second configuration, and a second position, wherein the CBA mechanical control system interlock assembly 38 is in its first configuration. Thus, when the mechanical control system interlock interface assembly 412 is in its first position, and the CBA mechanical control system interlock assembly 38 is in its second configuration, the mechanical control system actuating assembly 36 is not free to actuate operating mechanism 14, as described above. Further, when the mechanical control system interlock interface assembly 412 is in its second position, and the CBA mechanical control system interlock assembly 38 is in its first configuration, the mechanical control system actuating assembly 36 is free to actuate the operating mechanism 14, as described above.

The interlock cam assembly 410 and the mechanical control system interlock interface assembly 412 are operatively coupled by the interlock drive assembly 414. The interlock drive assembly 414 is similar to, and uses some of the same elements as the indicator drive assembly 70, described above. That is, the interlock drive assembly 414 utilizes a first drive member 420 which, in one exemplary embodiment, is similar to the indicator drive assembly first drive member 72. Accordingly, in this embodiment, the indicator drive assembly first drive member 72, is hereinafter renamed as "the interlock drive assembly first drive member 420." That is, in this exemplary embodiment, the interlock drive assembly first drive member 420, which may simultaneously be used as part of the contact wear indicator assembly 50, is used to operatively couple the elements of the VDS interlock assembly 400. As shown in FIG. 25, a VDS circuit breaker assembly 310 may include both a contact wear indicator assembly 50 and a VDS interlock assembly 400 that share this element 72, 420.

Figure 13:
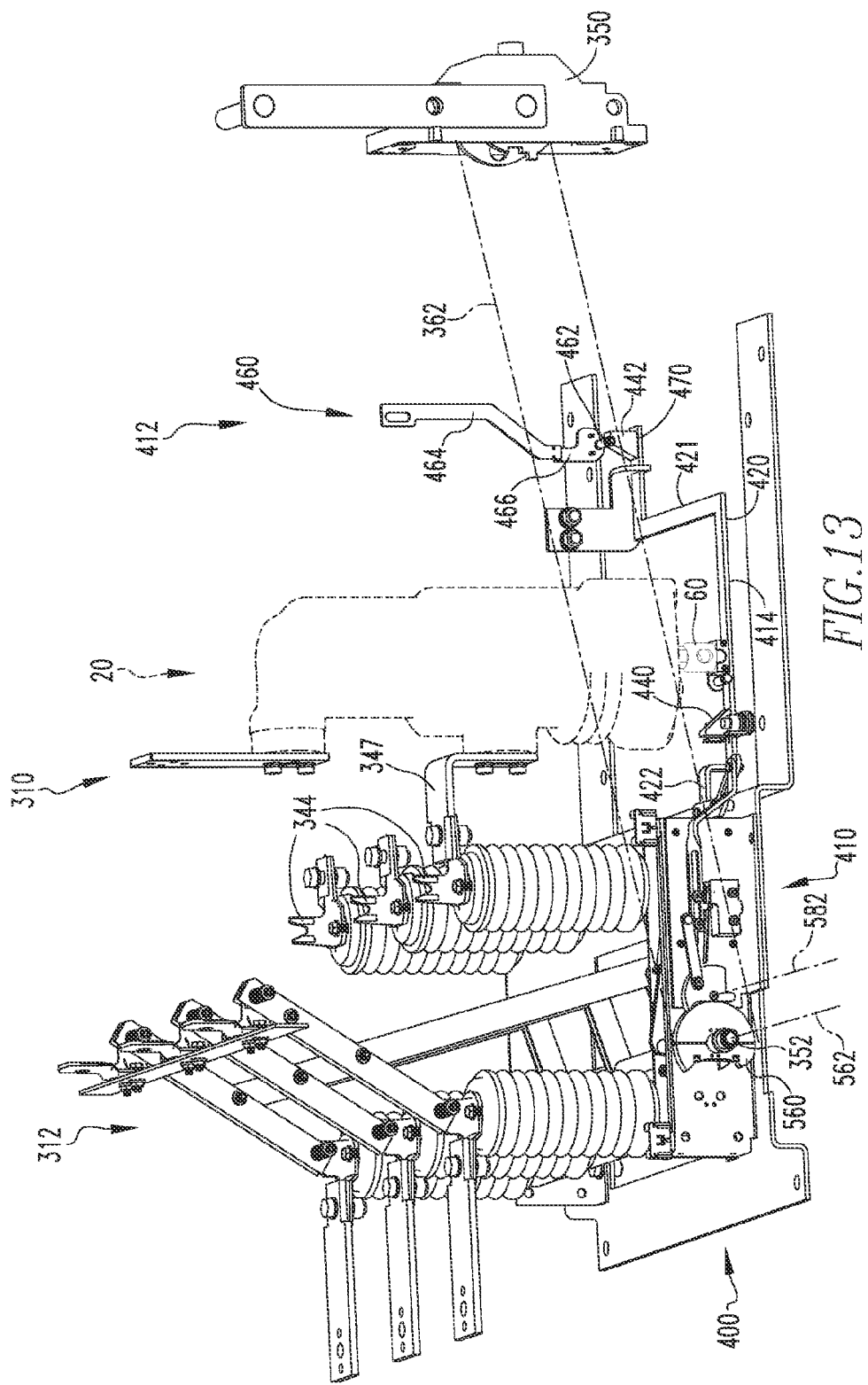
FIG. 13 is an isometric view of a VDS circuit breaker with an interlock assembly in the first position (CBA in OPEN position, VDS in OPEN position)

As shown in FIG. 13, and in an exemplary embodiment, the interlock drive assembly first drive member 420 includes a generally planar body 421. The interlock drive assembly first drive member body 421 includes a first end 422, a support portion 424 and a second end 426. In this embodiment, the interlock drive assembly first drive member body support portion 424 is disposed adjacent the contact interface assembly 60 (in a manner similar to the indicator drive assembly first drive member body first end 82 is disposed adjacent the contact interface assembly 60, as described above).

The interlock drive assembly 414, i.e., the interlock drive assembly first drive member 420, is structured to, and does, move between three positions wherein each position is associated with a specific configuration of the interlock cam assembly 410 and the mechanical control system interlock interface assembly 412. That is, the interlock drive assembly 414 (i.e., the interlock drive assembly first drive member body 421), moves between a CBA, first lockout position, an open position, and a VDS, second lockout position.

In the CBA, first lockout position, the interlock cam assembly 410 is in its first configuration and the mechanical control system interlock interface assembly 412 is in its second position. Generally, in the CBA, first lockout position, the VDS contact assembly second contact assembly 346 is in the open, first position but is free to move, and the CBA second contact assembly 24 is locked in the first position. That is, when the interlock drive assembly 414 is in the CBA, first lockout position, the VDS activating assembly 332 is free to move between its first and second positions (i.e., the VDS contact assembly second contact assembly 346 is free to move between its first and second positions), but the CBA mechanical control system interlock assembly 38 is in the "locked" configuration and the CBA second contact assembly 24 is in the "open" position as described above. Further, when the interlock drive assembly 414 is in the CBA, first lockout position, the VDS contact assembly second contact assembly 346 is in the open, first position. As detailed below, when the VDS contact assembly second contact assembly 346 moves to the second position, the interlock drive assembly 414 moves to the open position.

When the interlock drive assembly 414 is in the open position, the interlock cam assembly 410 is in its first configuration and the mechanical control system interlock interface assembly 412 is in its second position. Generally, when the interlock drive assembly 414 is in the open position, one of the VDS activating assembly 332 or the operating mechanism 14 may be actuated. That is, as described above, the "closed" VDS contact assembly second contact assembly 346 can be moved back to its first position (and thereby move the interlock drive assembly 414 back to the CBA, first lockout position), or, the "open" CBA second contact assembly 24 may be moved to the closed, second position.

Alternatively, the CBA second contact assembly 24 may be moved to the closed, second position. As noted above, when the CBA mechanical control system interlock assembly 38 is in the locked, first position, the CBA second contact assembly 24 is in the "open" position. When the interlock drive assembly 414 moves to the open position, the mechanical control system interlock interface assembly 412 moves to its second position. When the mechanical control system interlock interface assembly 412 is in its second position, the CBA mechanical control system interlock assembly 38 is in its first configuration and the mechanical control system actuating assembly 36 is free to actuate operating mechanism 14, as described above. Further, as the CBA second contact assembly 24 moves to the closed, second position, the interlock drive assembly 414 moves to the VDS, second lockout position.

When the interlock drive assembly 414 is in the VDS, second lockout position, the interlock cam assembly 410 is in its second configuration and the mechanical control system interlock interface assembly 412 is in its first position. Generally, when the interlock drive assembly 414 is in the VDS, second lockout position, the VDS contact assembly second contact assembly 346 is locked in the closed, second position, and the CBA second contact assembly 24 can be moved from the closed, second position to the open, first position. That is, just as above, when the mechanical control system interlock interface assembly 412 is in its first position, the CBA mechanical control system interlock assembly 38 is in its first configuration and the mechanical control system actuating assembly 36 is free to actuate operating mechanism 14, as described above.

Thus, as the interlock drive assembly 414 moves between the three positions, the VDS interlock assembly 400 moves between three configurations. The VDS interlock assembly 400 three configurations shall use the same names as the interlock drive assembly 414 three positions. Generally, in the CBA, first lockout position, the VDS contact assembly second contact assembly 346 is in the open, second position but is free to move to the closed, first position; conversely, the CBA second contact assembly 24 is locked in the first position. When the VDS contact assembly second contact assembly 346 moves to the closed, first position, the VDS interlock assembly 400, and the interlock drive assembly 414, move to the open position. Generally, when the interlock drive assembly 414 is in the open position, either the "closed" VDS contact assembly second contact assembly 346 can be moved back to its first position (and thereby move the interlock drive assembly 414 back to the CBA, first lockout position), or, the "open" CBA second contact assembly 24 may be moved to the closed, second position (and thereby move the interlock drive assembly 414 to the VDS, second lockout position). Generally, when the interlock drive assembly 414 is in the VDS, second lockout position, the VDS contact assembly second contact assembly 346 is locked in the closed, second position, and the CBA second contact assembly 24 can be moved from the closed, second position to the open, first position. When the CBA second contact assembly 24 moves from the closed, second position to the open, first position the VDS interlock assembly 400, and the interlock drive assembly 414, move to the open position.

In summary, from the VDS interlock assembly 400 open position, either the closed VDS contact assembly second contact assembly 346 can be opened, or, the open CBA second contact assembly 24 can be closed. In the VDS interlock assembly 400 CBA, first lockout position, the VDS contact assembly second contact assembly 346 is open, but free to move, and the CBA second contact assembly 24 is locked in the open position. Finally, in the VDS interlock assembly 400 VDS, second lockout position, the VDS contact assembly second contact assembly 346 is locked in the closed position, and the CBA second contact assembly 24 can be moved from the closed, second position to the open, first position.

Accordingly, the interlock drive assembly 414, as well as the interlock drive assembly first drive member 420, is movable between a CBA, first lockout position, wherein the interlock cam assembly 410 is in its first configuration and the mechanical control system interlock interface assembly 412 is in its second position, an open position, wherein the interlock cam assembly 410 is in its first configuration and the mechanical control system interlock interface assembly 412 is in its first position, and a VDS, second lockout position, wherein the interlock cam assembly 410 is in its second configuration and the mechanical control system interlock interface assembly 412 is in its first position. Further, just as with the indicator drive assembly first drive member 72, described above, the interlock drive assembly first drive member 420 is structured to, and does, translate between the first, open, and second positions. That is, the VDS interlock assembly 400 includes guide assemblies (not shown), such as but not limited to brackets with slots corresponding to the interlock drive assembly first drive member body 421 (not shown), that substantially limit rotation of the interlock drive assembly first drive member body 421.

Further, and again in a configuration similar to the contact wear indicator assembly 50 described above, the interlock drive assembly 414 includes a first displacement device 440, a second displacement device 442, and a biasing device 444. The interlock drive assembly first displacement device 440 is coupled, directly coupled, or fixed to the interlock drive assembly first drive member body support portion 424. In an exemplary embodiment, the interlock drive assembly first displacement device 440 is a first wedge 450 (hereinafter, "interlock drive assembly first wedge" 450) with an engagement surface 452. The interlock drive assembly first wedge 450 is substantially similar, and interacts with the contact interface assembly roller 54 engaging the indicator drive assembly first wedge engagement surface 94, in a manner that is substantially similar to the indicator drive assembly first displacement device 74 described above. Accordingly, the description above relating to the indicator drive assembly first displacement device 74 is equally applicable to the interlock drive assembly first displacement device 440 and is incorporated by reference.

Further, the interlock drive assembly biasing device 444 is substantially similar to, and acts in a similar manner as, the indicator drive assembly biasing device 78. The notable difference being that, in the exemplary embodiment shown, the interlock drive assembly biasing device 444 is coupled to the interlock drive assembly first drive member body support portion 424. Otherwise, the description regarding the indicator drive assembly biasing device 78 is equally applicable to the interlock drive assembly biasing device 444 and is incorporated by reference.

Figure 14:
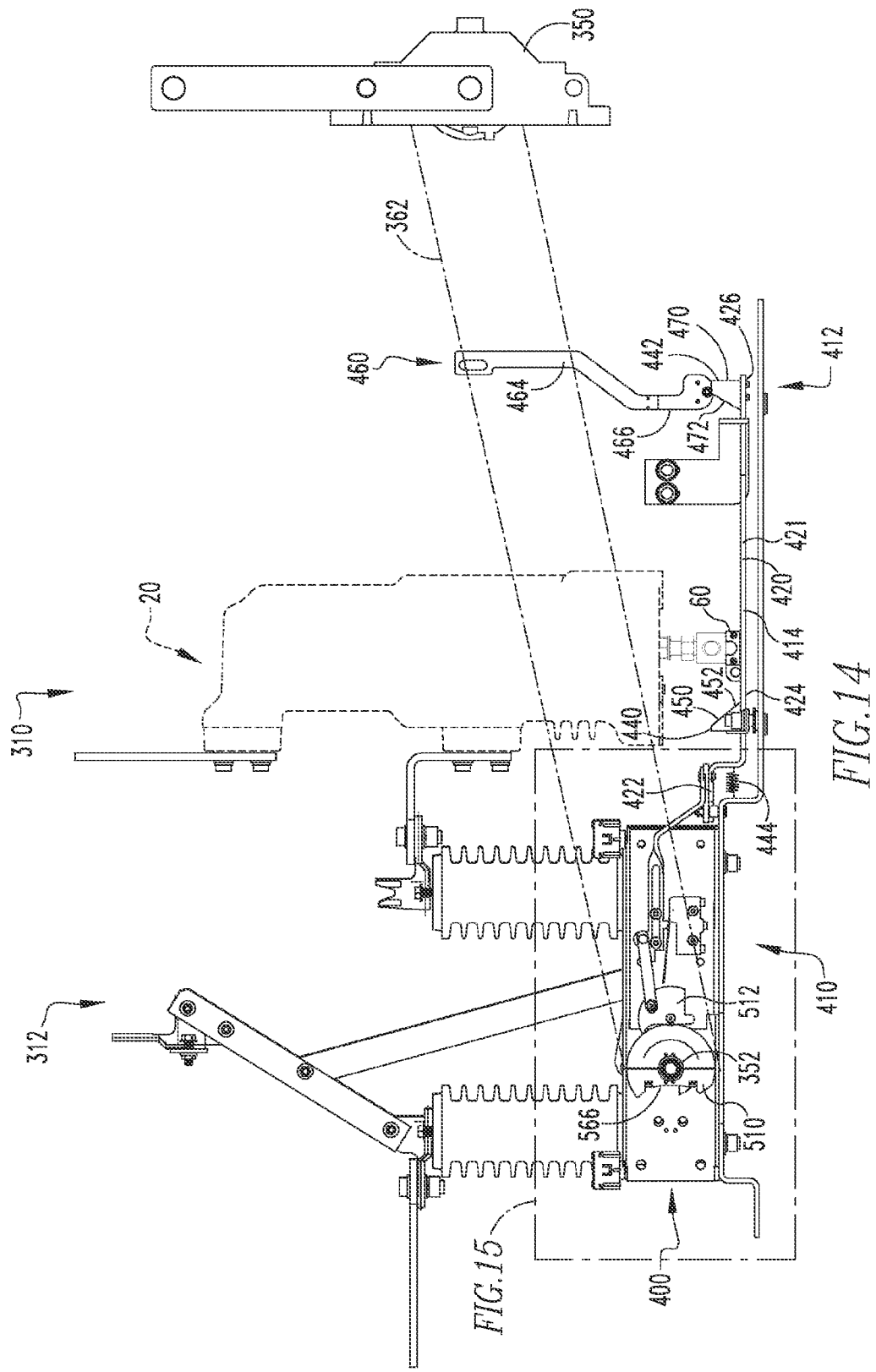
FIG. 14 is a side view of a VDS circuit breaker with an interlock assembly in the first position (CBA in OPEN position, VDS in OPEN position)

In an exemplary embodiment, the mechanical control system interlock interface assembly 412 includes a linkage assembly 460 and a roller 462. The mechanical control system interlock interface assembly linkage assembly 460 is structured to engage, and actuate, the CBA mechanical control system interlock assembly 38, described above. As shown in FIG. 14, and in an exemplary embodiment, the mechanical control system interlock interface assembly linkage assembly 460 includes an elongated body 464 with a yoke 466 disposed at one end. The mechanical control system interlock interface assembly roller 462 is rotatably coupled to the mechanical control system interlock interface assembly linkage assembly body 464 and, as shown, to the mechanical control system interlock interface assembly linkage assembly body yoke 466.

The mechanical control system interlock interface assembly linkage assembly body 464 is movably coupled to the circuit breaker assembly 10 and positioned to engage the CBA mechanical control system interlock assembly 38. Further, the mechanical control system interlock interface assembly roller 462 is disposed adjacent to, and in an exemplary embodiment, generally vertically over the interlock drive assembly first drive member body second end 426.

In an exemplary embodiment, the interlock drive assembly second displacement device 442 is a second wedge 470 (hereinafter, interlock drive assembly second wedge 470). The interlock drive assembly second wedge 470 has an engagement surface 472. The interlock drive assembly second displacement device 442 is coupled, directly coupled or fixed, to the interlock drive assembly first drive member body second end 426. That is, the interlock drive assembly first drive member body second end 426 is disposed adjacent to the CBA mechanical control system interlock assembly 38 and generally vertically below the mechanical control system interlock interface assembly roller 462. Unlike the indicator drive assembly second wedge engagement surface 96, described above, the interlock drive assembly second wedge engagement surface 472 faces substantially the opposite direction compared to the interlock drive assembly first wedge engagement surface 452. That is, as shown, the interlock drive assembly first wedge engagement surface 452 generally faces toward the front panel 12. Conversely, the interlock drive assembly second wedge engagement surface 472 generally faces away from the front panel 12. In this configuration, the mechanical control system interlock interface assembly linkage assembly body 464 is structured to move between a first position, wherein the CBA mechanical control system interlock assembly 38 is in its second configuration, and a second position, wherein the CBA mechanical control system interlock assembly 38 is in its first configuration.

It is noted, however, that the forces created by the operating mechanism 14 on the CBA second contact assembly 24 are much greater than the bias created by interlock drive assembly biasing device 444. Thus, the biasing force of the interlock drive assembly first wedge 450 against the contact interface assembly roller 54 has a negligible effect on the position of the CBA second contact assembly 24 and the contact interface assembly 60. Conversely, the weight of, and the forces acting on, the mechanical control system interlock interface assembly 412 are less than the bias created by interlock drive assembly biasing device 444. Thus, as the interlock drive assembly second wedge engagement surface 472 operatively engages the mechanical control system interlock interface assembly linkage assembly roller 462, the mechanical control system interlock interface assembly linkage assembly body 464 may move.

In an exemplary embodiment, as shown in FIGS. 15, 18, 21-23, the interlock cam assembly 410 includes a frame member 500, a first cam member 510, a second cam member 512, a link assembly 514, and an electronic interlock device 516. As shown, the interlock cam assembly link assembly 514 includes a first link member 520, a second link member 522, and a third link member 524 (shown best in FIG. 23), hereinafter "interlock cam assembly first link member" 520, "interlock cam assembly second link member" 522, and "interlock cam assembly third link member" 524.

In an exemplary embodiment, the interlock cam assembly frame member 500 includes a generally planar body 530 with a drive shaft opening 532 and a number of generally perpendicular guide pins 534. That is, the interlock cam assembly frame member guide pins 534 extend generally normal to the plane of the interlock cam assembly frame member body 530.

Figure 15:
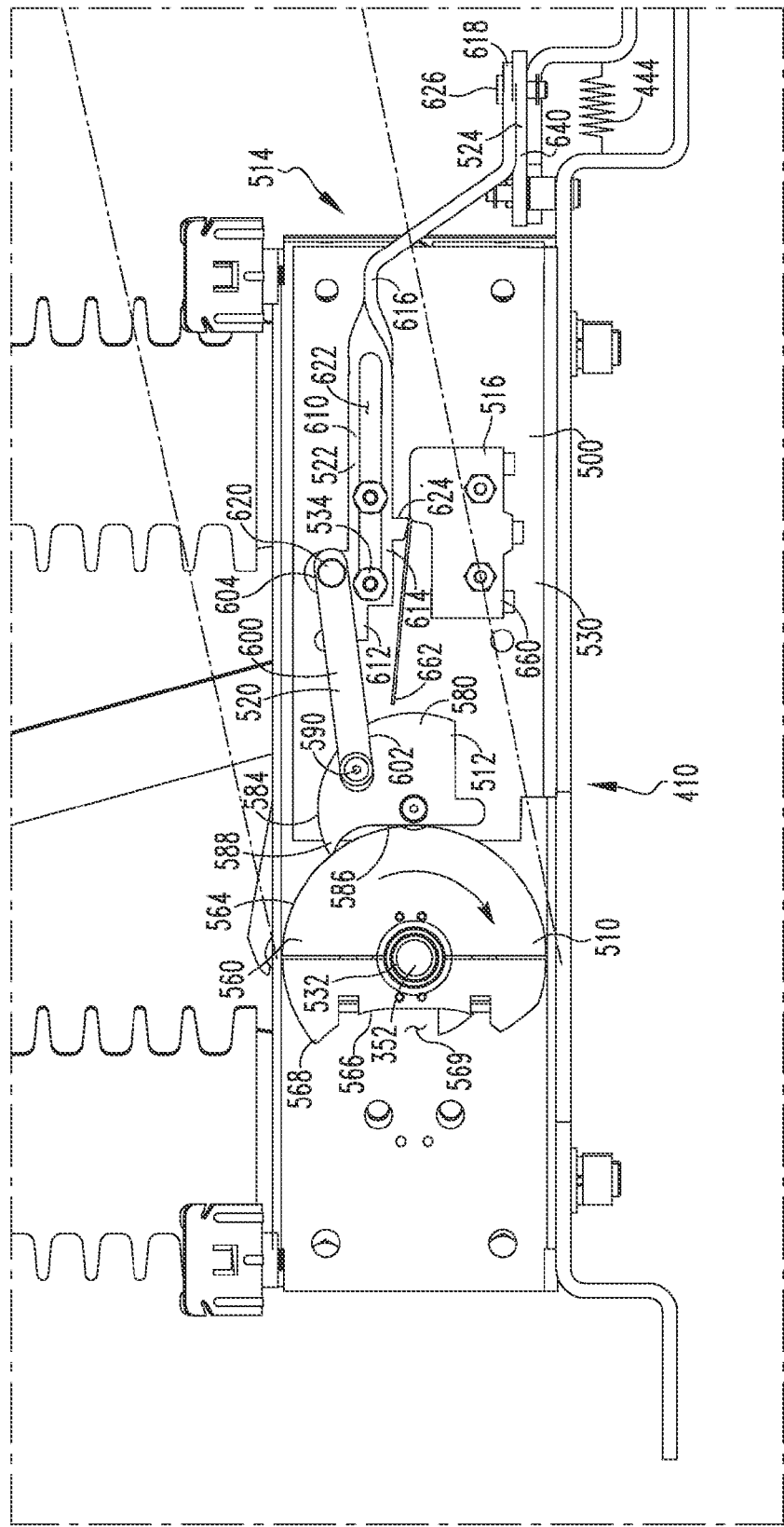
FIG. 15 is a detail view of a VDS circuit breaker with an interlock assembly cam assembly in the first position (CBA in OPEN position, VDS in OPEN position).
Figure 16:
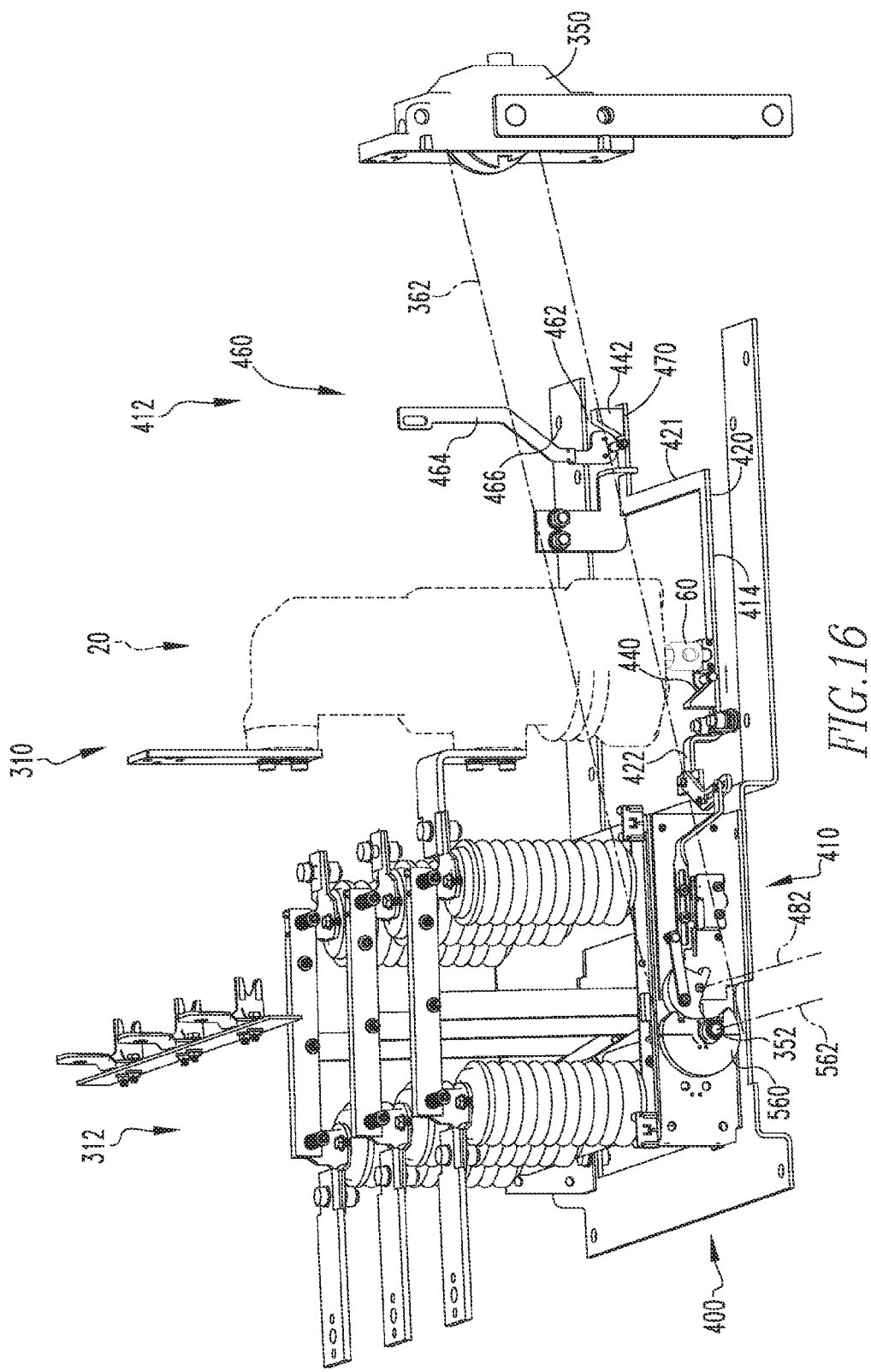
FIG. 16 is an isometric view of a VDS circuit breaker with an interlock assembly (CBA in OPEN position, VDS in CLOSE position).
Figure 17:
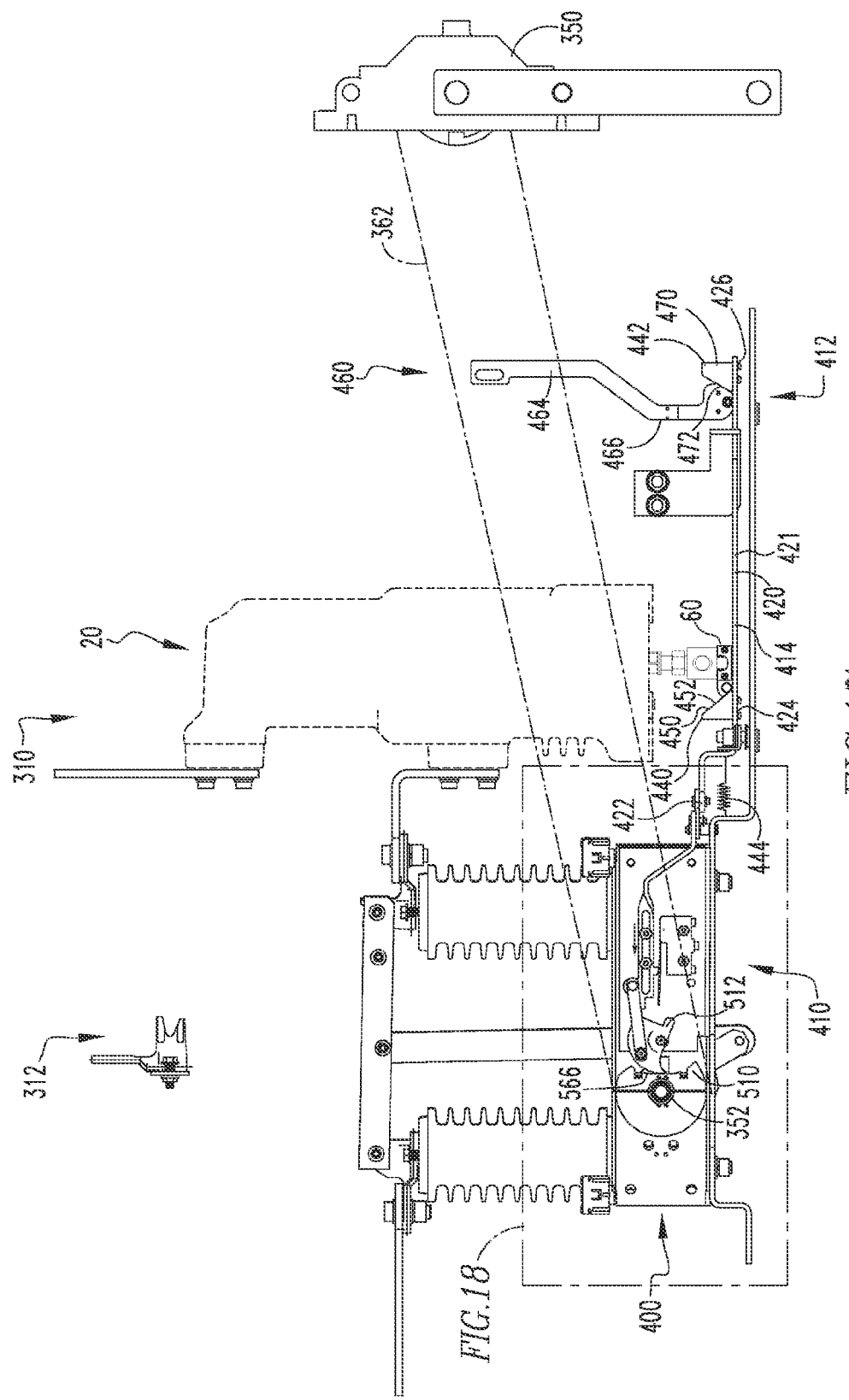
FIG. 17 is a side view of a VDS circuit breaker with an interlock assembly in the open position (CBA in OPEN position, VDS in CLOSE position).
Figure 18:
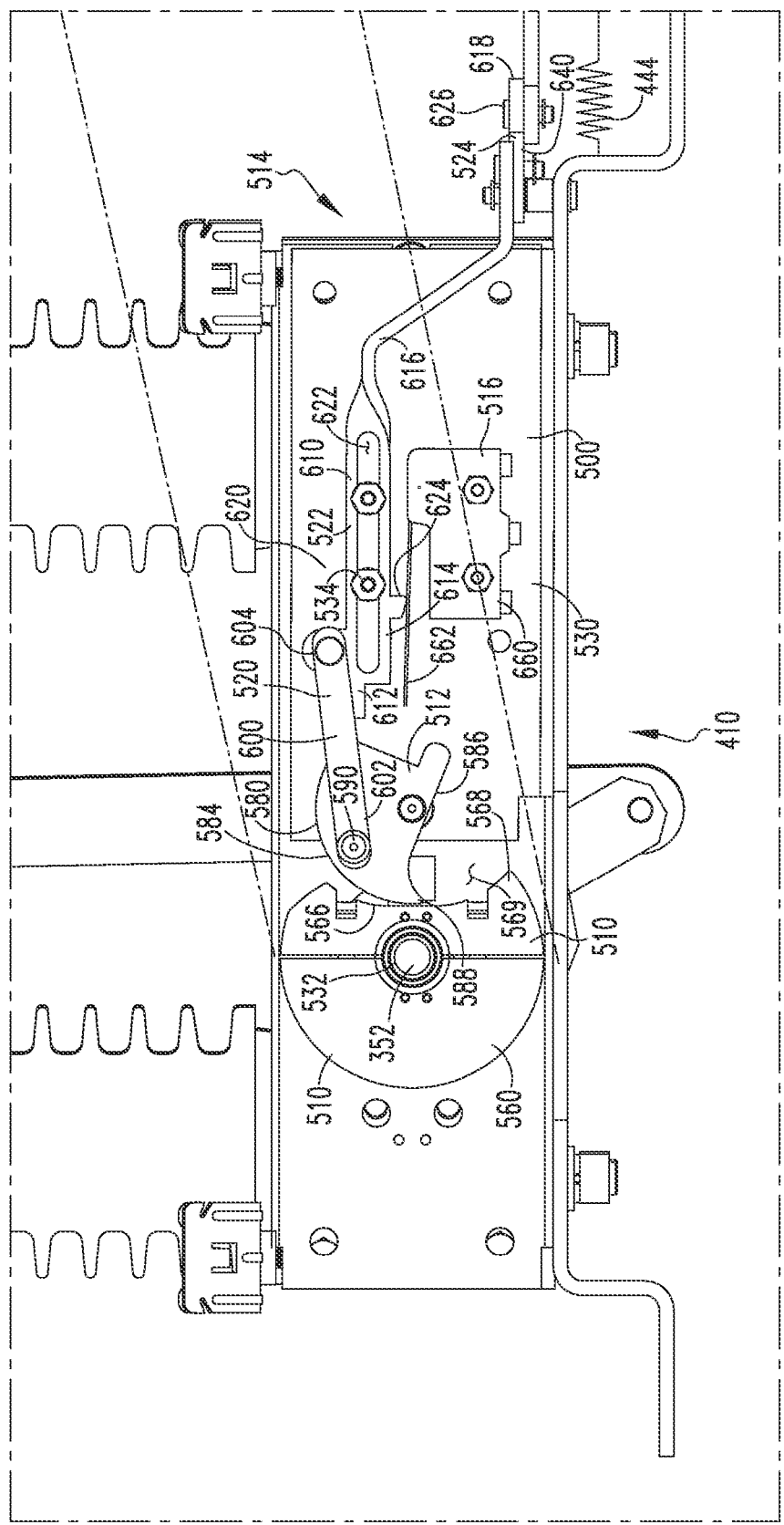
FIG. 18 is a detail view of a VDS circuit breaker with an interlock assembly cam assembly (CBA in OPEN position, VDS in CLOSE position).

In an exemplary embodiment as in FIG. 15, the interlock cam assembly first cam member 510 includes a generally planar body 560 having an axis of rotation 562, a radial, arcuate cam surface 564, a radial locking surface 566, and a follower projection 568. As used herein, a "radial surface" on a body with an axis of rotation is a surface that extends generally parallel to the axis of rotation. The interlock cam assembly first cam member body arcuate cam surface 564 is a generally circular arc with the interlock cam assembly first cam member body axis of rotation 562 at the center. Generally, the radius of interlock cam assembly first cam member body radial locking surface 566 is equal to or greater than the radius of second cam member 512 (at radial blocking surface 584, described below) such that the interlock cam assembly first cam member 510 can be locked by second cam member 512 as required. As shown, the interlock cam assembly first cam member body radial locking surface 566 is generally a curvilinear surface (which is not a circular arc) that curves in a direction very generally corresponding to the interlock cam assembly first cam member body arcuate cam surface 564. In this configuration, the distance between the interlock cam assembly first cam member body axis of rotation 562 and the interlock cam assembly first cam member body arcuate cam surface 564 is greater than the distance between the interlock cam assembly first cam member body axis of rotation 562 and the interlock cam assembly first cam member body radial locking surface 566. Thus, there is less of the interlock cam assembly first cam member body 560 on one side of the interlock cam assembly first cam member body axis of rotation 562. Stated alternately, and as used herein, there is an interlock cam assembly first cam member body "pocket" 569 adjacent the interlock cam assembly first cam member body radial locking surface 566. That is, the absence of the interlock cam assembly first cam member body 560 whereby the interlock cam assembly first cam member body arcuate cam surface 564 is closer to the interlock cam assembly first cam member body axis of rotation 562 defines the "pocket" 569.

The interlock cam assembly first cam member body follower projection 568 is disposed at the interface between the interlock cam assembly first cam member body arcuate cam surface 564 and the interlock cam assembly first cam member body radial locking surface 566. The interlock cam assembly first cam member body follower projection 568 is structured to operatively engage the interlock cam assembly second cam member 512. The interlock cam assembly first cam member 510 is moveable between a first position, an open position, and a blocked, second position, as described below.

The interlock cam assembly second cam member 512 includes a generally planar body 580 with an axis of rotation 582, a radial blocking surface 584, a chord cam surface 586, a cam follower 588. and a link coupling 590. The interlock cam assembly second cam member body radial blocking surface 584 is a generally circular arc with the interlock cam assembly second cam member body axis of rotation 582 at the center. The interlock cam assembly second cam member body chord cam surface 586 is a generally planar surface with a plane that extends generally parallel to the interlock cam assembly second cam member body axis of rotation 582. In an exemplary embodiment, the minimum distance between the interlock cam assembly second cam member body chord cam surface 586 and the interlock cam assembly second cam member body axis of rotation 582 is between about 0.25 and 1.0 inch, or at least half of the thickness of interlock cam assembly second cam member 512. In an exemplary embodiment, the one end of interlock cam assembly second cam member body chord cam surface 586 curves in the same general direction as the interlock cam assembly second cam member body radial blocking surface 584 thereby forming the interlock cam assembly second cam member body cam follower 588, a hatchet like shape. The interlock cam assembly second cam member body link coupling 590 is spaced from the interlock cam assembly second cam member body axis of rotation 582. In an exemplary embodiment, the interlock cam assembly second cam member body link coupling 590 is a threaded passage in the interlock cam assembly second cam member body 580 that extends generally parallel to the interlock cam assembly second cam member body axis of rotation 582. The interlock cam assembly second cam member 512 is movable between a first position, an open position, and a blocking, second position, as described below.

The interlock cam assembly first link member 520 includes an elongated body 600 with a first end 602 and a second end 604. The interlock cam assembly second link member 522 includes an elongated body 610 with a first end 612, a first portion 614, a medial portion 616, and a second end 618. The interlock cam assembly second link member body first portion 614 is disposed between the interlock cam assembly second link member body first end 612 and the interlock cam assembly second link member body medial portion 616. The interlock cam assembly second link member body first end 612 includes a rotatable coupling 620. The interlock cam assembly second link member body first portion 614 defines a generally straight slot 622. The interlock cam assembly second link member body first portion 614 further defines an actuator 624. The interlock cam assembly second link member body first portion actuator 624, in an exemplary embodiment, is an downwardly extending lug, as shown in FIG. 15. The interlock cam assembly second link member body medial portion 616 is, in an exemplary embodiment, bent so that the interlock cam assembly second link member body first end 612 and the interlock cam assembly second link member body second end 618 are offset vertically from each other when assembled, as described below. Further, in an exemplary embodiment, wherein the interlock cam assembly second link member body 610 is generally planar, the interlock cam assembly second link member body medial portion 616 includes a twist whereby the plane of the interlock cam assembly second link member body 610 at the interlock cam assembly second link member body first end 612 is generally perpendicular to the plane of the interlock cam assembly second link member body 610 at the interlock cam assembly second link member body second end 618. The interlock cam assembly second link member body second end 618 includes coupling component 626.

The interlock cam assembly third link member 524 includes a generally planar body 640 with a first end 642, a first portion 644, a medial portion 646, and a second end 648. The interlock cam assembly third link member body 640 is, in an exemplary embodiment, a "dogleg," i.e., having two elongated portions at an obtuse angle that meet at a vertex 649 at the interlock cam assembly third link member body medial portion 646. The interlock cam assembly third link member body first portion 644 is disposed between the interlock cam assembly third link member body first end 642 and the interlock cam assembly third link member body medial portion 646. The interlock cam assembly third link member body first portion 644 defines a generally straight slot 650. The interlock cam assembly third link member body medial portion 646 defines a pivot point 654 with an axis of rotation extending generally normal to the plane of the interlock cam assembly third link member body 640.

Each of the interlock cam assembly link members 520, 522, 524 move between first, neutral and second positions corresponding to the first, second and third positions of the interlock cam assembly first cam member 510 and interlock cam assembly second cam member 512.

The interlock cam assembly electronic interlock device 516 includes a housing 660, and actuator 662, and circuitry (not shown) structured to produce an interlock signal. The interlock cam assembly electronic interlock device 516 is in electronic communication with the CBA electric control system 32. The interlock cam assembly electronic interlock device actuator 662 may be a contact switch that is, in an exemplary embodiment, an elongated lever 664 structured to move, and in an exemplary embodiment, pivot, between a first, actuated position, and a second, unactuated position. The interlock cam assembly electronic interlock device actuator lever 664 is biased to the first position. The interlock cam assembly electronic interlock device 516 is structured to produce the interlock signal when the interlock cam assembly electronic interlock device actuator 662 is in the first position. The interlock cam assembly electronic interlock device 516 can be structured to produce a release signal when the interlock cam assembly electronic interlock device actuator 662 is in the second position.

The VDS interlock assembly 400 is assembled as follows. In an exemplary embodiment, the interlock cam assembly frame member 500 is coupled, directly coupled or fixed to the visible disconnect switch frame assembly 314 with the VDS activating assembly drive shaft 352 extending through the interlock cam assembly frame member body drive shaft opening 532. The interlock cam assembly first cam member 510 is fixed to the end of the VDS activating assembly drive shaft 352 extending through the interlock cam assembly frame member body drive shaft opening 532. Further, the VDS activating assembly drive assembly sprocket 360 is fixed to the end of the VDS activating assembly drive shaft 352 extending through the interlock cam assembly frame member body drive shaft opening 532. The VDS activating assembly drive chain 362 is operatively coupled to the VDS activating assembly drive assembly sprocket 360.

The interlock cam assembly second cam member 512 is rotatably coupled to the interlock cam assembly frame member 500 adjacent the interlock cam assembly first cam member 510. The interlock cam assembly first link member first end 602 is rotatably coupled to the interlock cam assembly second cam member body link coupling 590. In an exemplary embodiment, a bolt is passed through a passage (not shown) in the interlock cam assembly first link member first end 602 and threaded into the interlock cam assembly second cam member body link coupling 590.

The interlock cam assembly second link member 522 is movably coupled to the interlock cam assembly frame member 500. In an exemplary embodiment, the interlock cam assembly frame member guide pins 534 are disposed in the interlock cam assembly second link member body first portion slot 622. The interlock cam assembly frame member guide pins 534, as shown, include caps or nuts to trap the interlock cam assembly frame member guide pins 534 in the interlock cam assembly second link member body first portion slot 622. Further, the spacing between the interlock cam assembly frame member guide pins 534 is less than the length of the interlock cam assembly second link member body first portion slot 622. In this configuration, the interlock cam assembly second link member 522 is movably coupled to the interlock cam assembly frame member 500. Further, in this configuration, the interlock cam assembly second link member 522 translates relative to the interlock cam assembly frame member 500.

The interlock cam assembly first link member body second end 604 is rotatably coupled to the interlock cam assembly second link member body rotatable coupling 620. As shown, a pin, such as, but not limited to a bolt, extends through openings (not shown) in the interlock cam assembly first link member body second end 604 and the interlock cam assembly second link member body 610. Further, the interlock cam assembly electronic interlock device 516 is coupled, directly coupled, or fixed to the interlock cam assembly frame member 500 adjacent the interlock cam assembly second link member 522. Moreover, the path of the interlock cam assembly second link member body first portion actuator 624 overlaps the path of the interlock cam assembly electronic interlock device actuator 662. In this configuration, as the interlock cam assembly second link member 522 moves, as described below, the interlock cam assembly second link member body first portion actuator 624 operatively engages the interlock cam assembly electronic interlock device actuator 662 and causes the interlock cam assembly electronic interlock device actuator 662 to move between its first and second positions.

The interlock cam assembly third link member 524 is rotatably coupled to the visible disconnect switch frame assembly 314 adjacent the interlock cam assembly frame member 500. That is, the interlock cam assembly third link member 524 is rotatably coupled to the visible disconnect switch frame assembly 314 at the interlock cam assembly third link member body medial portion pivot point 654. The interlock cam assembly second link member body second end 618 is movably coupled to the interlock cam assembly third link member 524. That is, the interlock cam assembly second link member body second end coupling component 626, which in an exemplary embodiment is a pin, is movably disposed in the interlock cam assembly third link member body first portion slot 650. The interlock cam assembly third link member body second end 648 is rotatably coupled to the interlock drive assembly first drive member body first end 422.

Figure 19:
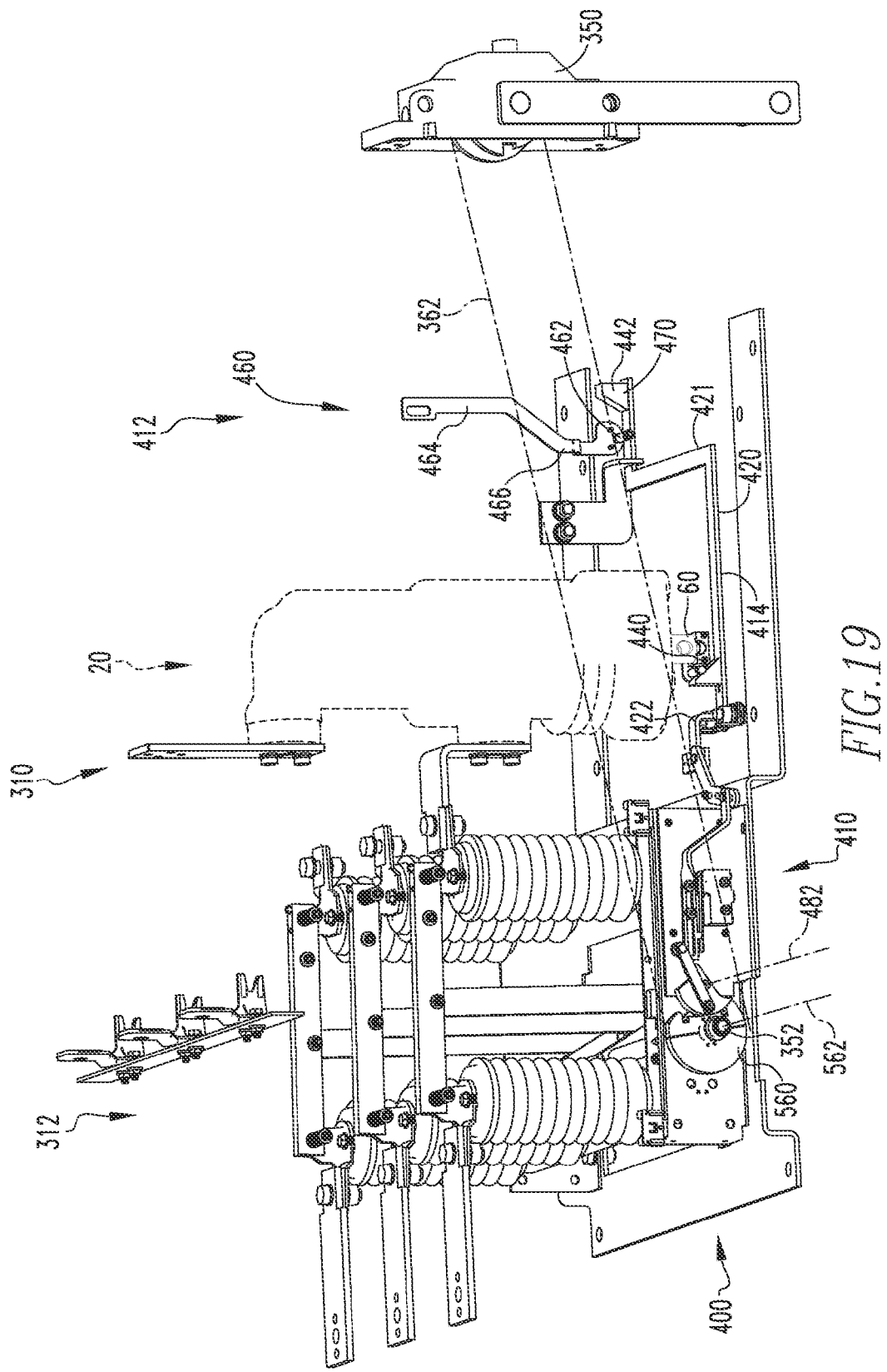
FIG. 19 is an isometric view of a VDS circuit breaker with an interlock assembly in the second position (CBA in CLOSE position, VDS in CLOSE position).
Figure 20:
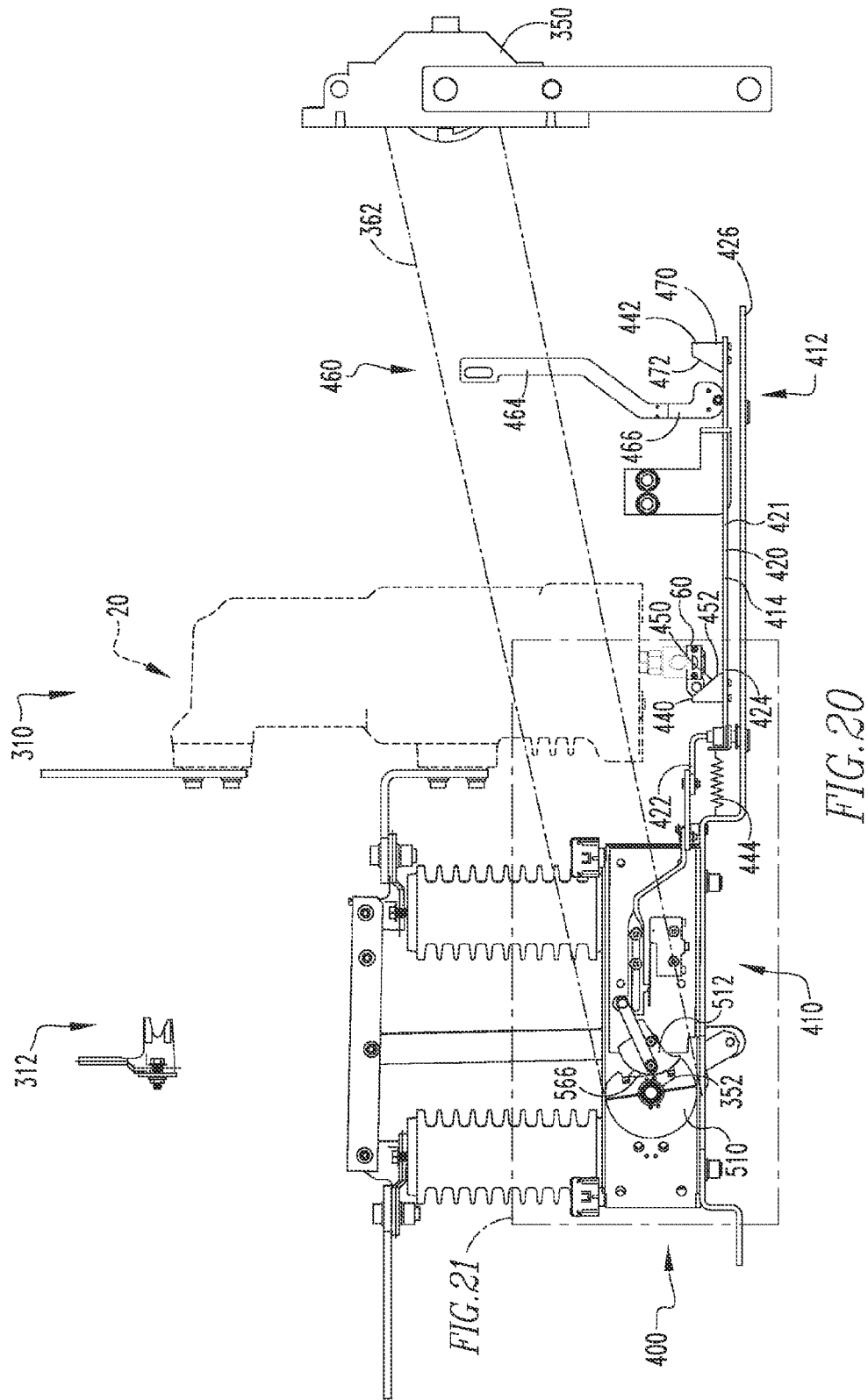
FIG. 20 is a side view of a VDS circuit breaker with an interlock assembly in the second position (CBA in CLOSE position, VDS in CLOSE position).
Figure 21:
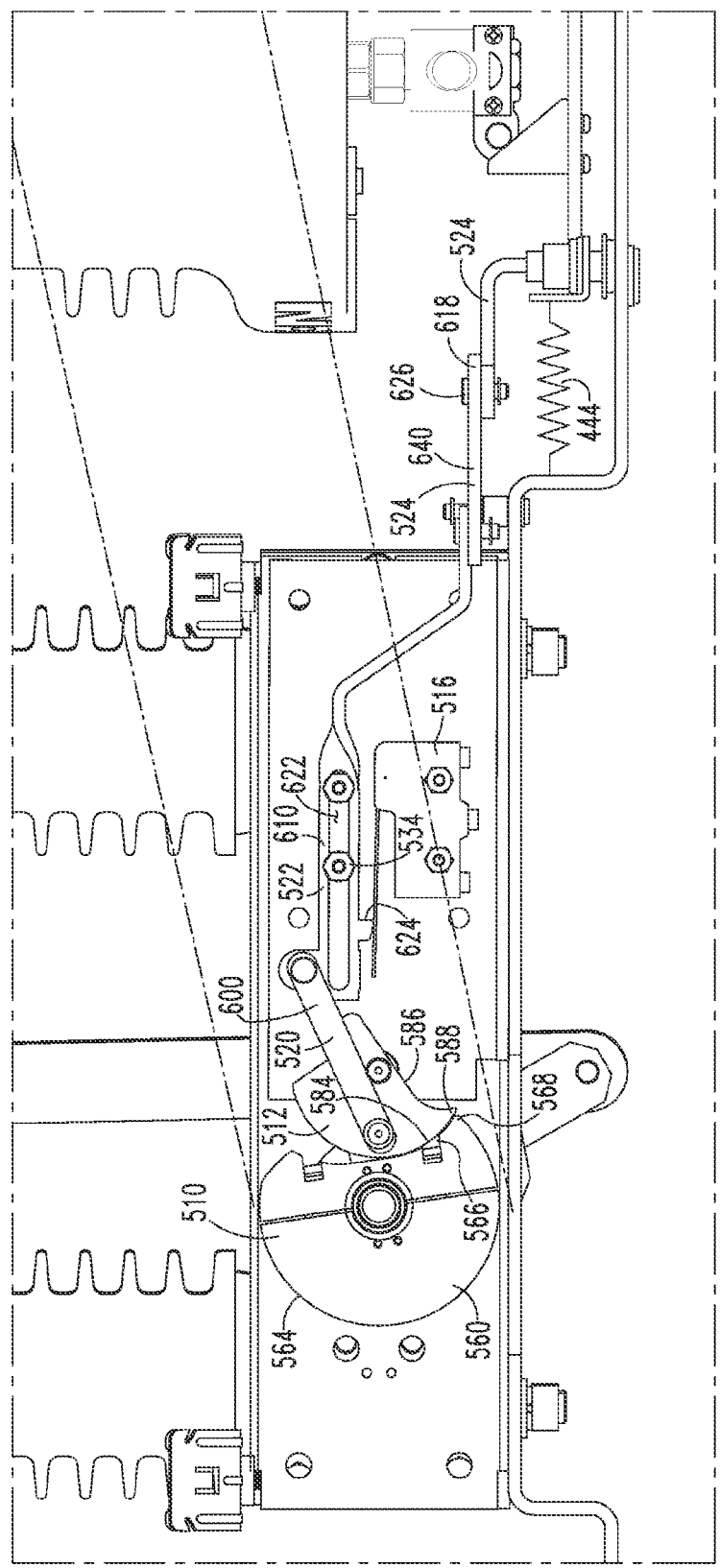
FIG. 21 is a detail view of a VDS circuit breaker with an interlock assembly cam assembly in the second position (CBA in CLOSE position, VDS in CLOSE position).
Figure 22:
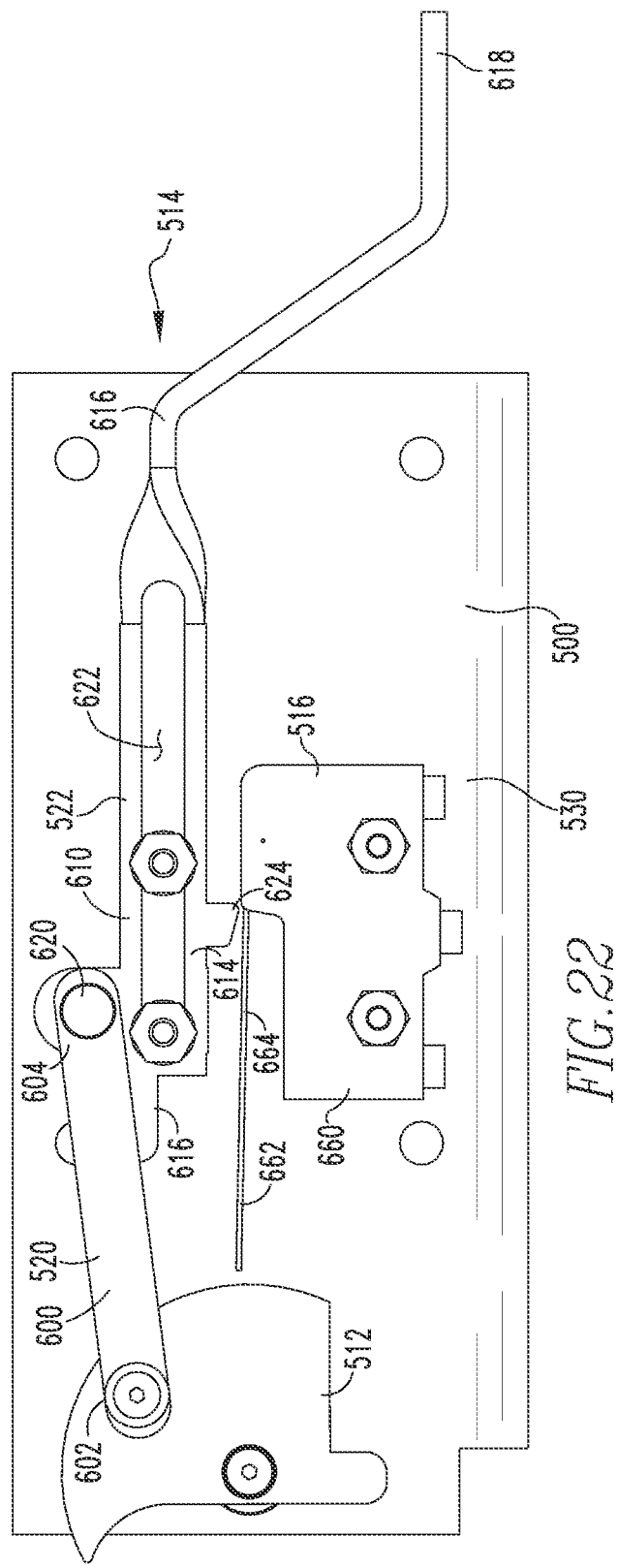
FIG. 22 is a detail side view of a portion of an interlock assembly cam assembly.

The elements of the VDS interlock assembly 400 move between a number of positions, or orientations, corresponding to the interlock drive assembly's 414 three positions, i.e., the CBA, first lockout position (FIGS. 13-15), the CBA open position (FIGS. 16-18), and the VDS, second lockout position (FIGS. 19-21). These names are also applicable to the VDS interlock assembly 400. Rather than address all the elements of the VDS interlock assembly 400 in each position, the following discussion will address the interlock cam assembly 410 first, and then the mechanical control system interlock interface assembly 412 and the interlock drive assembly 414.

Before discussing the operation of the elements of the VDS interlock assembly 400, it is again noted that the forces created by the operating mechanism 14 acting on the CBA second contact assembly 24 are much greater than the bias created by interlock drive assembly biasing device 444. Thus, the biasing force of the interlock drive assembly first wedge 450 against the contact interface assembly roller 54 has a negligible effect on the position of the CBA second contact assembly 24 and the contact interface assembly 60. Thus, the interlock drive assembly biasing device 444 biases the interlock drive assembly first drive member 420 toward the front panel 12 unless the path of the interlock drive assembly first wedge 450 is blocked by the contact interface assembly 60, i.e., when the CBA second contact assembly 24 is in its first position.

Further, as interlock drive assembly first drive member 420 is coupled to the interlock cam assembly third link member on the opposite side of the interlock cam assembly third link member body medial portion pivot point 654 from the interlock cam assembly second link member 522, the interlock cam assembly third link member 524 essentially reverses the direction of the interlock drive assembly biasing device 444. That is, the bias of the interlock drive assembly biasing device 444 acting on the interlock cam assembly link assembly 514 generally biases the interlock cam assembly link members 520, 522, 524 away from the front panel 12. It is further noted that, when interlock cam assembly link assembly 514 members are in their first position, the configuration of the interlock cam assembly link members 520, 522, 524 maintains the interlock drive assembly 414 in a first position wherein the interlock drive assembly biasing device 444 is compressed and the interlock drive assembly first wedge 450 is spaced from the interface assembly roller 54. That is, as shown, the interlock drive assembly 414 is shifted to the left, away from the front panel 12.

The interlock cam assembly 410 operates as follows. It is assumed that the VDS interlock assembly 400 is in the CBA, first lockout position; meaning that the VDS contact assembly second contact assembly 346 is in the open, first position and the CBA second contact assembly 24 is in the open first position. In this configuration, the interlock cam assembly first cam member 510 is disposed in its first position, the interlock cam assembly second cam member 512 is disposed in its first position, and each interlock cam assembly link member 520, 522, 524 is disposed in its respective first position. When the interlock cam assembly first cam member 510 is disposed in its first position, the interlock cam assembly first cam member body arcuate cam surface 564 faces, i.e., is adjacent to the interlock cam assembly second cam member 512. Further, when the interlock cam assembly second cam member 512 is disposed in its first position, the interlock cam assembly second cam member body cam follower 588 engages the interlock cam assembly first cam member body arcuate cam surface 564. That is, the bias from the interlock drive assembly biasing device 444 acting on the interlock cam assembly link assembly 514 biases the interlock cam assembly second cam member body cam follower 588 against the interlock cam assembly first cam member body arcuate cam surface 564. It is further noted that, as shown, the interlock cam assembly first link member first end 602 is coupled to the interlock cam assembly second cam member 512 at a location above the interlock cam assembly second cam member body axis of rotation 582. In this configuration, and as shown, the interlock cam assembly second cam member 512 is biased to rotate in a counterclockwise direction. Thus, first cam member 510 locks the second cam member 512 in such a way that the interlock drive assembly first drive member 420 is biased away from the front panel 12. This leads the mechanical control system interlock interface assembly 412 to actuate in its second position and CBA mechanical control system interlock assembly 38 in its first locked position (as shown in FIG. 14). This does not allow CBA to be closed by manually operating the mechanism 14. This is the "mechanical lockout" of the CBA in first position.

It is further noted that in this position the interlock cam assembly second link member body first portion actuator 624 does not engage the interlock cam assembly electronic interlock device actuator lever 664. Thus, the interlock cam assembly electronic interlock device actuator lever 664 is in the first position and the interlock cam assembly electronic interlock device 516 generates the interlock signal, described above, which is communicated to the CBA electric control system 32. Accordingly, in this configuration, the CBA electric control system 32 cannot actuate the operating mechanism. That is, as described above, the CBA second contact assemblies 24 cannot be moved from the first position to the second position via the CBA electric control system 32. This is the "electrical lockout" of the CBA in first position.

When the elements of the interlock cam assembly 410 are in their first positions, the VDS interlock assembly 400 is in the CBA, first lockout position.

When the VDS activating assembly drive assembly 350 is actuated to move the VDS contact assembly second contact assembly 346, and associated elements, to the closed, second position, the following occurs. In an exemplary embodiment, the VDS activating assembly drive shaft 352 rotates about 180 degrees in a clockwise direction. It is noted that there is a spring operated mechanism (nor shown) built into the visible disconnect switch 312 that converts 180 degree to 90 degree rotation. This mechanism is, however, not relevant to this disclosure. As the interlock cam assembly first cam member 510 is fixed to the VDS activating assembly drive shaft 352, the interlock cam assembly first cam member 510 also rotates about 180 degrees in a clockwise direction. As the interlock cam assembly first cam member 510 rotates, the engagement between interlock cam assembly second cam member body cam follower 588 against the interlock cam assembly first cam member body arcuate cam surface 564 maintains the other elements of the VDS interlock assembly 400 in their respective first positions.

When the interlock cam assembly first cam member 510 rotates a sufficient distance, between about 90 and 175 degrees, or about 95 degrees, as shown, the interlock cam assembly second cam member body cam follower 588 moves off the interlock cam assembly first cam member body arcuate cam surface 564 and the interlock cam assembly second cam member 512 rotates into the interlock cam assembly first cam member body pocket 569. The interlock cam assembly first cam member 510 continues to rotate with the VDS activating assembly drive shaft 352 until the VDS activating assembly drive shaft 352 stops. In this configuration, the interlock cam assembly second cam member 512 is maintained, as described below, in the interlock cam assembly first cam member body pocket 569. Further, in this configuration, the interlock cam assembly first cam member 510 and the interlock cam assembly second cam member 512 are in their respective open positions.

The rotation of the interlock cam assembly second cam member 512 causes the interlock cam assembly link members 520, 522, 524 to move to their open positions. That is, the interlock cam assembly first link member 520 is shifted to the left, as shown, by the interlock cam assembly first cam member 510. Motion of the interlock cam assembly first link member 520 is transferred to the interlock cam assembly second link member 522 which translates to the left, as shown. Motion of the interlock cam assembly second link member 522 is transferred to the interlock cam assembly third link member 524 which rotates about the interlock cam assembly third link member body medial portion pivot point 654. Motion of the interlock cam assembly third link member 524, and the bias of the interlock drive assembly biasing device 444, cause the interlock drive assembly first drive member 420 to move toward the front panel 12 and into its open position. This releases the mechanical control system interlock interface assembly 412 and thus, the CBA is released from the "mechanical lockout" position.

As noted above, the interlock drive assembly first drive member 420 will move until the interlock drive assembly first wedge 450 engages the contact interface assembly roller 54. This engagement causes the motion of the interlock drive assembly first drive member 420 to stop which, in turn, stops the motion of the interlock cam assembly link members 520, 522, 524, the interlock cam assembly first cam member 510 and the interlock cam assembly second cam member 512. Thus, the interlock cam assembly link members 520, 522, 524, the interlock cam assembly first cam member 510 and the interlock cam assembly second cam member 512 are disposed in, and maintained in, their open positions.

Further, as the interlock cam assembly second link member 522 moves into its open position, the interlock cam assembly second link member body first portion actuator 624 engages the interlock cam assembly electronic interlock device actuator lever 664 and moves the interlock cam assembly electronic interlock device actuator lever 664 to its second position. Thus, the interlock cam assembly electronic interlock device actuator lever 664 is in the second position and the interlock cam assembly electronic interlock device 516 no longer generates the interlock signal, or generates a release signal, as described above. The signal, or lack of signal, is communicated to the CBA electric control system 32. Thus, the CBA is released from the "electrical lockout" position. Accordingly, in this configuration, the CBA electric control system 32 can actuate the operating mechanism 14. That is, as described above, the CBA second contact assemblies 24 can now be moved from the first position to the second position via the CBA electric control system 32.

When the elements of an interlock cam assembly 410 are in their open positions, the VDS interlock assembly 400 is in the open position.

In this configuration, the interlock drive assembly 414 is in the open position, described above. Further, as discussed above, when the interlock drive assembly 414 is in its open position, the closed VDS contact assembly second contact assembly 346, and associated elements, can be moved back to its first position (and thereby move the interlock drive assembly 414 back to the CBA, first lockout position). That is, the VDS activating assembly 332 is actuated to move the VDS contact assembly second contact assemblies 346 to the open, first position. This operation causes the VDS activating assembly drive shaft 352 to rotate in the opposite direction relative to the closing direction, described above. As the VDS activating assembly drive shaft 352 rotates, so does the interlock cam assembly first cam member 510. As can be seen in FIG. 15, this rotation causes the interlock cam assembly first cam member body follower projection 568 to operatively engage the interlock cam assembly second cam member body chord cam surface 586. The engagement of the interlock cam assembly first cam member body follower projection 568 on the interlock cam assembly second cam member body chord cam surface 586 causes the interlock cam assembly second cam member 512 to rotate. More specifically, the interlock cam assembly first and second cam members 510, 512 rotate back to the interlock cam assembly first cam member 510 first position and the interlock cam assembly second cam member 512 first position. The motion of the interlock cam assembly first and second cam members 510, 512 moves each interlock cam assembly link member 520, 522, 524 to its respective first position. As the interlock cam assembly link member 520, 522, 524 move to their first positions, the interlock drive assembly first drive member 420 moves away from the interlock drive assembly first wedge 450 and into the interlock drive assembly first drive member 420 first position. Thus, the VDS interlock assembly 400 returns to its first position.

Alternatively, the VDS interlock assembly 400 moves into the VDS, second lockout position. This occurs when the CBA second contact assembly 24 moves into the closed, second position. As described in more detail below, when the CBA second contact assembly 24 moves into the closed, second position, the contact interface assembly 60 moves away from the interlock drive assembly first drive member body 421. This motion allows the bias of the interlock drive assembly biasing device 444 to move the interlock drive assembly first wedge 450 relative to the contact interface assembly 60 and towards the front panel 12. That is, as the CBA second contact assembly 24 lifts, as shown comparing FIGS. 14 and 20, the contact interface assembly roller 54 travels over the interlock drive assembly first wedge engagement surface 452. This motion allows the interlock drive assembly first drive member 420 to shift to the right, as shown in FIG. 14.

As before, motion of the interlock drive assembly first drive member 420 affect the interlock cam assembly link members 520, 522, 524 and the positions of the interlock cam assembly first and second cam members 510, 512. That is, as the interlock drive assembly first drive member 420 shifts to the right, as shown in FIG. 14, the interlock cam assembly third link member 524 essentially reverses the direction of the motion and causes interlock cam assembly second link member 522 to translate to the left. This motion further causes interlock cam assembly first link member 520 to move to the left, as shown in FIG. 21. As interlock cam assembly first link member 520 moves to the left, the interlock cam assembly second cam member 512 rotates further counterclockwise, as shown in FIG. 21. In this configuration, the elements of the interlock cam assembly 410 are in their respective second positions.

When the elements of the interlock cam assembly 410 are in their respective second positions the interlock cam assembly first cam member 510, essentially, cannot move; thus the VDS contact assembly second contact assemblies 346 are locked in the closed, second positions. That is, as shown in FIGS. 20-21, when the interlock cam assembly second cam member 512 is in the second position, the interlock cam assembly second cam member body radial blocking surface 584 is disposed adjacent the interlock cam assembly first cam member body radial locking surface 566 and the interlock cam assembly first cam member body follower projection 568. In this position, rotation of the VDS activating assembly drive shaft 352 in the opposite direction relative to the closing direction causes the interlock cam assembly first cam member body radial locking surface 566 to engage the interlock cam assembly second cam member body radial blocking surface 584. This engagement prevents the interlock cam assembly second cam member 512 and therefore the VDS activating assembly drive shaft 352, from rotating. As the VDS activating assembly drive shaft 352 cannot rotate, the VDS contact assembly second contact assembly 346 cannot move to its first position. Thus, when the VDS interlock assembly 400 ensures that the VDS contact assembly second contact assemblies 346 are not moved when the CBA second contact assemblies 24 are in the second position, Further, in this configuration, the interlock drive assembly 414 and the mechanical control system interlock interface assembly 412 operate as follows. When the VDS interlock assembly 400 is in the first position, the interlock drive assembly 414 utilizes a first drive member 420 that is shifted to its left most position, as shown in FIG. 14. In this position, the interlock drive assembly first wedge 450 is spaced from the interface assembly roller 54. The interlock drive assembly second wedge 470 is engaging, and has moved, the mechanical control system interlock interface assembly 412 to the first position. That is, when moving into the first position, the interlock drive assembly second wedge engagement surface 472 operatively engages the mechanical control system interlock interface assembly linkage assembly roller 462 and causes the mechanical control system interlock interface assembly linkage assembly body 464 to move (upwardly as shown in FIG. 14) to its first position. As noted above, when the mechanical control system interlock interface assembly linkage assembly body 464 is in the first position, the CBA mechanical control system interlock assembly 38 is in its second configuration. Thus, as set forth above, the CBA second contact assembly 24 is in its first position and the mechanical control system actuating assembly 36 is not free to actuate the operating mechanism 14.

When the interlock drive assembly first drive member 420 is moved to the open position, and as set forth above, the interlock drive assembly first drive member 420 will move until the interlock drive assembly first wedge 450 engages the contact interface assembly roller 54. This engagement causes the motion of the interlock drive assembly first drive member 420 to stop. As the interlock drive assembly first drive member 420 moves, the interlock drive assembly second wedge engagement surface 472 moves under the mechanical control system interlock interface assembly roller 462, thereby allowing the mechanical control system interlock interface assembly linkage assembly body 464 to move to its second position, wherein the CBA mechanical control system interlock assembly 38 is in its first configuration. That is, when the interlock drive assembly first drive member 420 is moved to the open position, the CBA mechanical control system interlock assembly 38 is moved to its open, first configuration, wherein the mechanical control system actuating assembly 36 is free to actuate operating mechanism 14. Thus, the CBA second contact assembly 24 can be moved from the first position, to the second position.

As before, when the interlock drive assembly 414 is in the open position, the interlock cam assembly 410 is in its first configuration and the mechanical control system interlock interface assembly 412 is in its second position. Generally, when the interlock drive assembly 414 is in the open position, one of the VDS activating assembly 332 or the operating mechanism 14 may be actuated. That is, either the "closed" VDS contact assembly second contact assembly 346 can be moved back to its first position (and thereby move the interlock drive assembly 414 back to the CBA, first lockout position), or, the "open" CBA second contact assembly 24 may be moved to the closed, second position.

That is, when the interlock drive assembly 414 is in the open position, the contact interface assembly roller 54 is engaged by the lower portion of the interlock drive assembly first wedge engagement surface 452. Further, the mechanical control system interlock interface assembly roller 462 is engaged by the lower portion of the interlock drive assembly second wedge engagement surface 472. That is, the bias created by the interlock drive assembly biasing device 444, biases the interlock drive assembly first drive member 420 toward the front panel 12. The bias created by the interlock drive assembly biasing device 444 also biases the interlock drive assembly first and second wedges 450, 470 as described above.

Thus, generally, the CBA second contact assembly 24 and the contact interface assembly 60 maintain the interlock drive assembly 414, as well as the interlock drive assembly first drive member 420, in the open position. When the CBA second contact assembly 24 moves to the second position, the contact interface assembly 60 moves generally upwardly, as shown in FIG. 20, and away from the interlock drive assembly first drive member 420. As the contact interface assembly 60 moves generally upwardly, the bias created by the interlock drive assembly biasing device 444 causes the interlock drive assembly 414, as well as the interlock drive assembly first drive member 420, to move to its VDS, second lockout position. Further, as the interlock drive assembly 414, as well as the interlock drive assembly first drive member 420, move to the VDS, second lockout position the interlock drive assembly second wedge 470 moves away from the mechanical control system interlock interface assembly 412. Thus, the mechanical control system interlock interface assembly 412 remains in the second position.

When the CBA second contact assembly 24 moves to the first position from the second position, the reverse of the motions described in the paragraph above occur. That is, the contact interface assembly roller 54 operatively engages the interlock drive assembly first wedge engagement surface 452. This engagement causes the interlock drive assembly first drive member 420 to move to the left, as shown, when the interlock drive assembly 414 is in the open position.

Further, from the interlock drive assembly 414 open position, the VDS activating assembly 332 may be actuated. That is, the interlock drive assembly 414 can be moved to the CBA, first lockout position. When this action occurs, the interlock drive assembly first drive member 420 moves away from the interlock drive assembly first wedge 450 and into the interlock drive assembly first drive member 420 first position, as described above. Further, the interlock drive assembly second wedge 470 moves toward, and operatively engages the mechanical control system interlock interface assembly 412. As described above, the interlock drive assembly second wedge engagement surface 472 operatively engages the mechanical control system interlock interface assembly roller 462. This operative engagement causes the mechanical control system interlock interface assembly linkage assembly body 464 to move to its first position, wherein the CBA mechanical control system interlock assembly 38 is in its second configuration.

Figure 24A:
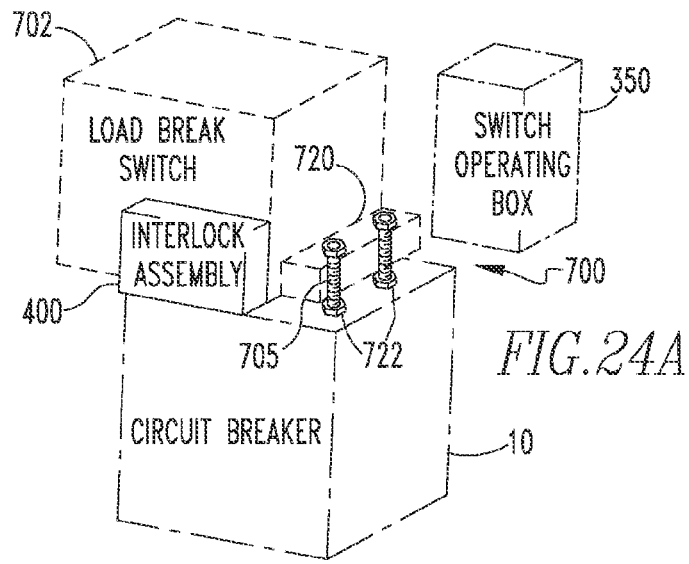
FIG. 24A is a schematic view showing a line side, upper defined mounting space.
Figure 24B:
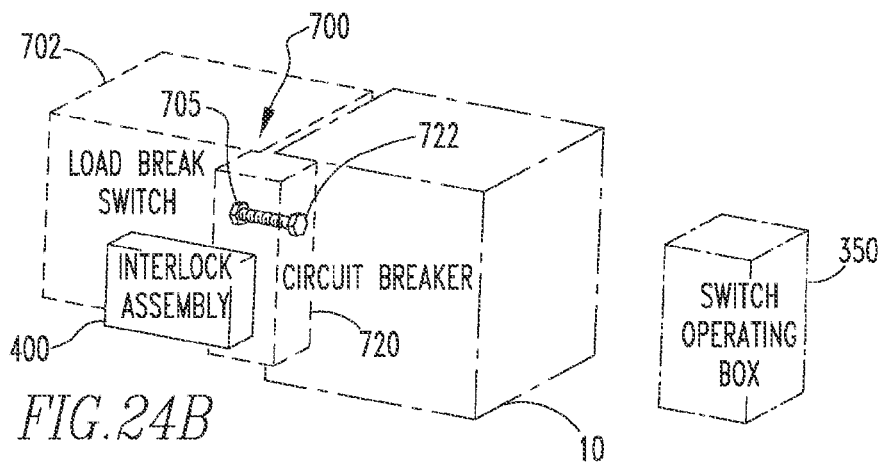
FIG. 24B is a schematic view showing a load side, lower defined mounting space.
Figure 24C:
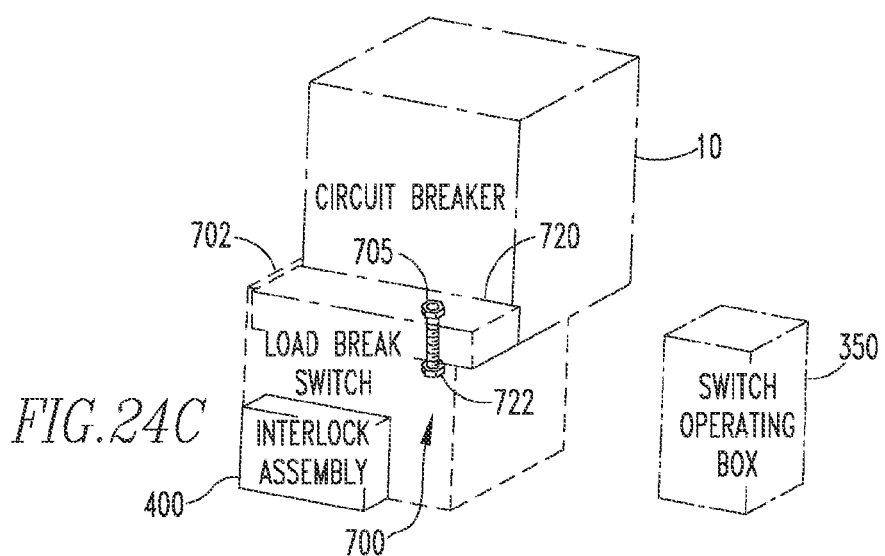
FIG. 24C is a schematic view showing a load side, rearward defined mounting space.

Further, as shown schematically in FIGS. 24A-24C, the visible disconnect switch 312 is structured to be coupled to, and placed in electrical communication with, either the line side or the load side of the circuit breaker assembly 10. To accomplish this, the circuit breaker assembly 10 includes a modular mounting assembly 700, shown schematically. As used herein, a "modular mounting assembly" is a construct including a number of "defined mounting spaces." As used herein, a "defined mounting space" is a space having a number of coupling components disposed substantially one side thereof.

In an exemplary embodiment, the CBA modular mounting assembly 700 includes a line side, upper defined mounting space 702, a load side, lower defined mounting space 704 and a load side, rearward defined mounting space 706. The line side, upper defined mounting space 702 is defined by a number of coupling components 703, such as, but not limited to threaded bores, disposed on the upper side of the circuit breaker assembly 10. The load side, lower defined mounting space 704 is defined by a number of coupling components 705, such as, but not limited to threaded bores, disposed on the lower side of the circuit breaker assembly 10. The load side, rearward defined mounting space 706 is defined by a number of coupling components 707, such as, but not limited to threaded bores, disposed on the rear side of the circuit breaker assembly 10.

The visible disconnect switch 312 further includes a mounting assembly 720 structured to be coupled to the CBA modular mounting assembly 700. In an exemplary embodiment, wherein the CBA modular mounting assembly 700 are threaded bores, the visible disconnect switch mounting assembly 720 includes a number of fasteners 722, such as, but not limited to bolts. Moreover, in an exemplary embodiment, the number of visible disconnect switch mounting assembly fasteners 722 is one of a limited number of fasteners or a very limited number of fasteners. As used herein, a "limited number of fasteners" means eight or fewer fasteners, and, a "very limited number of fasteners" means four or fewer fasteners.

While specific embodiments of the invention have been described in detail, it will be appreciated by those skilled in the art that various modifications and alternatives to those details could be developed in light of the overall teachings of the disclosure. Accordingly, the particular arrangements disclosed are meant to be illustrative only and not limiting as to the scope of invention which is to be given the full breadth of the claims appended and any and all equivalents thereof.

What is claimed is:

1. A contact wear indicator assembly for a circuit breaker assembly, said circuit breaker assembly including a fixed, CBA first contact assembly, a movable, CBA second contact assembly, and an operating mechanism, said operating mechanism operatively coupled to said CBA second contact assembly, said CBA second contact assembly including an elongated stem and a contact member, said CBA second contact assembly moveable between a first position, wherein said CBA second contact assembly contact member is spaced from, and not in electrical communication with, said CBA first contact assembly, and a second position, wherein said CBA second contact assembly contact member is coupled to, and in electrical communication with, said CBA first contact assembly, wherein said CBA second contact assembly stem moves generally linearly between a first and second position corresponding to said CBA second contact assembly contact member first and second positions, said operating mechanism including a number of movable elements, a portion of said movable elements are coupled to said CBA second contact assembly, said portion of said operating mechanism elements coupled to said CBA second contact assembly move between a first position and a second position corresponding to said CBA second contact assembly first and second positions, said contact wear indicator assembly comprising:

a contact interface assembly, said contact interface assembly coupled to said CBA second contact assembly stem whereby said contact interface assembly moves with said CBA second contact assembly stem between a first position and a second position;

an indicator drive assembly including an elongated, first drive member, a user display assembly including an output device, said output device structured to produce a visual indication representative of a contact characteristic;

said indicator drive assembly first drive member operatively coupled to said contact interface assembly whereby said indicator drive assembly first drive member moves between a first position and a second position corresponding to said contact interface assembly first and second positions;

said indicator drive assembly first drive member measurably coupled to said user display assembly; and said user display assembly structured to display indicator drive assembly first drive member position data on said output device.

2. The contact wear indicator assembly of claim 1 wherein said indicator drive assembly first drive member translates between said first and second positions.

3. The contact wear indicator assembly of claim 1 wherein:

said indicator drive assembly first drive member includes an elongated body with a first end and a second end;

said indicator drive assembly first drive member body first end disposed adjacent said contact interface assembly;

said indicator drive assembly includes a first displacement device;

said indicator drive assembly first displacement device coupled to said indicator drive assembly first drive member body first end; and said contact interface assembly operatively coupled to said indicator drive assembly first displacement device.

4. The contact wear indicator assembly of claim 3 wherein:

wherein said indicator drive assembly first displacement device is an indicator drive assembly first wedge including an engagement surface; and said indicator drive assembly indicator drive assembly first wedge engagement surface is disposed at an angle relative to said CBA second contact assembly stem axis of motion.

5. The contact wear indicator assembly of claim 3 wherein:

said indicator drive assembly first drive member body second end disposed adjacent said user display assembly;

said user display assembly includes a first link member assembly and a gauge indicia;

said user display assembly first link member assembly includes a body with a first end and a second end;

said user display assembly first link member assembly body second end disposed in an indication relationship with said user display assembly gauge indicia;

said indicator drive assembly includes a second displacement device;

said second displacement device coupled to said indicator drive assembly first drive member body second end;

said second displacement device operatively coupled to said user display assembly first link member assembly body first end;

said user display assembly first link member assembly structured to move between a first position, corresponding to said CBA second contact assembly first position, and a second position, corresponding to said CBA second contact assembly second position; and wherein movement of said indicator drive assembly first drive member between its said first and second position causes a movement of said user display assembly first link member assembly between its said first and second position.

6. The contact wear indicator assembly of claim 5 wherein:
said contact interface assembly includes a roller;
wherein said first displacement device is an indicator drive assembly first wedge including an engagement surface;
said indicator drive assembly indicator drive assembly first wedge engagement surface is disposed at an angle relative to said CBA second contact assembly stem axis of motion; and
wherein said contact interface assembly roller moves over said indicator drive assembly indicator drive assembly first wedge engagement surface.

7. The contact wear indicator assembly of claim 6 wherein:
wherein said second displacement device is an indicator drive assembly second wedge including an engagement surface;
said indicator drive assembly first drive member body translates along an axis of motion between its said first and second position;
said indicator drive assembly indicator drive assembly second wedge engagement surface is disposed at an angle relative to said indicator drive assembly first drive member body axis of motion;
said user display assembly includes a roller; and
wherein said user display assembly roller moves over said indicator drive assembly second wedge engagement surface.

8. The contact wear indicator assembly of claim 7 wherein:
said angle of said indicator drive assembly first wedge engagement surface relative to said CBA second contact assembly stem axis of motion is one of a corresponding angle, a magnification angle, or a reduction angle; and
said angle of indicator drive assembly second wedge engagement surface relative to the user display assembly first link member assembly axis of motion is one of a corresponding angle, a magnification angle, or a reduction angle.

9. The contact wear indicator assembly of claim 1 wherein:
said indicator drive assembly first drive member is an operating mechanism pole shaft;
said operating mechanism pole shaft structured to rotate between a first position, corresponding to said CBA second contact assembly first position, and a second position, corresponding to said CBA second contact assembly second position;
one of said contact interface assembly or said indicator drive assembly includes a sensor assembly;
said sensor assembly structured to detect, measure and produce a signal representative of, a measurable characteristic of one of said CBA second contact assembly or said operating mechanism pole shaft and to produce a signal corresponding to said measurable characteristic; and
said user display assembly structured to receive said sensor assembly signal and to display data representative of said sensor assembly signal.

10. The contact wear indicator assembly of claim 9 wherein:
said pole shaft includes a number of crank members, said crank members extending generally radially from said pole shaft; and
said contact interface assembly electronic sensor assembly signal is one of an angular measurement sensor assembly coupled to said pole shaft or a linear transducer coupled to at least one pole shaft crank member.

11. A circuit breaker comprising:
a fixed, CBA first contact assembly;
a movable, CBA second contact assembly, said CBA second contact assembly including an elongated stem and a contact member, said CBA second contact assembly moveable between a first position, wherein said CBA second contact assembly contact member is spaced from, and not in electrical communication with, said CBA first contact assembly, and a second position, wherein said CBA second contact assembly contact member is coupled to, and in electrical communication with, said CBA first contact assembly;
an operating mechanism including a number of movable elements, a portion of said movable elements are coupled to said CBA second contact assembly, said portion of said operating mechanism elements coupled to said CBA second contact assembly move between a first position and a second position corresponding to said CBA second contact assembly first and second positions;
said operating mechanism operatively coupled to said CBA second contact assembly and structured to move said CBA second contact assembly between said first and second positions, wherein said CBA second contact assembly stem moves generally linearly between a first and second position corresponding to said CBA second contact assembly contact member first and second positions;
a contact wear indicator assembly including a contact interface assembly, an indicator drive assembly, and a user display assembly;
said contact interface assembly coupled to said CBA second contact assembly stem whereby said contact interface assembly moves with said CBA second contact assembly stem between a first position and a second position;
said indicator drive assembly including an elongated, first drive member,
said user display assembly including an output device, said output device structured to produce a visual indication representative of a contact characteristic;
said indicator drive assembly first drive member operatively coupled to said contact interface assembly whereby said indicator drive assembly first drive member moves between a first position and a second position corresponding to said contact interface assembly first and second positions;
said indicator drive assembly first drive member measurably coupled to said user display assembly; and
said user display assembly structured to display indicator drive assembly first drive member position data on said output device.

12. The circuit breaker of claim 11 wherein said indicator drive assembly first drive member translates between said first and second positions.

13. The circuit breaker of claim 11 wherein:
said indicator drive assembly first drive member includes an elongated body with a first end and a second end;
said indicator drive assembly first drive member body first end disposed adjacent said contact interface assembly;
said indicator drive assembly includes a first displacement device;
said indicator drive assembly first displacement device coupled to said indicator drive assembly first drive member body first end; and
said contact interface assembly operatively coupled to said indicator drive assembly first displacement device.

14. The circuit breaker of claim 13 wherein:

wherein said indicator drive assembly first displacement device is an indicator drive assembly first wedge including an engagement surface; and said indicator drive assembly first wedge engagement surface is disposed at an angle relative to said CBA second contact assembly stem axis of motion.

15. The circuit breaker of claim 13 wherein:

said indicator drive assembly first drive member body second end disposed adjacent said user display assembly;

said user display assembly includes a first link member assembly and a gauge indicia;

said user display assembly first link member assembly includes a body with a first end and a second end;

said user display assembly first link member assembly body second end disposed in an indication relationship with said user display assembly gauge indicia;

said indicator drive assembly includes a second displacement device;

said second displacement device coupled to said indicator drive assembly first drive member body second end;

said second displacement device operatively coupled to said user display assembly first link member assembly body first end;

said user display assembly first link member assembly structured to move between a first position, corresponding to said CBA second contact assembly first position, and a second position, corresponding to said CBA second contact assembly second position; and wherein movement of said indicator drive assembly first drive member between its said first and second position causes a movement of said user display assembly first link member assembly between its said first and second position.

16. The circuit breaker of claim 15 wherein:

said contact interface assembly includes a roller;

wherein said first displacement device is an indicator drive assembly first wedge including an engagement surface;

said indicator drive assembly first wedge engagement surface is disposed at an angle relative to said CBA second contact assembly stem axis of motion; and wherein said contact interface assembly roller moves over said indicator drive assembly first wedge engagement surface.

17. The circuit breaker of claim 16 wherein:

wherein said second displacement device is an indicator drive assembly second wedge including an engagement surface;

said indicator drive assembly first drive member body translates along an axis of motion between its said first and second position;

said indicator drive assembly second wedge engagement surface is disposed at an angle relative to said indicator drive assembly first drive member body axis of motion;

said user display assembly includes a roller; and wherein said user display assembly roller moves over said indicator drive assembly second wedge engagement surface.

18. The circuit breaker of claim 17 wherein:

said angle of said indicator drive assembly first wedge engagement surface relative to said CBA second contact assembly stem axis of motion is one of a corresponding angle, a magnification angle, or a reduction angle; and said angle of indicator drive assembly second wedge engagement surface relative to the user display assembly first link member assembly axis of motion is one of a corresponding angle, a magnification angle, or a reduction angle.

19. The circuit breaker of claim 11 wherein:

said indicator drive assembly first drive member is an operating mechanism pole shaft;

said operating mechanism pole shaft structured to rotate between a first position, corresponding to said CBA second contact assembly first position, and a second position, corresponding to said CBA second contact assembly second position;

one of said contact interface assembly or said indicator drive assembly includes a sensor assembly;

said sensor assembly structured to detect, measure and produce a signal representative of, a measurable characteristic of one of said CBA second contact assembly or said operating mechanism pole shaft and to produce a signal corresponding to said measurable characteristic; and said user display assembly structured to receive said sensor assembly signal and to display data representative of said sensor assembly signal.

20. The circuit breaker of claim 19 wherein:

said pole shaft includes a number of crank members, said crank members extending generally radially from said pole shaft; and said contact interface assembly electronic sensor assembly signal is one of an angular measurement sensor assembly coupled to said pole shaft or a linear transducer coupled to at least one pole shaft crank member.

* * * * *